(12) United States Patent
Kanchiku et al.

(10) Patent No.: US 7,964,334 B2
(45) Date of Patent: Jun. 21, 2011

(54) CURABLE COMPOSITION AND PLANOGRAPHIC PRINTING PLATE PRECURSOR

(75) Inventors: Shigefumi Kanchiku, Haibara-gun (JP); Koji Wariishi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 366 days.

(21) Appl. No.: 12/056,037

(22) Filed: Mar. 26, 2008

(65) Prior Publication Data

US 2008/0241744 A1 Oct. 2, 2008

(30) Foreign Application Priority Data

Mar. 27, 2007 (JP) ................. 2007-082835

(51) Int. Cl.
*G03F 7/027* (2006.01)
*G03F 7/00* (2006.01)
(52) U.S. Cl. .................. 430/283.1; 430/302; 430/281.1; 430/284.1; 430/288.1; 430/944
(58) Field of Classification Search .......... None
See application file for complete search history.

(56) References Cited

U.S. PATENT DOCUMENTS

| | | | | |
|---|---|---|---|---|
| 2,694,695 A | * | 11/1954 | Bortnick | 526/302 |
| 4,544,624 A | * | 10/1985 | Nanpei et al. | 430/281.1 |
| 5,292,619 A | * | 3/1994 | Okinoshima et al. | 430/283.1 |
| 5,594,085 A | * | 1/1997 | Lai | 526/302 |
| 6,107,391 A | * | 8/2000 | Verge et al. | 524/501 |

FOREIGN PATENT DOCUMENTS

| | | |
|---|---|---|
| EP | 0 505 161 A1 | 9/1992 |
| EP | 1 522 557 A1 | 4/2005 |
| JP | 8160612 A | 6/1996 |
| JP | 11038633 A | 2/1999 |
| JP | 2001290271 A | 10/2001 |
| JP | 2004318053 A | 11/2004 |
| JP | 2005-250416 A | 9/2005 |
| WO | WO 2007/064527 A1 * | 6/2007 |

OTHER PUBLICATIONS

English translation of JP, 2005-250416, A (2005) from machine translation from AIPN Japan Patent Office National Center for Industrial Property Information and Training, generated Dec. 26, 2009, 52 pages and 34 pages.*

* cited by examiner

*Primary Examiner* — Cynthia Hamilton
(74) *Attorney, Agent, or Firm* — Sughrue Mion, PLLC

(57) ABSTRACT

The present invention provides a curable composition containing at least one species selected from polymerizable monomers represented by the following formulas (I) to (III) and a polymerization initiator, and a planographic printing plate precursor including the same. The curable composition can be cured with high sensitivity due to laser light exposure or the like, and the inhibition of polymerization due to oxygen is controlled. The composition has excellent solubility in a developer or a solvent.

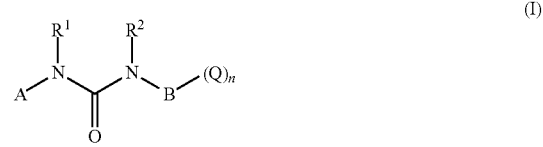

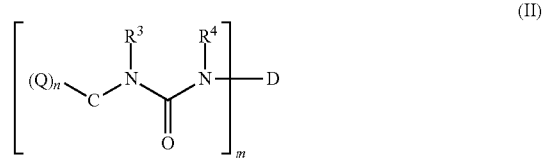

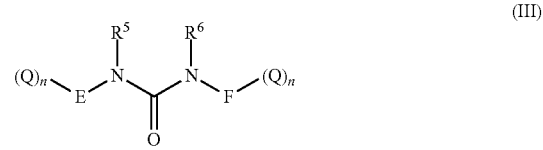

5 Claims, No Drawings

CURABLE COMPOSITION AND PLANOGRAPHIC PRINTING PLATE PRECURSOR

CROSS REFERENCE TO RELATED APPLICATION

This application claims priority under 35 USC 119 from Japanese Patent Application No. 2007-082835, the disclosure of which is incorporated by reference herein.

BACKGROUND OF THE INVENTION

1. Field of the Invention

The present invention relates to a curable composition capable of being cured with high sensitivity by energy application such as laser exposure and to a negative-working planographic printing plate precursor with a photosensitive layer to which the curable composition has been applied, on which precursor images can be directly drawn with high sensitivity by laser light.

2. Description of the Related Art

Conventionally, a PS plate having a lipophilic photosensitive resin layer provided on a hydrophilic support has been widely used as a planographic printing plate precursor, and a desired printing plate is obtained by a plate-making method which usually involves masked exposure (surface exposure) via a lithographic film and then removing non-image regions by dissolution. In recent years, digitalization techniques which involve electronic processing, accumulation and output of image information with a computer have been spreading. A wide variety of new image output systems compatible with such digitalization techniques have come to be practically used. As a result, there has been demand for computer-to-plate (CTP) techniques of producing a printing plate directly by scanning a highly directional light such as laser light according to digitalized image information without a lithographic film. It has been a critical technical issue to provide a planographic printing plate precursor suitable for these techniques.

As a negative-working planographic printing plate precursor capable of such scanning exposure to light, a planographic printing plate precursor has been proposed which includes a photopolymerizable photosensitive layer including a photopolymerization initiator, an addition polymerizable ethylenically unsaturated compound and a binder polymer having a specifically structured repeating unit which is soluble in an alkali developing solution and, according to necessity, a oxygen-impermeable protective layer, provided on a hydrophilic support (see, for example, Japanese Patent Application Laid-Open (JP-A) No. 2004-318053). In addition, a negative-working planographic printing plate precursor has been proposed which includes a photopolymerizable photosensitive layer and an oxygen-impermeable protective layer containing an inorganic laminar compound, provided on a hydrophilic support (see, for example, JP-A No. 11-38633).

In a negative-working planographic printing plate precursor having a photopolymerization curable photosensitive layer, a radical polymerization reaction is inhibited in the presence of oxygen, and therefore problems such as lowering of sensitivity and variation in sensitivity due to oxygen concentration variation easily occur. For preventing such problems, it is common to form an oxygen-impermeable protective layer coated on the surface as described above or to coat the surface of the photosensitive layer with a cover sheet. However, the formation of a protective layer or cover sheet requires processing steps, and the protective layer or cover sheet must be removed at the time of plate making using the planographic printing plate precursor. Therefore, development of negative-working photosensitive compositions which require no protective layer due to increased sensitivity of a photosensitive layer has been attempted. For example, photosensitive compositions containing a binder having an ether linkage (see, for example, JP-A No. 8-160612) and photosensitive compositions containing a styrene binder (see, for example, JP-A No. 2001-290271) have been proposed. However, a problem with the photosensitive compositions containing a binder having an ether linkage is that a sensitivity high enough for practical use cannot be obtained. A problem with the photosensitive composition containing a styrene binder is that although the sensitivity is successfully improved, they have low solubilities in alkali developing solutions or solvents and therefore development operations cannot be performed efficiently.

For this reason, there has been a demand for curable compositions suitable for a photosensitive layer of a negative-working planographic printing plate precursor which can be cured at high sensitivity by light exposure, cause less sensitivity variation during storage, and are excellent in developability.

SUMMARY OF THE INVENTION

The invention has been made in view of the above circumstances and provides a curable composition and planographic plate precursor.

A first aspect of the present invention provides a curable composition comprising at least one species selected from polymerizable monomers represented by the following formula (I), formula (II) or formula (III) and a polymerization initiator:

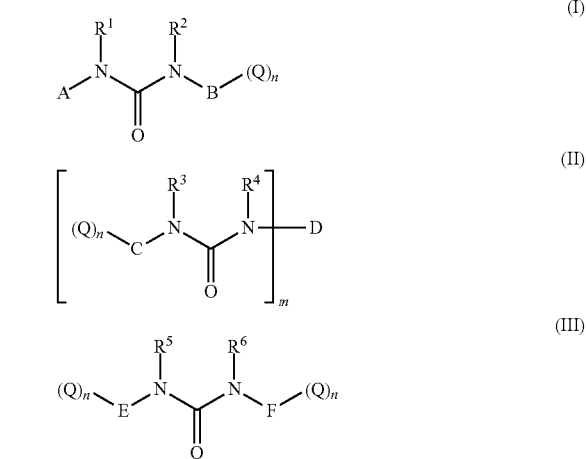

wherein in the formula (I) to formula (III), Q represents in each occurrence a substituent containing an ethylenically unsaturated group; $R^1$, $R^2$, $R^3$, $R^4$, $R^5$ and $R^6$ each independently represent a hydrogen atom or a monovalent hydrocarbon group; A represents a hydrogen atom or a monovalent hydrocarbon group, B, C, E and F each independently represent an (n+1)-valent linking group having at least one ether linkage or an (n+1)-valent linking group having 2 to 5 carbon atoms; D represents an (m+1)-valent linking group having at least one ether linkage or an m-valent linking group having 2 to 5 carbon atoms; n represents an integer of 1 to 3; and m represents an integer of 2 to 6.

DETAILED DESCRIPTION OF THE INVENTION

The present invention is to solve the existing problems with the conventional technologies, and to achieve the following objectives.

That is, an object of the invention is to provide a curable composition which is capable of being cured at high sensitivity by energy application such as laser exposure and controls the inhibition of polymerization due to oxygen and also which has excellent solubility in a developing solutions or solvents.

Another object of the invention is to provide a planographic printing plate precursor with a photosensitive layer containing the curable composition of the invention, on which an image can be formed with high sensitivity and which is inhibited from variation in sensitivity and has excellent removability of uncured portions during development.

As a result of earnest investigations for achieving the above-mentioned objectives, the inventor found that the objectives can be achieved by use of a urea polymerizable monomer in a curable composition and has thereby accomplished the invention.

In the present invention, it is believed that the inhibition of polymerization due to oxygen is effectively controlled since a specific polymerizable monomer contains urea linkages and that excellent solubility is realized since a linking group represented by B, C, E, or F contains an ether linkage, or is a linking group having a fairly short chain length, wherby the curable composition of the present invention using such a polymerizable compound exhibits both excellent curability which is insusceptible to oxygen and excellent solubility.

[Curable Composition]

The curable composition of the invention is characterized by including at least one species selected from the polymerizable monomers represented by the following formula (I), formula (II) or formula (III) and a polymerization initiator, as essential ingredients, and optionally a sensitizing dye and other ingredients if necessary.

The curable composition of the invention is a composition which cures due to polymerization of monomers polymerize caused by initiating species, such as radicals, generating from a polymerization initiator due to energy application such as exposure to light.

The ingredients contained in the curable composition of the invention will be described below. First, the polymerizable monomer represented by the formula (I), formula (II) or formula (III), which is the characteristic ingredient of the invention and which may be referred to as specific polymerizable monomer, is described.

<(A) Polymerizable Monomer Represented by Formula (I), Formula (II) or Formula (III)>

In the invention, polymerizable monomers having urea linkages shown below are contained as polymerizable compounds.

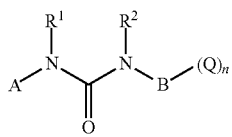
(I)

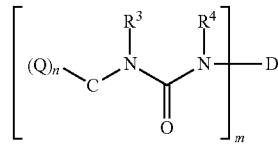
(II)

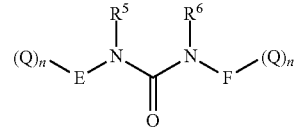
(III)

In the formula (I) to formula (III), Q represents a substituent containing an ethylenically unsaturated group. $R^1$, $R^2$, $R^3$, $R^4$, $R^5$ and $R^6$ each independently represent a hydrogen atom or a monovalent hydrocarbon group.

A represents a hydrogen atom or a monovalent hydrocarbon group; B, C, E and F each independently represents an (n+1)-valent linking group having at least one ether linkage or an (n+1)-valent linking group having 2 to 5 carbon atoms; D represents an (m+1)-valent linking group having at least one ether linkage or an m-valent linking group having 2 to 5 carbon atoms; n represents an integer of 1 to 3; and m represents an integer of 2 to 6.

First, the polymerizable monomer represented by the formula (I) is described.

Q in the formula (I) represents a substituent containing an ethylenically unsaturated group. The substituent Q may be either one having at least one ethylenically unsaturated bond in its structure or one having two or more ethylenically unsaturated bonds.

Specific examples of Q include compounds having, preferably at their terminals, a partial structure like CH=CH— in unsaturated carboxylic acids such as acrylic acid, methacrylic acid, itaconic acid, crotonic acid, isocrotonic acid and maleic acid.

Specific examples of Q include substituents such as an acryloyloxy group and a methacryloyloxy group.

$R^1$ and $R^2$ each independently represent a hydrogen atom or a monovalent hydrocarbon group. Here, the hydrocarbon group preferably has from 1 to about 10 carbon atoms. As $R^1$ and $R^2$, a hydrogen atom or a hydrocarbon group having from 1 to 4 carbon atoms is preferred, and a hydrogen atom or a methyl group is more preferred.

A represents a hydrogen atom or a monovalent hydrocarbon group and preferably represents a hydrogen atom or a hydrocarbon group having from 2 to 5 carbon atoms. The hydrocarbon group may be an ethyl group, a propyl group, a butyl group or the like. Although it may be one having a branched chain, it preferably is a straight chain group. A is more preferably a hydrogen atom.

B represents an (n+1)-valent linking group having at least one ether linkage or an (n+1)-valent linking group having 2 to 5 carbon atoms, and preferably is an (n+1)-valent linking group having at least one ether linkage.

Specific examples of the (n+1)-valent linking group having an ether linkage include divalent linking groups such as —$C_2H_4$—O—$C_2H_4$—, trivalent linking groups such as —$C_2H_4$—O—CH($C_2H_4$)$_2$—, and tetravalent linking groups such as —$C_2H_4$—O—C($C_2H_4$)$_3$. Examples of the (n+1)-valent linking group having 2 to 5 carbon atoms include divalent linking groups such as —$C_2H_4$— and —$C_3H_6$—, trivalent linking groups such as —CH($C_2H_4$)$_2$—, and tetravalent linking groups such as —C($CH_2$)$_3$—.

Here, it is desirable that at least one of A and B contains a partial structure represented by —(CH$_2$—CHR—O)—, and it is more preferable that in the formula (I), B is an (n+1)-valent linking group having —(CH$_2$—CHR—O)— repeating units. Here, R represents a hydrogen atom or a monovalent substituent, and it is preferable that R be a hydrogen atom, a methyl group or an ethyl group.
and n represents an integer of from 1 to 3, preferably is 1 or 2, and most preferably is 1.

Specific examples of the polymerizable monomers represented by the formula (I) are as follows, but the invention is not limited to them.

and R$^4$, a hydrogen atom or a hydrocarbon group having from 1 to 4 carbon atoms is preferred, and a hydrogen atom or a methyl group is more preferred.

C represents an (n+1)-valent linking group having at least one ether linkage or an (n+1)-valent linking group having 2 to 5 carbon atoms, and preferably is an (n+1)-valent linking group having at least one ether linkage.

D represents an (m+1)-valent linking group having at least one ether linkage or an (n+1)-valent linking group having 2 to 5 carbon atoms, and preferably is an (m+1)-valent linking group having at least one ether linkage.

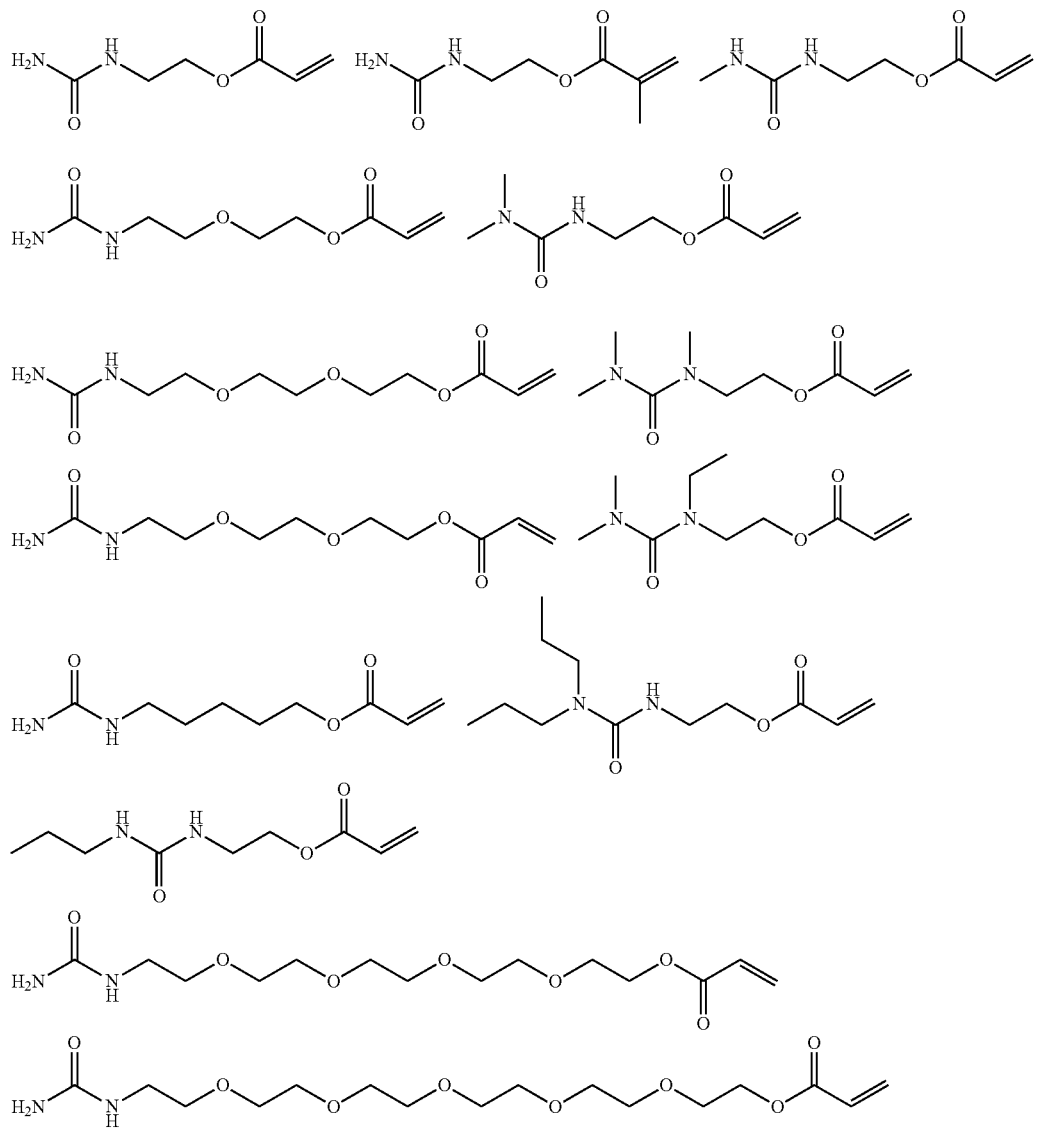

Next, the polymerizable monomer represented by the formula (II) is described.

Q in the formula (II) represents a substituent having an ethylenically unsaturated group and has the same meaning as that in the formula (I). Preferable examples are also the same as those in the formula (I).

R$^3$ and R$^4$ each independently represent a hydrogen atom or a monovalent hydrocarbon group. Here, the hydrocarbon group preferably has from 1 to about 10 carbon atoms. As R$^3$ Here, it is preferable that at least one of C or D contains a partial structure represented by —(CH$_2$—CHR—O)—, and it is more desirable that in the formula (II), both C and D are (n+1)-valent linking groups or (m−1)-valent linking groups having —(CH$_2$—CHR—O)— repeating units. Here, R represents a hydrogen atom or a monovalent linking group, and it is preferable that R is a hydrogen atom, a methyl group or an ethyl group.

Specific examples of the linking group represented by C or D include divalent linking groups such as —$C_2H_4$—O—$C_2H_4$—, trivalent linking groups such as —$C_2H_O$—CH($C_2H_4$)$_2$—, and tetravalent linking groups such as —$C_2H_4$—O—C($C_2H_4$)$_3$—. Examples of the (n+1)-valent linking group having 2 to 5 carbon atoms include divalent linking groups such as —$C_2H_4$ and —$C_3H_6$—, trivalent linking groups such as —CH($C_2H_4$)$_2$—, and tetravalent linking groups such as —C($CH_2$)$_3$—.

n represents an integer of from 1 to 3, preferably is 1 or 2, and most preferably is 1. m represents an integer of from 2 to 6, preferably is from 2 to 4, and most preferably is 2 or 3.

Specific examples of the polymerizable monomers represented by the formula (II) are as follows, but the invention is not limited to them.

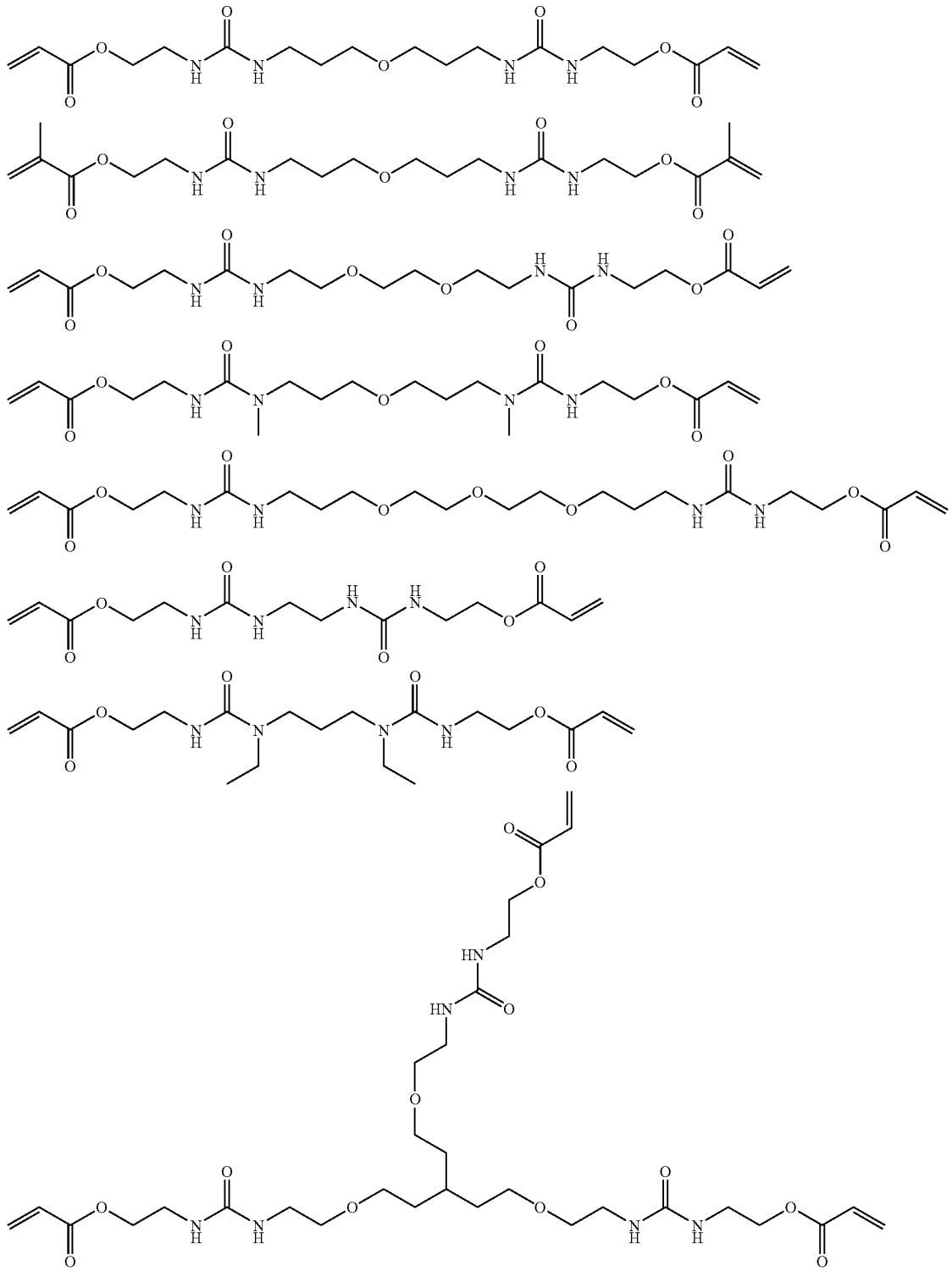

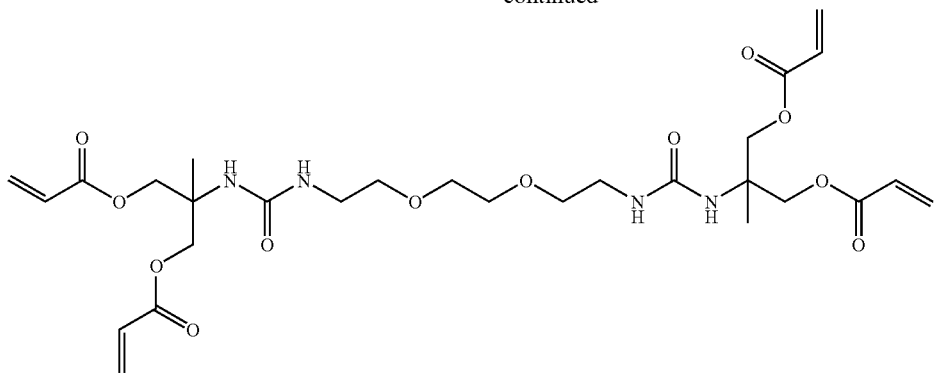

Next, the polymerizable monomer represented by the formula (III) is described.

Q in the formula (III) represents a substituent having an ethylenically unsaturated group and has the same meaning as that in the formula (I). Preferable examples are also the same as those in the formula (I).

$R^5$ and $R^6$ each independently represent a hydrogen atom or a monovalent hydrocarbon group. Here, the hydrocarbon group preferably has from 1 to about 10 carbon atoms. As $R^5$ and $R^6$, a hydrogen atom or a hydrocarbon group having from 1 to 4 carbon atoms is preferred, and a hydrogen atom or a methyl group is more preferred.

E and F each independently represent an (n+1)-valent linking group having at least one ether linkage or an (n+1)-valent linking group having 2 to 5 carbon atoms, and they preferably are (n+1)-valent linking groups having at least one ether linkage.

Here, it is desirable that at least one of E or F must contain a partial structure represented by —(CH$_2$—CHR—O)—, and it is more desirable that in the formula (III), both E and F are (n+1)-valent linking groups having —(CH$_2$—CHR—O)— repeating units. Here, R represents a hydrogen atom or a monovalent substituent, and it is preferable that R be a hydrogen atom, a methyl group or an ethyl group. Specific examples of the linking group represented by E or F include divalent linking groups such as —C$_2$H$_4$—O—C$_2$H$_4$—, trivalent linking groups such as —C$_2$H$_4$—O—CH(C$_2$H$_4$)$_2$—, and tetravalent linking groups such as —C$_2$H$_4$—O—C(C$_2$H$_4$)$_3$. Examples of the (n+1)-valent linking group having 2 to 5 carbon atoms include divalent linking groups such as —C$_2$H$_4$— and —C$_3$H$_6$—, trivalent linking groups such as —CH(C$_2$H$_4$)$_2$—, and tetravalent linking groups such as —C(CH$_2$)$_3$—.

n each independently represents an integer of from 1 to 3, preferably is 1 or 2, and most preferably is 1.

Specific examples of the polymerizable monomers represented by the formula (III) are as follows, but the invention is not limited to them.

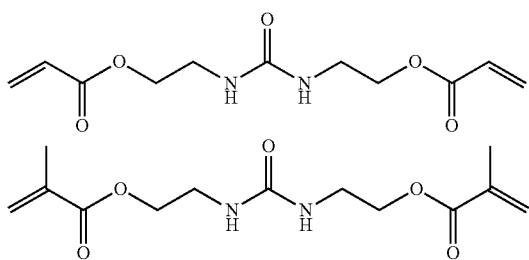

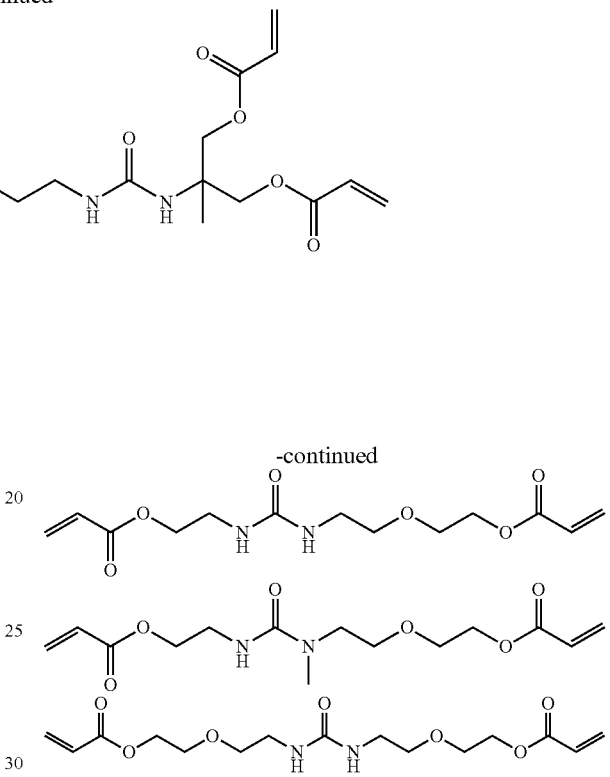

The molecular weights of these polymerizable monomers are preferably from about 100 to about 10000, more preferably are within a range of from 100 to 3000, and even more preferably are within a range of from 300 to 600.

These specific polymerizable monomers can be synthesized easily by reacting various amine compounds with polymerizable group-containing isocyanates. Details of synthesis examples are shown in the examples of the following embodiment.

The curable composition of the invention may contain either only one type or two or more types of these polymerizable monomers. When it contains two or more types of polymerizable monomers, different monomers each represented by the formula (I) may be combined, or alternatively some of the monomers represented by the formula (I) to formula (III) may be properly selected and combined.

The content of the specific polymerizable monomers in the curable composition of the invention is, in terms of solid content, within a range of from 10 to 90% by mass, preferably is within a range of from 30 to 80% by mass, and more preferably is within a range of from 50 to 70% by mass.

<(A-2) Other Polymerizable Compounds>

The polymerizable compounds in the curable composition of the invention may all be the aforementioned specific polymerizable monomers. However, according to the purpose, other polymerizable compounds may be used in combination unless the effect of the invention is affected.

As such a polymerizable compound which can be used in combination, a compound is selected from the compounds having an ethylenically unsaturated bond capable of undergoing addition polymerization, namely, addition-polymerizable compounds having at least one ethylenically unsaturated double bond, and the compounds having at least one, preferably two or more terminal ethylenically unsaturated bonds, except for the aforementioned specific polymerizable monomers.

These compounds are well known in the art, and any thereof may be used in the invention without limitation. These compounds are present in various chemical forms of, monomers, prepolymers such as dimer, trimer and oligomer, and mixtures thereof, and copolymers thereof. Examples of the monomer and copolymer thereof include unsaturated carboxylic acids (e.g., acrylic acid, methacrylic acid, itaconic acid, crotonic acid, isocrotonic acid, and maleic acid) and esters and amides thereof. Preferable examples thereof include esters of unsaturated carboxylic acids and aliphatic polyhydric alcohol compounds, and amides of unsaturated carboxylic acids and aliphatic polyvalent amine compounds. An adduct of an unsaturated carboxylic acid ester or amides having a nucleophilic substituent such as a hydroxyl group, an amino group, or a mercapto group, and a monofunctional or multifunctional isocyanates or an epoxy compounds, and a dehydration condensation product from a monofunctional or multifunctional carboxylic acid are also preferably used. In addition, an adduct of an unsaturated carboxylic acid ester or amide having an electrophilic substituent such as an isocyanate group or an epoxy group and a monofunctional or multifunctional alcohols, amines or thiols, and a substitution product from an unsaturated carboxylic acid ester or amides having a leaving substituent such as a halogen atom or a tosyloxy group and a monofunctional or multifunctional alcohols, amines or thiols are also preferable. Further, a compound which is obtained in the same manner as those of the above compounds except that the unsaturated carboxylic acid is replaced with an unsaturated phosphonic acid styrene, or vinyl ether may also be used.

Examples of the ester monomers between aliphatic polyvalent alcohols and unsaturated carboxylic acids include:

acrylic esters such as ethylene glycol diacrylate, triethylene glycol diacrylate, 1,3-butane diol diacrylate, tetramethylene glycol diacrylate, propylene glycol diacrylate, neopentyl glycol diacrylate, trimethylol propane triacrylate, trimethylol propane tri(acryloyloxypropyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetracrylate, dipentaerythritol diacrylate, dipentaerythritol hexacrylate, sorbitol triacrylate, sorbitol tetracrylate, sorbitol pentacrylate, sorbitol hexacrylate, tri(acryloyloxyethyl) isocyanurate, and polyester acrylate oligomers;

methacrylic esters such as tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butane diol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethyl methane, and bis[p-(methacryloxyethoxy)phenyl]dimethyl methane;

itaconic esters such as ethylene glycol diitaconate, propylene glycol diitaconate, 1,3-butane diol diitaconate, 1,4-butane diol diitaconate, tetramethylene glycol diitaconate, pentaerythritol diitaconate, and sorbitol tetraitaconate;

crotonic esters such as ethylene glycol dicrotonate, tetramethylene glycol dicrotonate, pentaerythritol dicrotonate, sorbitol tetradicrotonate;

isocrotonic esters such as ethylene glycol diisocrotonate, pentaerythritol diisocrotonate, and sorbitol tetraisocrotonate; and maleic esters such as ethylene glycol dimaleate, triethylene glycol dimaleate, pentaerythritol dimaleate, and sorbitol tetramaleate.

Other examples of preferable esters include aliphatic alcohol esters described in JP-B No. 46-27926, JP-B No. 51-47334 and JP-A No. 57-196231, those having an aromatic skeleton described in JP-A No. 59-5240, JP-A No. 59-5241 and JP-A No. 2-226149, and those having an amino group described in JP-A No. 1-165613.

In an embodiment, a mixture of such ester monomers is used.

Examples of monomers of the amides between aliphatic polyvalent amine compounds and unsaturated carboxylic acids include methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, and xylylene bis-methacrylamide.

Preferable examples of other amide monomers include those having a cyclohexylene structure described in JP-B No. 54-21726.

In addition, urethane addition-polymerizable compounds produced by use of addition reaction between an isocyanate and a hydroxyl group are also preferable, and typical examples thereof include the vinylurethane compounds containing two or more polymerizable vinyl groups which are prepared by addition-reacting a hydrogen group-containing vinyl monomer represented by the following formula (i) to a polyisocyanate compound having two or more isocyanate groups in the molecule, which are described in JP-B No. 48-41708.

$$CH_2=C(R^{51})COOCH_2CH(R^{52})OH, \quad \text{Formula (i)}$$

wherein in formula (i), $R^{51}$ and $R^{52}$ each represent H or $CH_3$.

Further, urethane acrylates as described in JP-A No. 51-37193 and JP-B Nos. 2-32293 and 2-16765 and urethane compounds having an ethylene oxide skeleton as described in JP-B Nos. 58-49860, 56-17654, 62-39417 and 62-39418 may also be suitably used.

Furthermore, when an addition-polymerizable compound having an amino structure or a sulfide structure in the molecule like those described in JP-A Nos. 63-277653, 63-260909 and 1-105238 is used, a photopolymerizable composition that is considerably excellent in photosensitizing speed can be obtained.

As other examples, multifunctional acrylates and methacrylates such as polyester acrylates and epoxy acrylates obtained by reacting epoxy resin with (meth)acrylic acid, as described in JP-A No. 48-64183, JP-B No. 49-43191 and JP-B 52-30490, can be mentioned. Specific unsaturated compounds described in JP-B No. 46-43946, JP-B No. 1-40337 and JP-B No. 1-40336 and vinyl phosphonic acid compounds described in JP-A No. 2-25493 can also be mentioned. In some cases, a structure containing a perfluoroalkyl group described in JP-A No. 61-22048 is preferably used. Photosetting monomers and oligomers described in the Journal of Japanese Adhesive Society, vol. 20, No. 7, pp. 300-308 (1984) can also be used.

Details of such polymerizable compounds which can be used in combination, for example, the structure thereof, and the method of use thereof such as whether a compound is used singly or in combination with another, and the amount(s) of the compound(s) used, may be optionally determined depending on the desired performance of a final polymerizable composition. For example, when the curable composition of the invention is used as a photosensitive layer of a negative-working planographic printing plate precursor, they are selected from following viewpoints. From the viewpoint of photosensitivity, compounds preferably have many unsaturated groups in the molecule, and thus bi- or more functional compounds are preferred. In order to increase the strength of the image portions, i.e. the cured film, tri- or more functional compounds are preferred. It is also effective to regulate photosensitivity and strength together by use in combination of compounds (e.g. acrylates, methacrylates, styrene compounds, and vinyl ether compounds) having different functionalities and different polymerizable groups. Although a high-molecular or highly hydrophobic compound is excellent in photosensitizing speed or film strength, it may be unfavorable from the viewpoint of developing speed or due to generation of precipitation in a developing solution. Moreover, with respect to the compatibility and dispersing property to other components in a photosensitive layer (for example, specific polymerizable monomer (A), binder polymer, polymerization initiator, colorant, etc.), the selection and methods of application of addition polymerizable compounds play important roles, and, for example, the application of a low-purity compound or the application of two or more compounds in combination may improve the compatibility.

In the application of the polymerizable composition of the invention to the photosensitive layer in a planographic printing plate precursor, a specific structure may be selected in order to improve the adhesiveness to the support of the planographic printing plate precursor or a protective layer thereof, described later, or the like.

The content of other polymerizable compounds in the curable composition is preferably within a range of from 0 to 50% by mass, and more preferably within a range of from 0 to 20% by mass based on the amount of specific polymerizable monomer (A).

<(B) Polymerization Initiator>

The polymerization initiator used in the invention may be a compound which generates radicals upon heat and/or light energy to initiate and promote the polymerization of a compound having a polymerizable unsaturated group. Specific examples thereof include known radical generators. The radical generator used in the invention may be a known heat polymerization initiator, a compound with smaller dissociation energy, or a photopolymerization initiator. The radical-generating compound preferably used in the invention refers to a compound which generates radicals upon heat energy to initiate and promote the polymerization of a compound having a polymerizable unsaturated group.

The polymerization initiator which generates radicals upon energy deposition may be contained alone or in combination of two or more of them in the photosensitive layer.

Examples of the radical generator include organic halogenated compounds (a), carbonyl compounds (b), organic peroxide compounds (c), azo polymerization initiators (d), azido compounds (e), metallocene compounds (f), hexaarylbiimidazol compounds (g), organic boric acid compounds (h), disulfon compounds (i), oxime ester compounds (j), and onium salt compounds (k).

These compounds will be described below.

Specific examples of the organic halogenated compounds (a) include the compounds described in, for example, Wakabayashi et al. "Bull Chem. Soc Japan" 42, 2924 (1969), U.S. Pat. No. 3,905,815, Japanese Patent Application Publication (JP-B) No. 46-4605, JP-A No. 48-36281, JP-A No. 55-32070, JP-A No. 60-239736, JP-A No. 61-169835, JP-A No. 61-169837, JP-A No. 62-58241, JP-A No. 62-212401, JP-A No. 63-70243, and JP-A No. 63-298339, M. P. Hutt "Journal of Heterocyclic Chemistry" 1 (No. 3), (1970)", and particularly trihalomethyl group-substituted oxazole compounds and S-triazine compounds.

The organic halogenated compound is more preferably an s-triazine derivative wherein at least one mono, di or trihalogen-substituted methyl group is bonded to an s-triazine ring, and specific examples include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-($\alpha,\alpha,\beta$-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(tricoromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-naphthoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, etc.

Examples of the carbonyl compound (b) include benzophenone, benzophenone derivatives such as Michler's ketone, 2-methyl benzophenone, 3-methyl benzophenone, 4-methyl benzophenone, 2-chlorobenzophenone, 4-bromobenzophenone, 2-carboxybenzophenone, etc., acetophenone derivatives such as 2,2-dimethoxy-2-phenyl acetophenone, 2,2-diethoxy acetophenone, 1-hydroxycyclohexylphenyl ketone, $\alpha$-hydroxy-2-methyl phenyl propane, 1-hydroxy-1-methylethyl-(p-isopropylphenyl) ketone, 1-hydroxy-1-(p-dodecylphenyl) ketone, 2-methyl-(4'-(methylthio) phenyl)-2-morpholino-1-propanone, 1,1,1-trichloromethyl-(p-butylphenyl) ketone, etc., thioxanthone, thioxanthone derivatives such as 2-ethyl thioxanthone, 2-isopropyl thioxanthone, 2-chlorothioxanthone, 2,4-dimethyl thioxanthone, 2,4-diethyl thioxanthone, 2,4-diisopropyl thioxanthone, etc., and benzoate esters such as ethyl p-dimethylaminobenzoate, ethyl p-diethylaminobenzoate, etc.

Examples of the organic peroxide compounds (c) include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumenehydroperoxide, diisopropylbenzenehydroperoxide, 2,5-dimethylhexane-2,5-dihydroperoxide, 1,1,3,3-tetramethylbutylhydroperoxide, tert-butylcumylperoxide, dicumylperoxide, 2,5-dimethyl-2,5-di(tert-butylperoxy)hexane, 2,5-oxanoylperoxide, succinic acid peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, tert-butylperoxy acetate, tert-butylperoxy pivalate, tert-butylperoxyneodecanoate, tert-butylperoxy octanoate, tert-butylperoxy laurate, tertiary carbonate, 3,3',4,4'-tetra-(t-butylperoxycarbonyl)benzophenone, 3,3',4,4'-tetra-(t-hexylperoxycarbonyl)benzophenone, 3,3',4,4'-tetra-(p-isopropylcumylperoxycarbonyl) benzophenone, carbonyldi(t-butylperoxydihydrogen diphthalate), and carbonyldi(t-hexylperoxydihydrogen diphthalate).

Example of the azo polymerization initiators (d) include azo compounds described in JP-A No. 8-108621.

Examples of the azido compounds (e) include 2,6-bis(4-azidobenzylidene)-4-methylcyclohexanone.

Examples of the metallocene compounds (f) include various titanocene compounds described in JP-A No. 59-152396, JP-A No. 61-151197, JP-A No. 63-41484, JP-A No. 2-249, JP-A No. 2-4705, and JP-A No. 5-83588, such as di-cyclopentadienyl-Ti-bis-phenyl, di-cyclopentadienyl-Ti-bis-2,6-difluorophen-1-yl, di-cyclopentadienyl-Ti-bis-2,4-di-fluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclopentadienyl-Ti-bis-2,3,4,5,6-pentafluorophen-1-yl, di-methylcyclopentadienyl-Ti-bis-2,6-difluorophen-1-yl, di-methyl cyclopentadienyl-Ti-bis-2,4,6-trifluorophen-1-yl, di-methylcyclopentadienyl-Ti-bis-2,3,5,6-tetrafluorophen-1-yl, di-methylcyclopentadienyl-Ti-bis-2,3,4,5,6-pentafluorophen-1-yl, and iron-allene complexes described in JP-A No. 1-304453 and JP-A No. 1-152109.

Examples of the hexaarylbiimidazol compounds (g) include various compounds described in JP-B No. 6-29285, U.S. Pat. No. 3,479,185, U.S. Pat. No. 4,311,783, and U.S. Pat. No. 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methyl phenyl)-4,4',5,5'-tetraphenylbiimidazole, and 2,2'-bis (o-trifluorophenyl)-4,4',5,5'-tetraphenyl biimidazole.

Specific examples of the organic boric aid compounds (h) include organic borates described in, for example, JP-A No. 62-143044, JP-A No. 62-150242, JP-A No. 9-188685, JP-A No. 9-188686, JP-A No. 9-188710, JP-A No. 2000-131837, JP-A No. 2002-107916, Japanese Patent No. 2764769, Japanese Patent Application No. 2000-310808, and Kunz, Martin 'Rad Tech' 98. Proceeding Apr. 19-22, 1998, Chicago", organic boron sulfonium complexes or organic boron oxosulfonium complexes described in JP-A No. 6-157623, JP-A No. 6-175564, and JP-A No. 6-175561, organic boron iodonium complexes described in JP-A No. 6-175554 and JP-A No. 6-175553, organic boron phosphonium complexes described in JP-A No. 9-188710, and organic boron transition metal coordination complexes described in JP-A No. 6-348011, JP-A No. 7-128785, JP-A No. 7-140589, JP-A No. 7-306527, and JP-A No. 7-292014.

Examples of the disulfone compounds (i) include compounds described in JP-A No. 61-166544, and Japanese Patent Application No. 2001-132318.

Examples of the oxime ester compounds (j) include compounds described in J. C. S. Perkin II, pp. 1653-1660 (1979), J. C. S. Perkin II, pp. 156-162 (1979), Journal of Photopolymer Science and Technology, pp. 202-232 (1995) and JP-A No. 2000-66385, and compounds described in JP-A No. 2000-80068, and specific examples thereof include the following compounds.

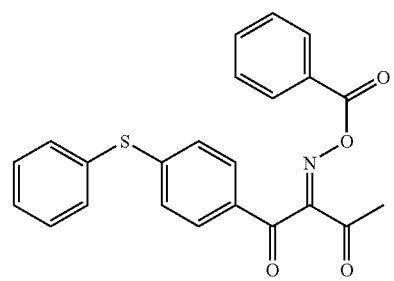

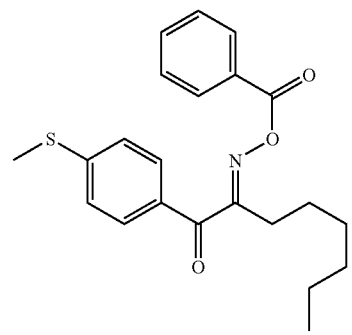

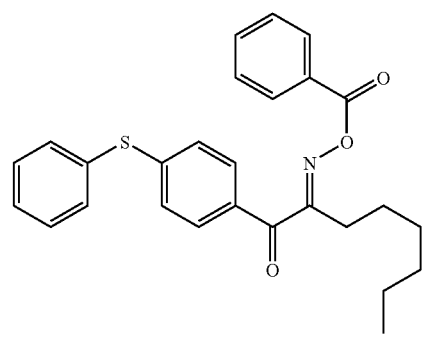

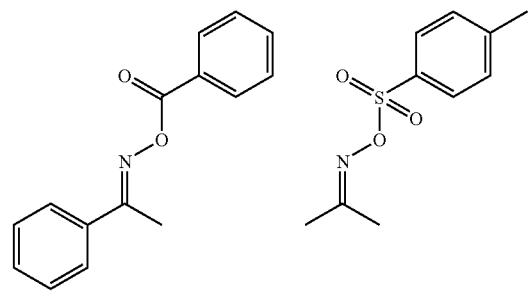

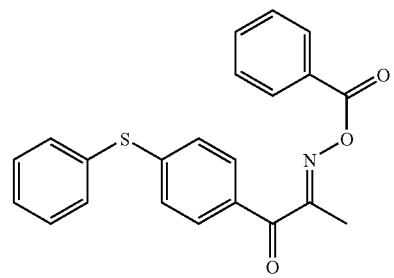

17
-continued
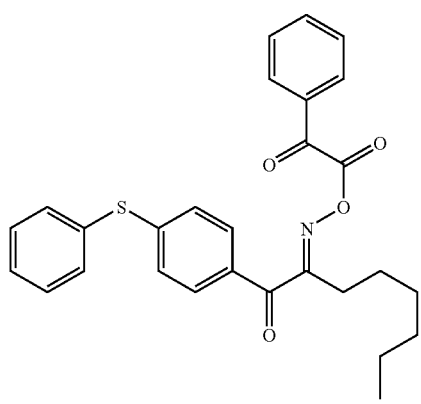
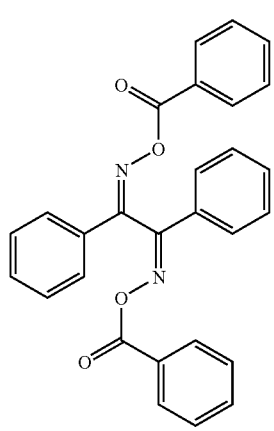
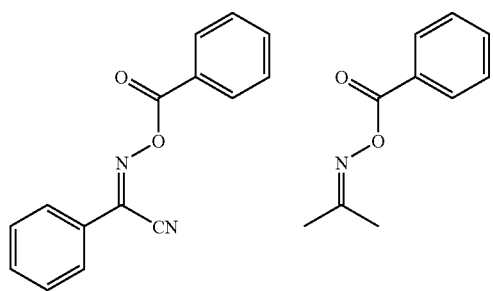
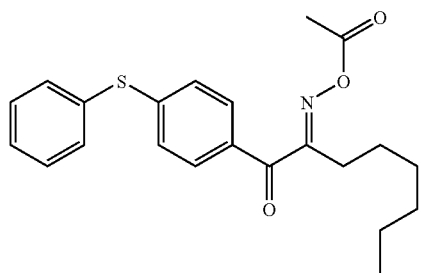
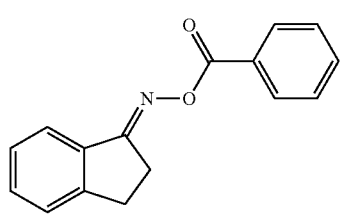
18
-continued
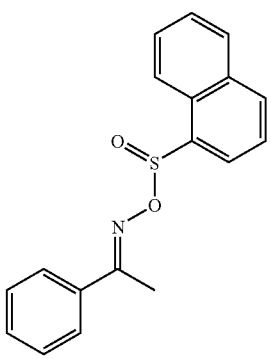
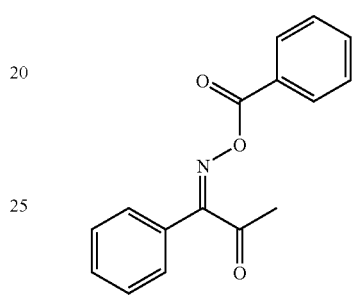
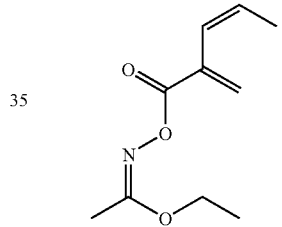
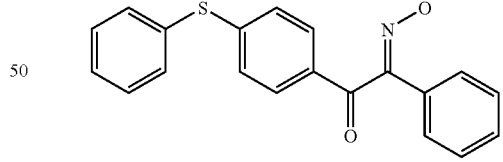
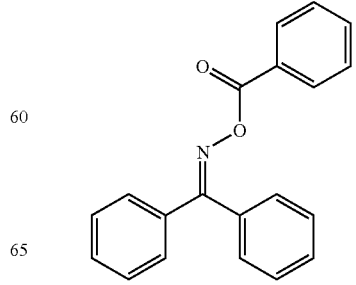

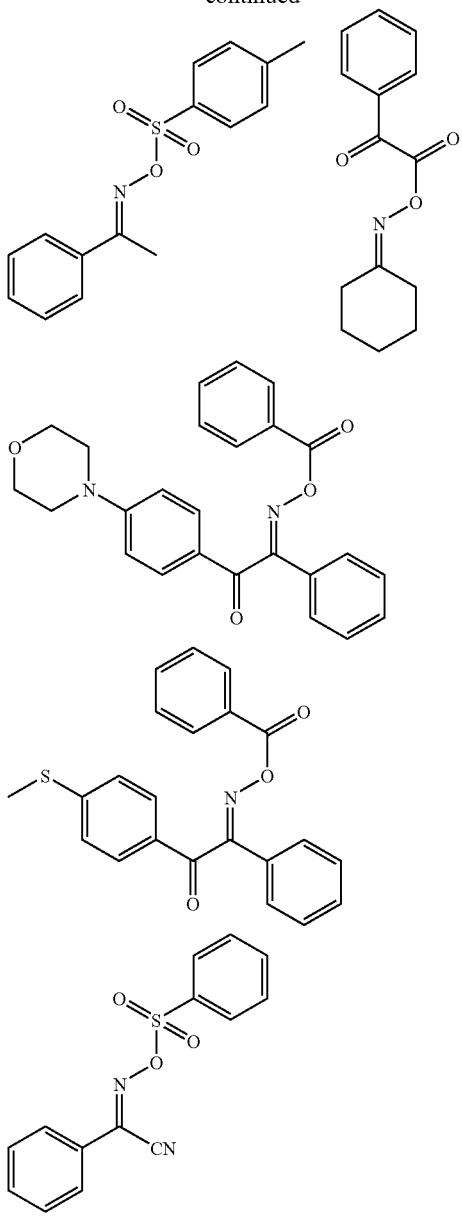

Examples of the theonium salt compounds (k) include diazonium salts described in S. I. Schlesinger, Photogr, Sci, Eng., 18,387 (1974), T. S. Bal et al, Polymer, 21,423 (1980), ammonium salts described in U.S. Pat. No. 4,069,055 and JP-A No. 4-365049, phosphonium salts described in U.S. Pat. No. 4,069,055 and U.S. Pat. No. 4,069,056, iodonium salts described in European Patent Application No. 104,143, U.S. Pat. No. 339,049 and U.S. Pat. No. 410,201, JP-A No. 2-150848 and JP-A No. 2-296514, sulfonium salts described in European Patent Application No. 370,693, European Patent Application No. 390,214, European Patent Application No. 233,567, European Patent Application No. 297,443, European Patent Application No. 297,442, U.S. Pat. No. 4,933,377, U.S. Pat. No. 161,811, U.S. Pat. No. 410,201, U.S. Pat. No. 339,049, U.S. Pat. No. 4,760,013, U.S. Pat. No. 4,734,444, U.S. Pat. No. 2,833,827, German Patent No. 2,904,626, German Patent No. 3,604,580, and German Patent No. 3,604,581, selenonium salts described in J. V. Crivello et al, Macromolecules, 10 (6), 1307 (1977), J. V. Crivello et al, J. Polymer Sci., Polymer Chem, Ed., 17, 1047 (1979), and arsonium salts described in C. S. Wen et al, Teh, Proc. Conf. Rad, Curing ASIA, p. 478, Tokyo, October (1988).

From the viewpoints of the reactivity and stability, the above-described oxime ester compounds and diazonium salts, iodonium salts, and sulfonium salts, which will be further described later, are particularly preferable examples of the polymerization initiator. In the invention, the onium salt functions not as an acid generator, but as an ionic radical polymerization initiator.

In the invention, the onium salts represented by the following formulae (RI-I) to (RI-III) are preferable.

(RI-I)

(RI-II)

(RI-III)

In the formula (RI-I), $Ar^{11}$ represents an aryl group containing 20 or less carbon atoms, which may have 1 to 6 substituents, and the substituents are preferably selected from alkyl groups each containing 1 to 12 carbon atoms, alkenyl groups each containing 1 to 12 carbon atoms, alkynyl groups each containing 1 to 12 carbon atoms, aryl groups each containing 1 to 12 carbon atoms, alkoxy groups each containing 1 to 12 carbon atoms, aryloxy groups each containing 1 to 12 carbon atoms, halogen atoms, alkylamino groups each containing 1 to 12 carbon atoms, dialkylamino groups each containing 1 to 12 carbon atoms, alkyl amide groups each containing 1 to 12 carbon atoms, aryl amide groups each containing 1 to 12 carbon atoms, carbonyl groups, carboxyl groups, cyano groups, sulfonyl groups, thioalkyl groups each containing 1 to 12 carbon atoms, and thioaryl groups each containing 1 to 12 carbon atoms. $Z_{11}{}^-$ represents a monovalent anion which may be selected from a halogen ion, a perchlorate ion, a hexafluorophosphate ion, a tetrafluoroborate ion, a sulfonate ion, a sulfinate ion, a thiosulfonate ion and a sulfate ion. $Z_{11}{}^-$ preferably represents a perchlorate ion, a hexafluorophosphate ion, a tetrafluoroborate ion, a sulfonate ion, a sulfinate ion, or a carboxylate ion from the viewpoint of stability and reactivity.

In the formula (RI-II), $Ar^{21}$ and $Ar^{22}$ each independently represent an aryl group containing 20 or less carbon atoms, which may have 1 to 6 substituents, and the substituents are preferably selected from alkyl groups each containing 1 to 12 carbon atoms, alkenyl groups each containing 1 to 12 carbon atoms, alkynyl groups each containing 1 to 12 carbon atoms, aryl groups each containing 1 to 12 carbon atoms, alkoxy groups each containing 1 to 12 carbon atoms, aryloxy groups each containing 1 to 12 carbon atoms, halogen atoms, alkylamino groups each containing 1 to 12 carbon atoms, dialkylamino groups each containing 1 to 12 carbon atoms, alkyl amide groups each containing 1 to 12 carbon atoms, aryl amide groups each containing 1 to 12 carbon atoms, carbonyl groups, carboxyl groups, cyano groups, sulfonyl groups, thioalkyl groups each containing 1 to 12 carbon atoms, and thioaryl groups each containing 1 to 12 carbon atoms. $Z_{21}$—represents a monovalent anion which may be selected from a halogen ion, a perchlorate ion, a hexafluorophosphate ion, a tetrafluoroborate ion, a sulfonate ion, a sulfinate ion, a thiosulfonate ion and a sulfate ion. $Z_{21}$—preferably represents a perchlorate ion, a hexafluorophosphate ion, a tetrafluoroborate ion, a sulfonate ion, or a sulfinate ion from the viewpoint of stability.

In the formula (RI-III), $R^{31}$, $R^{32}$ and $R^{33}$ each independently represent an aryl group, alkyl group, alkenyl group or alkynyl group containing 20 or less carbon atoms which may have 1 to 6 substituents, and is preferably an aryl group in respect of reactivity and safety. The substituents are preferably selected from alkyl groups each containing 1 to 12 carbon atoms, alkenyl groups each containing 1 to 12 carbon atoms, alkynyl groups each containing 1 to 12 carbon atoms, aryl groups each containing 1 to 12 carbon atoms, alkoxy groups each containing 1 to 12 carbon atoms, aryloxy groups each containing 1 to 12 carbon atoms, halogen atoms, alkylamino groups each containing 1 to 12 carbon atoms, dialkylamino groups each containing 1 to 12 carbon atoms, alkyl amide groups each containing 1 to 12 carbon atoms, aryl amide groups each containing 1 to 12 carbon atoms, carbonyl groups, carboxyl groups, cyano groups, sulfonyl groups, thioalkyl groups each containing 1 to 12 carbon atoms, and thioaryl groups each containing 1 to 12 carbon atoms.

$Z_{31}$—represents a monovalent anion which may be selected from a halogen ion, a perchlorate ion, a hexafluorophosphate ion, a tetrafluoroborate ion, a sulfonate ion, a sulfinate ion, a thiosulfonate ion and a sulfate ion. $Z_{31}$—preferably represents a perchlorate ion, a hexafluorophosphate ion, a tetrafluoroborate ion, a sulfonate ion, a sulfinate ion, or a carboxylate ion from the viewpoint of stability and reactivity. $Z_{31}$—preferably represents a carboxylate ion disclosed in JP-A2000-160323. Z31—further preferably represents a carboxylate ion disclosed in JP-A 2001-177150 and JP-A 2000-266797.

Examples of the polymerization initiator usable in the invention are shown below. However, the examples are not limited to them.

(N-1)

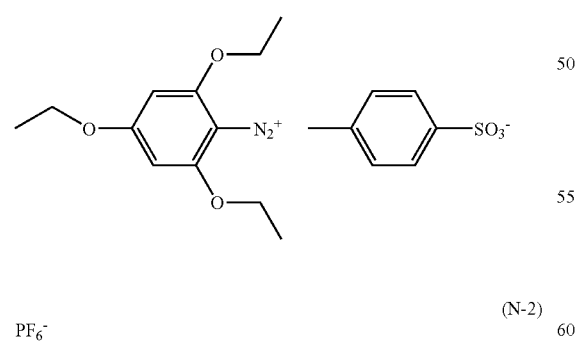

(N-2)

PF$_6^-$ (N-3)

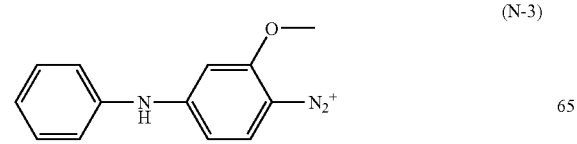

-continued

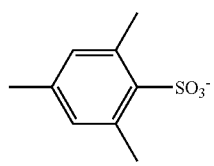

(N-4)

ClO$_4^-$ (N-5)

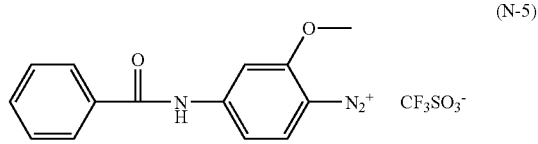 CF$_3$SO$_3^-$ (N-6)

BF$_4^-$ (N-7)

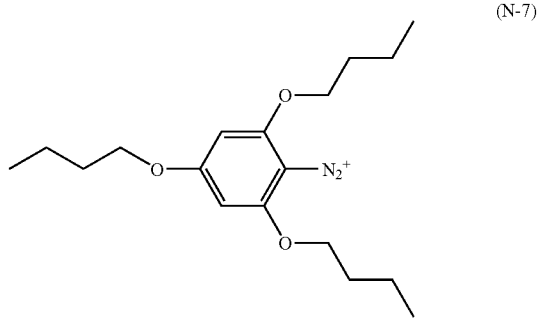

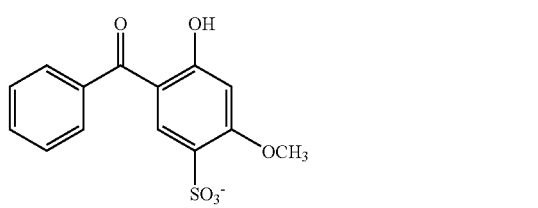

ClO$_4^-$ (N-8)

(N-9)

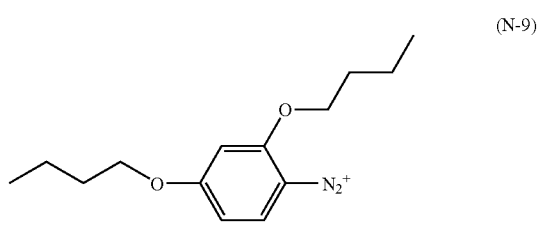

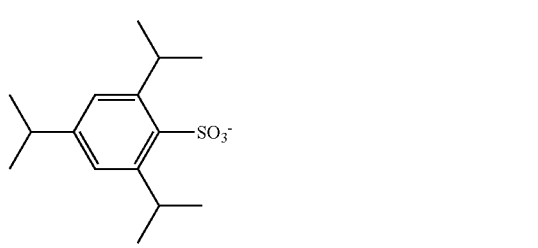

(N-10)

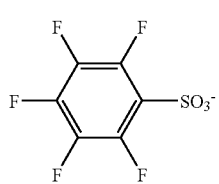

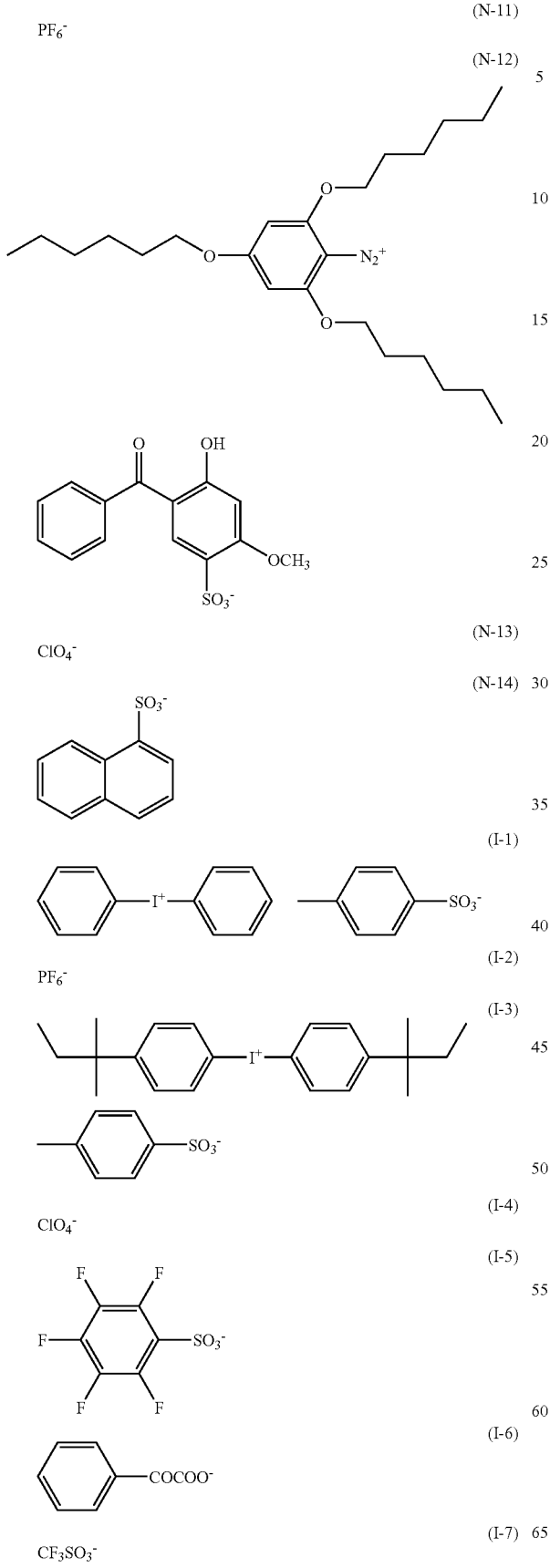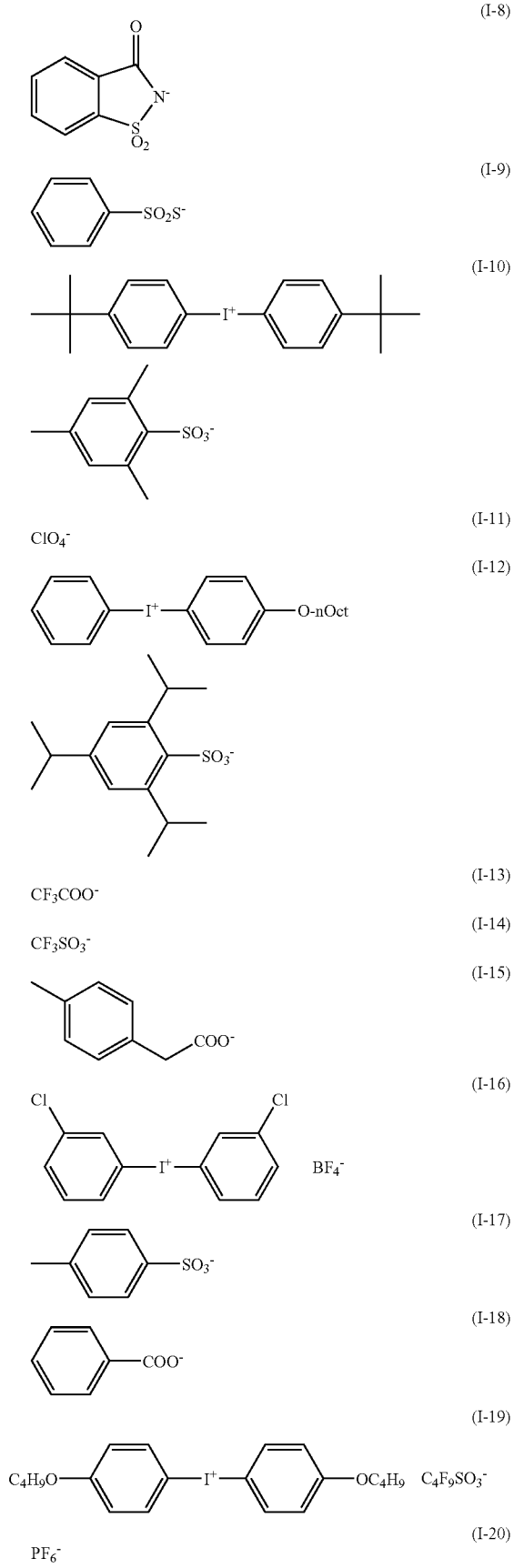

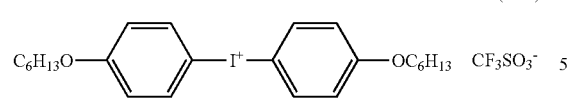 (I-21)
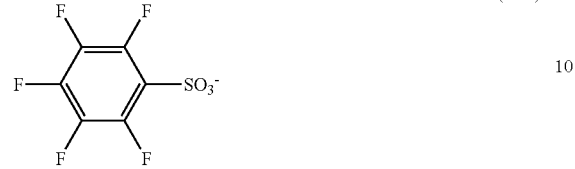 (I-22)
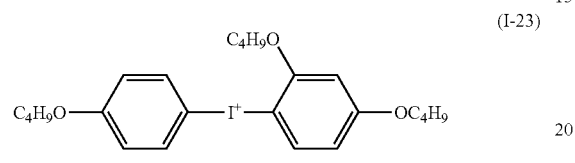 (I-23)
PF$_6^-$ (I-24)
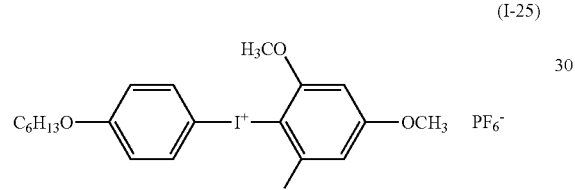 (I-25)
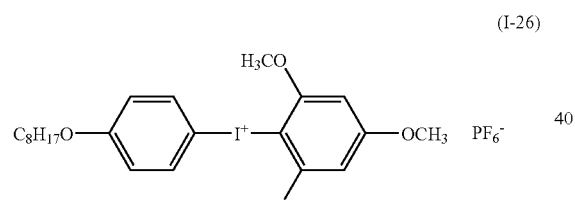 (I-26)
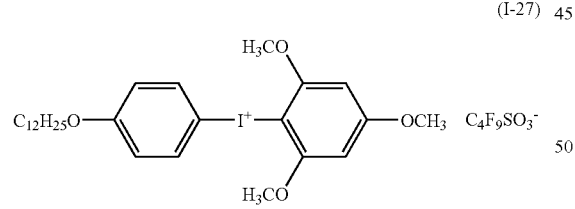 (I-27)
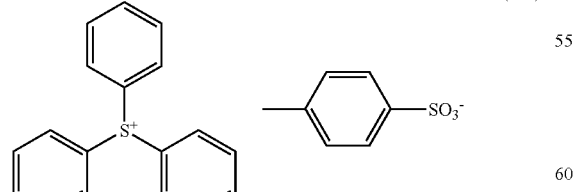 (S-1)
PF$_6^-$ (S-2)
ClO$_4^-$ (S-3)
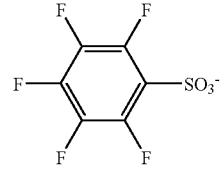 (S-4)
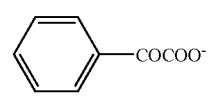 (S-5)
CF$_3$SO$_3^-$ (S-6)
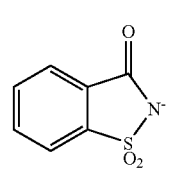 (S-7)
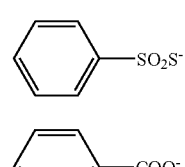 (S-8)
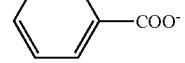 (S-9)
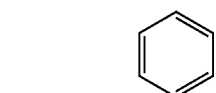 (not labeled — S-9 continued? actually S-9 is above; this is part of next)
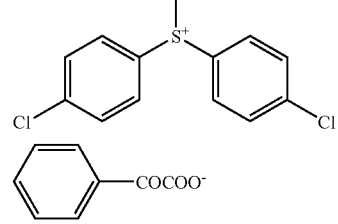 (S-10)
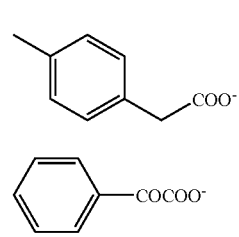 (S-11)
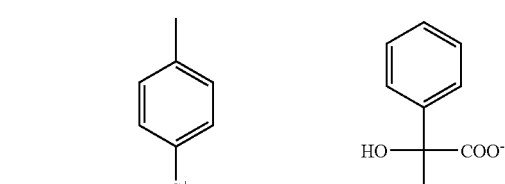 (S-12)
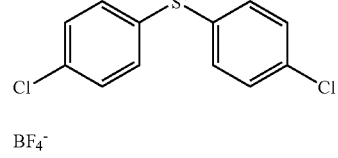 (S-13)
BF$_4^-$ (S-14)

-continued

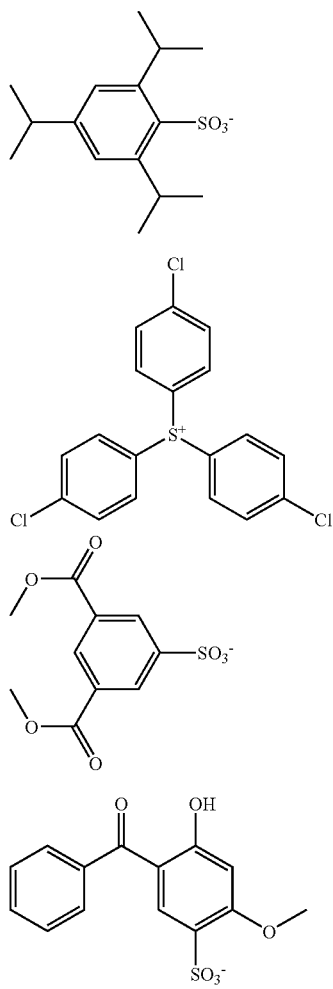

(S-15)

(S-16)

(S-17)

Among the above-described compounds, diazonium salts, iodonium salts, and sulfonium salts included in oxime ester compounds (j) or onium chlorides (k) are preferable as the polymerization initiator in the invention from the viewpoints of particularly the reactivity and stability. In the invention, the onium salt functions not as an acid generator, but an ionic radical polymerization initiator.

The polymerization initiator in the invention is particularly preferably an iodonium salt having an electron-donating group or sulfonium salt having an electron-withdrawing group from the viewpoint of the balance between the reactivity and stability, and in particular, an iodonium salt having two or more alkoxy groups in its skeleton with a cation portion is preferable, and an iodonium salt having three or more alkoxy groups is most preferable.

The polymerization initiator (B) may be contained alone or in combination of two or more of them in the curable composition.

The polymerization initiator (B) is used in an amount of from 0.1 to 50% by mass, preferably from 0.5 to 30% by mass, most preferably from 1 to 20% by mass with respect to the total solid content composing the curable composition. When the amount is within the range, favorable sensitivity and favorable stain resistance of the non-image region during printing are achieved. The polymerization initiator may be used alone, or in combination of two or more of them. The polymerization initiator may be added to the same layer together with other components, or may be added to an independently formed layer.

Although the curable composition of the invention contains the specific polymerizable monomer (A) and the polymerization initiator (B), previously described, as essential ingredients, it may further contain other compounds according to the purpose.

In the following, such other ingredients which can be used in the curable composition of the invention are described.
<(C) Sensitizing Dye>

The polymerizable compositions contain sensitizing dyes to improve sensitivity. The sensitizing dyes have a peak of the absorbance at 300 to 850 nm, more preferably at 300 to 600 nm. Examples of such sensitizing dyes include spectral sensitizing dyes, colorant or pigment interacting with photopolymerization initiator which absorbs the light of the light source.

Preferable examples of the spectral sensitizing dyes include polynuclear aromatics (e.g. pyrene, perylene, and triphenylene), xanthenes (e.g. fluorescein, eosin, erythrosine, rhodamine B, and rose bengal), cyanines (e.g. thiacarbocyanine, and oxacarbocyanine), melocyanines (e.g. melocyanine and carbomelocyanine), thiazines (e.g. thioene, methylene blue, and toluidine blue), acridines (e.g. acridine orange, chloroflavine, and acriflavine), phthalocyanines (e.g. phthalocyanine and metallophthalocyanine), porphyrins (e.g. tetraphenyl porphyrin, center metal substituted porphyrin), chlorophylls (e.g. chlorophyll, chlorophyllin, and center metal substituted chlorophyll), metal complexes, anthraquinones (e.g. anthraquinone), and squaryliums (e.g. squarylium).

More preferable examples of the spectral sensitizing dyes include styryl dyes described in JP-B No. 37-13034, cation dyes described in JP-A No. 62-143044, quinoxalinium salts described in JP-B No. 59-24147, novel methylene blue compounds described in JP-A No. 64-33104, anthraquinones described in JP-A No. 64-56767, benzoxanthene dyes described in JP-A No. 2-1714, acridines described in JP-A No. 2-226148 and JP-A No. 2-226149, pyrylium salts described in JP-B No. 40-28499, cyanines described in JP-B No. 46-42363, benzofuran dyes described in JP-A No. 2-63053, conjugate ketone dyes described in JP-A No. 2-85858 and JP-A No. 2-216154, dyes described in JP-A No. 57-10605, azocinnamylidene derivatives described in JP-B No. 2-30321, cyanine dyes described in JP-A No. 1-287105, xanthene dyes described in JP-A No. 62-31844, JP-A No. 62-31848, and JP-A No. 62-143043, aminostyryl ketones described in JP-B No. 59-28325, melocyanine dyes described in JP-B No. 61-9621, dyes described in JP-A No. 2-179643, melocyanine dyes described in JP-A No. 2-244050, melocyanine dyes described in JP-B No. 59-28326, melocyanine dyes described in JP-A No. 59-89803, melocyanine dyes described in JP-A No. 8-129257, and benzopyran dyes described in JP-A No. 8-334897.

The sensitizing dye used in the invention is more preferably represented by the following formula (12).

Formula (12)

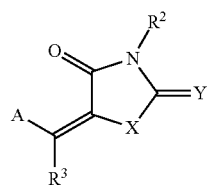

In the formula (12), A represents an optionally substituted aromatic ring or heterocycle, X represents an oxygen atom, a sulfur atom, or —N($R^1$)—, and Y represents an oxygen atom or —N($R^1$)—. $R^1$, $R^2$, and $R^3$ each independently represents a hydrogen atom or a monovalent group of nonmetal atoms. A, $R^1$, $R^2$, and $R^3$ may be combined with each other to form an aliphatic or aromatic ring.

When $R^1$, $R^2$, and $R^3$ each represents a monovalent group of nonmetal atoms, and preferably represents a substituted or unsubstituted alkyl group or aryl group.

Specific preferable examples of $R^1$, $R^2$, and $R^3$ are described below. Preferable examples of the alkyl group include linear, branched, and cyclic alkyl groups having 1 to 20 carbon atoms, and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecy group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Among them, linear alkyl groups having 1 to 12 carbon atoms, branched alkyl groups having 3 to 12 carbon atoms, and cyclic alkyl groups having 5 to 10 carbon atoms are more preferable.

As the substituent of the substituted alkyl group, a monovalent group of nonmetal atoms excluding hydrogen atoms is used, preferable examples thereof include a halogen atom (—F, —Br, —Cl, or —I), a hydroxyl group, an alkoxy group, an aryloxy group, a mercapto group, an alkylthio group, an arylthio group, an alkyldithio group, an aryldithio group, an amino group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an alkylsulfoxy group, an arylsulfoxy group, an acyloxy group, an acylthio group, an acylamino group, a N-alkylacylamino group, a N-arylacylamino group, an ureido group, a N'-alkylureido group, a N',N'-dialkylureido group, a N'-arylureido group, a N',N'-diarylureido group, a N'-alkyl-N'-arylureido group, a N-alkylureido group, a N-arylureido group, a N'-alkyl-N-alkylureido group, a N'-alkyl-N-arylureido group, a N',N'-dialkyl-N-alkylureido group, a N',N'-dialkyl-N-arylureido group, a N'-aryl-N-alkylureido group, a N'-aryl-N-arylureido group, a N',N'-diaryl-N-alkylureido group, a N',N'-diaryl-N-arylureido group, a N'-alkyl-N'-aryl-N-alkylureido group, a N'-alkyl-N'-aryl-N-arylureido group, an alkoxycarbonylamino group, an aryloxycarbonylamino group, a N-alkyl-N-alkoxycarbonylamino group, a N-alkyl-N-aryloxycarbonylamino group, a N-aryl-N-alkoxycarbonylamino group, a N-aryl-N-aryloxycarbonylamino group, a formyl group, an acyl group, a carboxyl group, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, an alkylsulfinyl group, an arylsulfinyl group, an alkylsulfonyl group, an arylsulfonyl group, a sulfo group (—$SO_3H$) and conjugate base groups thereof (hereinafter, referred to as a sulfonate group), an alkoxysulfonyl group, an aryloxysulfonyl group, a sulfinamoyl group, a N-alkylsulfinamoyl group, a N,N-dialkylsulfinamoyl group, a N-arylsulfinamoyl group, a N,N-diarylsulfinamoyl group, a N-alkyl-N-arylsulfinamoyl group, a sulfamoyl group, a N-alkylsulfamoyl group, a N,N-dialkylsulfamoyl group, a N-arylsulfamoyl group, a N,N-diarylsulfamoyl group, a N-alkyl-N-arylsulfamoyl group, a phosphono group (—$PO_3H_2$) and conjugate base groups thereof (hereinafter, referred to as a phosphonate group), a dialkylphosphono group (—$PO_3(alkyl)_2$), diarylphosphono group (—$PO_3(aryl)_2$), an alkylarylphosphono group(—$PO_3(alkyl)(aryl)$), a monoalkylphosphono group (—$PO_3H(alkyl)$) and conjugate base groups thereof (hereinafter, referred to as an alkylphosphonate group), a monoarylphosphono group (—$PO_3H(aryl)$) and conjugate base groups thereof (hereinafter, referred to as an arylphosphonate group), phosphonooxy group (—$OPO_3H_2$) and conjugate base groups thereof (hereinafter, referred to as a phosphonateoxy group), a dialkyl phosphonooxy group (—$OPO_3(alkyl)_2$), diarylphosphonooxy group (—$OPO_3(aryl)_2$), alkylarylphosphonooxy group (—$OPO_3(alkyl)(aryl)$), monoalkylphosphonooxy group (—$OPO_3H(alkyl)$) and conjugate base groups thereof (hereinafter, referred to as an alkylphosphonateoxy group), monoarylphosphonooxy group (—$OPO_3H(aryl)$) and conjugate base groups thereof (hereinafter, referred to as an arylphosphonateoxy group), a cyano group, a nitro group, an aryl group, a heteroaryl group, an alkenyl group, an alkynyl group, and a silyl group.

Specific examples of the alkyl group in these substituents include the above-described alkyl groups, which may be further substituted.

Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, a N-phenylcarbamoylphenyl group, a phenyl group, a cyanophenyl group, a sulfophenyl group, a sulfonatephenyl group, a phosphonophenyl group, and a phosphonatephenyl group.

The heteroaryl group is a group derived from a monocyclic or polycyclic aromatic ring containing at least one of a nitrogen atom, an oxygen atom, and a sulfur atom. Particularly preferable examples of the heteroaryl ring in the heteroaryl group include thiophene, thiathrene, furan, pyran, isobenzofuran, chromene, xanthene, phenoxazine, pyrrole, pyrazole, isothiazole, isoxazole, pyrazine, pyrimidine, pyridazine, indolysine, isoindolysine, indoyl, indazole, prine, quinolizine, isoquinoline, phthalazine, naphthyridine, quinazoline, cinnoline, pteridine, carbazole, carboline, phenanthroline, acridine, perimidine, phenanthroline, phthalazine, phenarsazine, phenoxazine, and furazan, which may be further benzo-condensed ring, or may be substituted.

Examples of the alkenyl group include a vinyl group, a 1-propenyl group, a 1-butenyl group, a cinnamyl group, and a 2-chloro-1-ethenyl group, and examples of the alkynyl group include an ethynyl group, a 1-propynyl group, a 1-butynyl group, and a trimethylsilylethynyl group. Examples of $G^1$ in the acyl group ($G^1CO$—) include a hydrogen atom, and the above-described alkyl group and aryl group. Among these substituents, more preferable examples include a halogen atom (—F, —Br, —Cl, and —I), an alkoxy group, an aryloxy group, an alkylthio group, an arylthio group, a N-alkylamino group, a N,N-dialkylamino group, an acyloxy group, a N-alkylcarbamoyloxy group, a N-arylcarbamoyloxy group, an acylamino group, a formyl group, an acyl group, a carboxyl group, an alkoxycarbonyl group, an aryloxycarbonyl group, a carbamoyl group, a N-alkylcarbamoyl group, a N,N-dialkylcarbamoyl group, a N-arylcarbamoyl group, a N-alkyl-N-arylcarbamoyl group, a sulfo group, a sulfonate group, a sulfamoyl group, a N-alkylsulfamoyl group, a N,N-dialkylsulfamoyl group, a N-arylsulfamoyl group, a N-alkyl-N-arylsulfamoyl group, a phosphono group, a phosphonate group, a dialkylphosphono group, a diarylphosphono group, a monoalkylphosphono group, an alkylphosphonate group, a monoarylphosphono group, an arylphosphonate group, a phosphonooxy group, a phosphonateoxy group, an aryl group, an alkenyl group, and an alkylidene group (e.g. methylene group).

Examples of the alkylene group in the substituted alkyl group include a divalent organic residue obtained by removing any one of the hydrogen atoms on the above-described alkyl group having 1 to 20 carbon atoms, and preferable examples thereof include a linear alkylene group having 1 to 12 carbon atoms, a branched alkylene group having 3 to 12 carbon atoms, and a cyclic alkylene group having 5 to 10 carbon atoms.

Specific examples of the substituted alkyl group which is obtained by combining the above-described substituent with an alkylene group and is preferable as $R^1$, $R^2$, or $R^3$ include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, a N-cyclohexylcarbamoyloxyethyl group, a N-phenylcarbamoyloxyethyl group, an acetylaminoethyl group, a N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, a N-methylcarbamoylethyl group, a N,N-dipropylcarbamoylmethyl group, a N-(methoxyphenyl)carbamoylethyl group, a N-methyl-N-(sulfophenyl)carbamoylmethyl group, a sulfobutyl group, a sulfonatepropyl group, a sulfonatebutyl group, a sulfamoylbutyl group, a N-ethylsulfamoylmethyl group, a N,N-dipropylsulfamoylpropyl group, a N-tolylsulfamoylpropyl group, a N-methyl-N-(phosphonophenyl)sulfamoyloctyl group, a phosphonobutyl group, a phosphonatehexyl group, a diethylphosphonobutyl group, a diphenylphosphonopropyl group, a methylphosphonobutyl group, a methylphosphonatebutyl group, a tolylphosphonohexyl group, a tolylphosphonatehexyl group, a phosphonooxypropyl group, a phosphonateoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

Specific examples of the aryl group preferable as $R^1$, $R^2$, or $R^3$ include a condensed ring formed by 1 to 3 benzene rings, and a condensed ring formed by a benzene ring and a 5-membered unsaturated ring, and specific examples thereof include a phenyl group, a naphthyl group, an anthryl group, a phenanthryl group, an indenyl group, an acenaphthenyl group, and a fluorenyl group. Among these groups, a phenyl group, and a naphthyl group are more preferable.

Specific examples of the substituted aryl group preferable as $R^1$, $R^2$, or $R^3$ include a the above-described aryl group having a monovalent group of nonmetal atoms (excluding hydrogen atoms) as a substituent on the carbon atom forming the ring. Preferable examples of the substituent include the above-described alkyl group, substituted alkyl group, and examples of the substituents in the alkyl group. Specific preferable examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, a N-cyclohexylcarbamoyloxyphenyl group, a N-phenylcarbamoyloxyphenyl group, an acetylaminophenyl group, a N-methylbenzoylaminophenyl group, a carboxyphenyl group, a methoxycarbonylphenyl group, an allyloxyvcarbonylphenyl group, a chlorophenoxycarbonylphenyl group, a carbamoylphenyl group, a N-methylcarbamoylphenyl group, a N,N-dipropylcarbamoylphenyl group, a N-(methoxyphenyl)carbamoylphenyl group, a N-methyl-N-(sulfophenyl)carbamoylphenyl group, a sulfophenyl group, a sulfonatephenyl group, a sulfamoylphenyl group, a N-ethylsulfamoylphenyl group, a N,N-dipropylsulfamoylphenyl group, a N-tolylsulfamoylphenyl group, a N-methyl-N-(phosphonophenyl)sulfamoylphenyl group, a phosphonophenyl group, a phosphonatephenyl group, a diethylphosphonophenyl group, a diphenylphosphonophenyl group, a methylphosphonophenyl group, a methylphosphonatephenyl group, a tolylphosphonophenyl group, a tolylphosphonatephenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group, and 3-butynylphenyl group.

Particularly preferable examples of $R^2$ and $R^3$ include a substituted or unsubstituted alkyl group. More preferable examples of $R^1$ include a substituted or unsubstituted aryl group. The reason for this is not evident, but is considered that these substituents particularly strengthen the interaction between electrons excited upon light absorption and the initiator compound, which improves the efficiency of the initiator compound to generate a radical, acid, or base.

In the next place, A in the formula (12) is further described. A represents an optionally substituted aromatic ring or heterocycle, and specific examples of the optionally substituted aromatic ring or heterocycle include the same examples as those listed in the above-described description of $R^1$, $R^2$, or $R^3$ in the formula (12).

Among them, preferable examples of A include an aryl group having an alkoxy group, a thioalkyl group, or an amino group, and particularly preferable examples of A include an aryl group having an amino group.

In the next place, Y in the formula (12) is further described. Y represents a group of nonmetal atoms necessary for forming a heterocycle together with the above-described A and the adjacent carbon atom. Examples of the heterocycle include a 5-, 6-, or 7-membered nitrogen-containing or sulfur-containing heterocycle which may have a condensed ring. Among them, a 5- or 6-membered heterocycle is preferable.

Preferable examples of the nitrogen-containing heterocycle include those known as a component of basic nuclei in melocyanine dyes described in L. G. Brooker et al., J. Am, Chem. Soc., vol. 73 (1951), pp. 5326-5358 and reference documents cited therein. Specific examples thereof include, thiazoles (e.g. thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole, and 4,5-di(2-furyl)thiazole), benzothiazoles (e.g. benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylene benzothiazole, 5-hydroxybenzothiazole, 6-hydroxybenzothiazole, 6-dimethylaminobenzothiazole, and 5-ethoxycarbonylbenzothiazole), naphthothiazoles (e.g. naphtho[1,2]thiazole, naphtho[2,1]thiazole, 5-methoxynaphtho [2,1]thiazole, 5-ethoxynaphtho[2,1]thiazole, 8-methoxynaphtho[1,2]thiazole, and 7-methoxynaphtho[1,2]thiazole), thianaphtheno-7',6',4,5-thiazoles (e.g. 4'-methoxythianaphtheno-7',6',4,5-thiazole), oxazoles (e.g. 4-methyloxazole, 5-methyloxazole, 4-phenyloxazole, 4,5-diphenyloxazole, 4-ethyloxazole, 4,5-dimethyloxazole, and 5-phenyloxazole), benzoxazoles (e.g. benzoxazole, 5-chlorobenzoxazole, 5-methyl benzoxazole, 5-phenylbenzooxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, and 6-hydroxybenzoxazole), naphthooxazoles (e.g. naphtho[1,2]oxazole and naphtho[2,1]oxazole), selenazoles(e.g. 4-methylselenazole and 4-phenylselenazole), benzoselenazoles (e.g. benzoselenazole, 5-chlorobenzoselenazole, 5-methoxybenzoselenazole, 5-hydroxybenzoselenazole, and tetrahydrobenzoselenazole), naphthoselenazoles (e.g. naphtho[1,2]selenazole, and naphtho[2,1]selenazole), thiazolines (e.g. thiazoline, 4-methylthiazoline, 4,5-dimethylthiazoline, 4-phenylthiazoline, 4,5-di(2-furyl)thiazoline, 4,5-diphenylthiazoline, and 4,5-di(p-methoxyphenyl) thiazoline), 2-quinolines (e.g. quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, and 8-hydroxyquinoline), 4-quinolines (e.g. quinoline, 6-methoxyquinoline, 7-methylquinoline, and 8-methylquinoline), 1-isoquinolines (e.g. isoquinoline and 3,4-dihydroisoquinoline), 3-isoquinolines (e.g. isoquinoline), benzimidazoles (e.g. 1,3-dimethylbenzimidazole, 1,3-diethylbenzimidazole, and 1-ethyl-3-phenylbenzimidazole), 3,3-dialkylindolenines (e.g. 3,3-dimethylindolenine, 3,3,5-trimethylindolenine, and 3,3,7-trimethylindolenine), 2-pyridines (e.g. pyridine and 5-methyl pyridine), and 4-pyridine (e.g. pyridine). These ring substituents may be combined with each other to form a ring.

Examples of the sulfur-containing heterocycle include dithiol partial structures in dyes described in JP-A No. 3-296759.

Specific examples thereof include benzodithiols (e.g. benzodithiol, 5-t-butylbenzodithiol, and 5-methylbenzodithiol), naphthodithiols (e.g. naphtho[1,2]dithiol and naphtho[2,1]dithiol), dithiols (e.g. 4,5-dimethyldithiols, 4-phenyldithiols, 4-methoxycarbonyldithiols, 4,5-dimethoxycarbonyldithiols, 4,5-diethoxycarbonyldithiols, 4,5-ditrifluoromethyldithiol, 4,5-dicyano dithiol, 4-methoxycarbonylmethyldithiol, and 4-carboxymethyldithiol).

In the formula (12), among the examples of nitrogen-containing or sulfur-containing heterocycles formed by Y together with the above-described A and adjacent carbon atom, the dye having a structure represented by the partial structural formula of the following formula (13) is particularly preferable because it provides a photosensitive composition having high sensitizing capacity and very excellent storage stability.

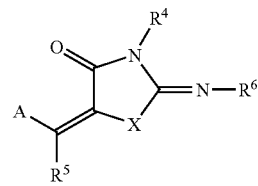

Formula (13)

In the formula (13), A represents an optionally substituted aromatic ring or heterocycle, and X represents an oxygen atom, a sulfur atom, or —N($R^1$)—. $R^1$, $R^4$, $R^5$, and $R^6$ each independently represents a hydrogen atom or a monovalent group of nonmetal atoms, and A, $R^1$, $R^4$, $R^5$, and $R^6$ may be combined with each other to form an aliphatic or aromatic ring.

In the formula (13), A and $R^1$ are each equivalent to those in the formula (12), $R^4$ is equivalent to $R^2$ in the formula (12), $R^5$ is equivalent to $R^3$ in the formula (12), and $R^6$ is equivalent to $R^1$ in the formula (12).

The compound represented by the formula (12) is further preferably a compound represented by the following formula (14).

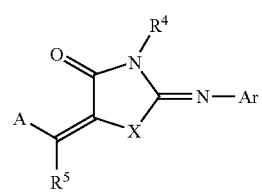

Formula (14)

In the formula (14), A represents an optionally substituted aromatic ring or heterocycle, and X represents an oxygen atom, a sulfur atom, or —N($R^1$)—. $R^1$, $R^4$, and $R^5$ are each independently a hydrogen atom or a monovalent group of nonmetal atoms, and A, $R^1$, $R^4$, and $R^5$ may be combined with each other to form an aliphatic or aromatic ring. Ar represents a substituted aromatic ring or heterocycle. The sum total of the Hammett's values of the substituents on the Ar skeleton must be greater than 0. The "sum total of Hammett's values is larger than 0" as used herein may be that one substituent is present and the Hammett's value of the substituent is larger than 0 or that a plurality of substituents are present and the sum total of the Hammett's values of these substituents is larger than 0.

In the formula (14), A and $R^1$ are equivalent to those in the formula (12), $R^4$ is equivalent to $R^2$ in the formula (12), and $R^5$ is equivalent to $R^3$ in the formula (12). Ar represents a substituted aromatic ring or heterocycle, and specific examples thereof include the same specific examples of the substituted aromatic ring or heterocycle as those listed for A in the description of the formula (12). The total sum of the Hammett's values of the substituents to be introduced into Ar in the formula (14) must be 0 or more. Examples of the substituents include a trifluoromethyl group, a carbonyl group, an ester group, a halogen atom, a nitro group, a cyano group, a sulfoxide group, an amide group, and a carboxyl group. The Hammett's value of these substituents are as follows: trifluoromethyl group (—CF₃, m: 0.43, p: 0.54); carbonyl group (e.g. —COH, m: 0.36, p: 0.43); ester group (—COOCH₃, m: 0.37, p: 0. 45); halogen atom (e.g. Cl, m: 0.37, p: 0.23); cyano group (—CN, m: 0.56, p: 0.66); sulfoxide group (e.g. —SOCH₃, m: 0.52, p: 0.45); amide group (e.g. —NHCOCH₃, m: 0.21, p: 0.00); and carboxyl group (—COOH, m: 0.37, p: 0.45). The site of the substituent in the aryl skeleton and the Hammett's value of the substituent are listed inside the parentheses, and (m: 0.50) means that the Hammett's value of the substituent upon introduction into the meta position is 0.50. Preferable examples of Ar include a substituted phenyl group, and preferable examples of the substituent on the Ar skeleton include an ester group and a cyano group. The substituent is particularly preferably located in the ortho position on the Ar skeleton.

Preferable specific examples of the sensitizing dye represented by the formula (12) (exemplary compounds D1 to D57) are shown below, however the invention is not limited to them. Among them, exemplary compounds D2, D6, D10, D18, D21, D28, D31, D33, D35, D38, D41, and D45 to D57 correspond to the compound represented by the formula (13).

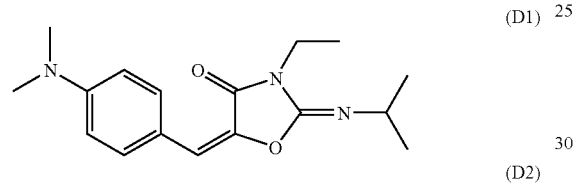
(D1)

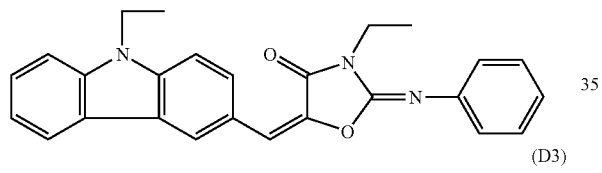
(D2)

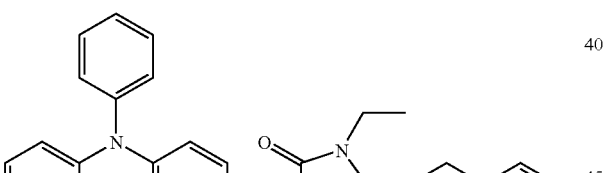
(D3)

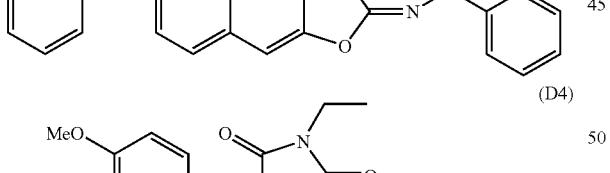
(D4)

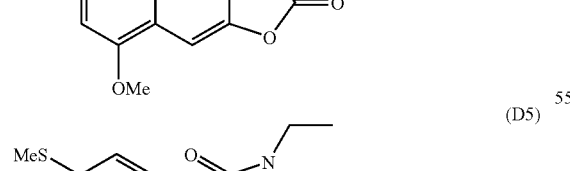
(D5)

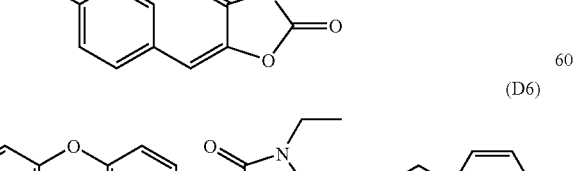
(D6)

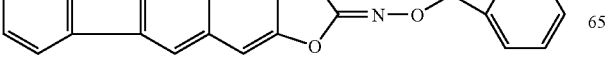

-continued

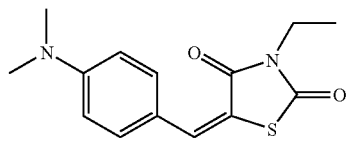
(D7)

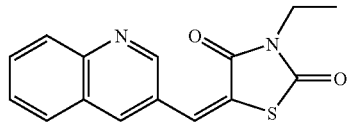
(D8)

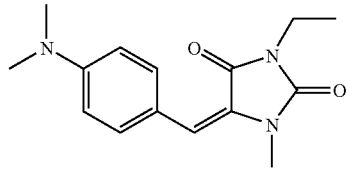
(D9)

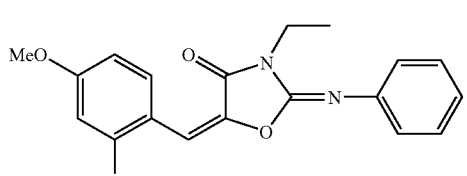
(D10)

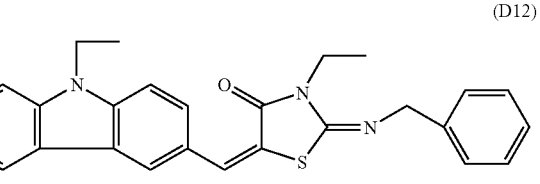
(D11)

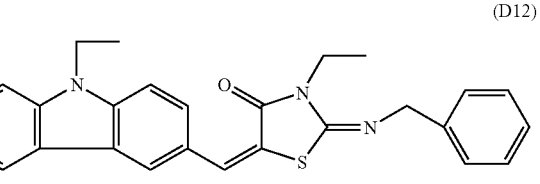
(D12)

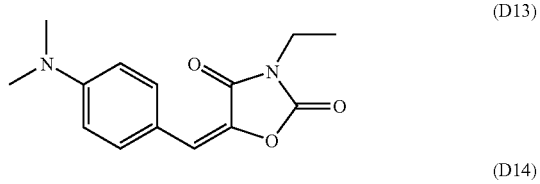
(D13)

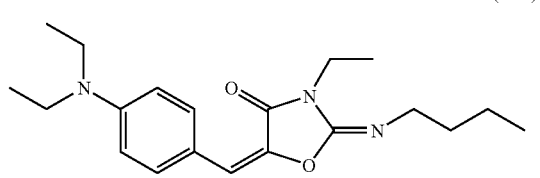
(D14)

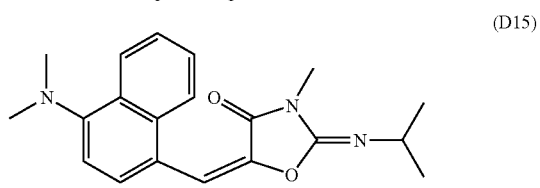
(D15)

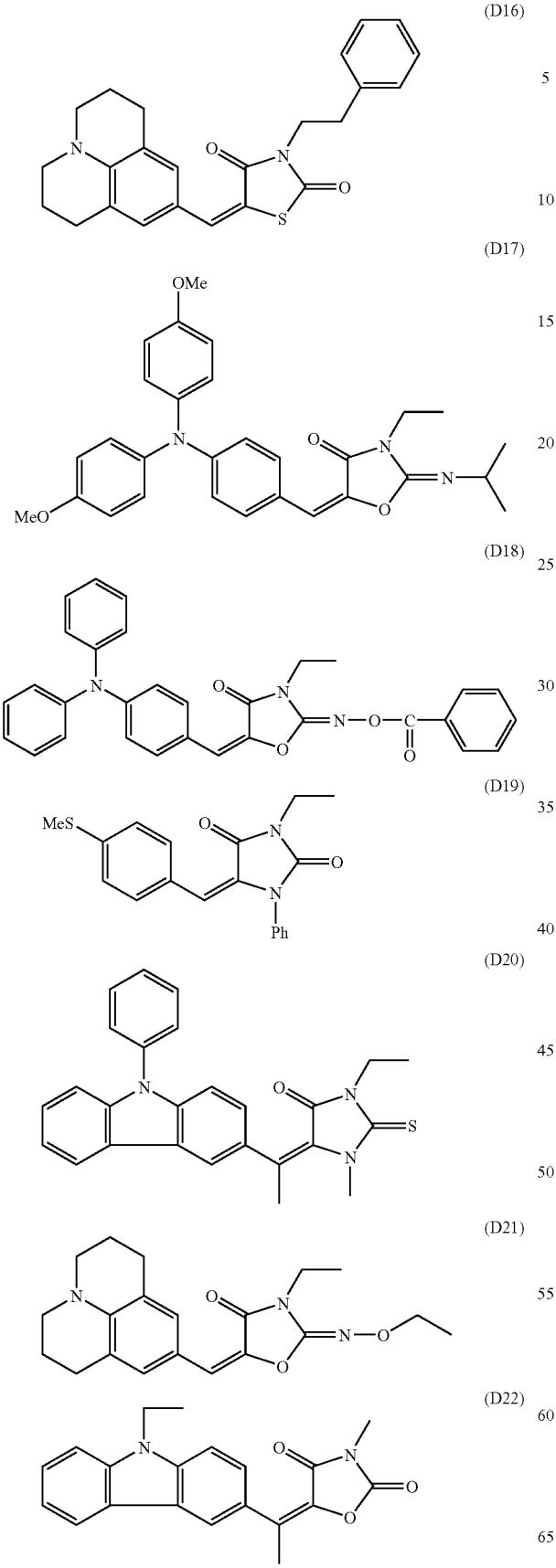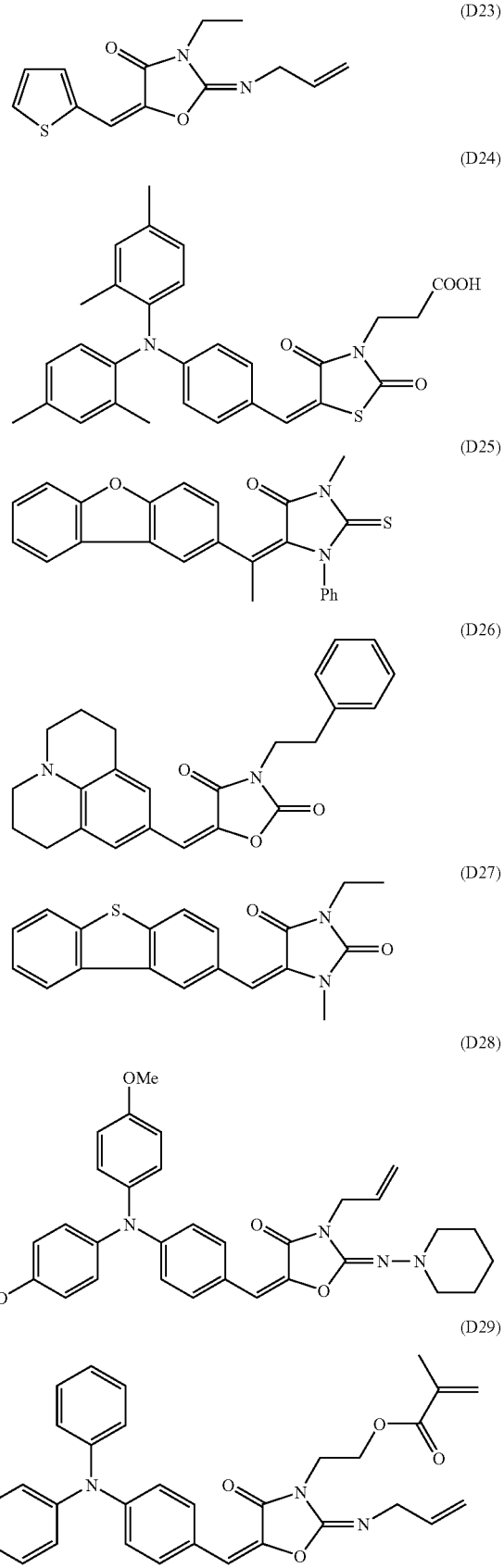

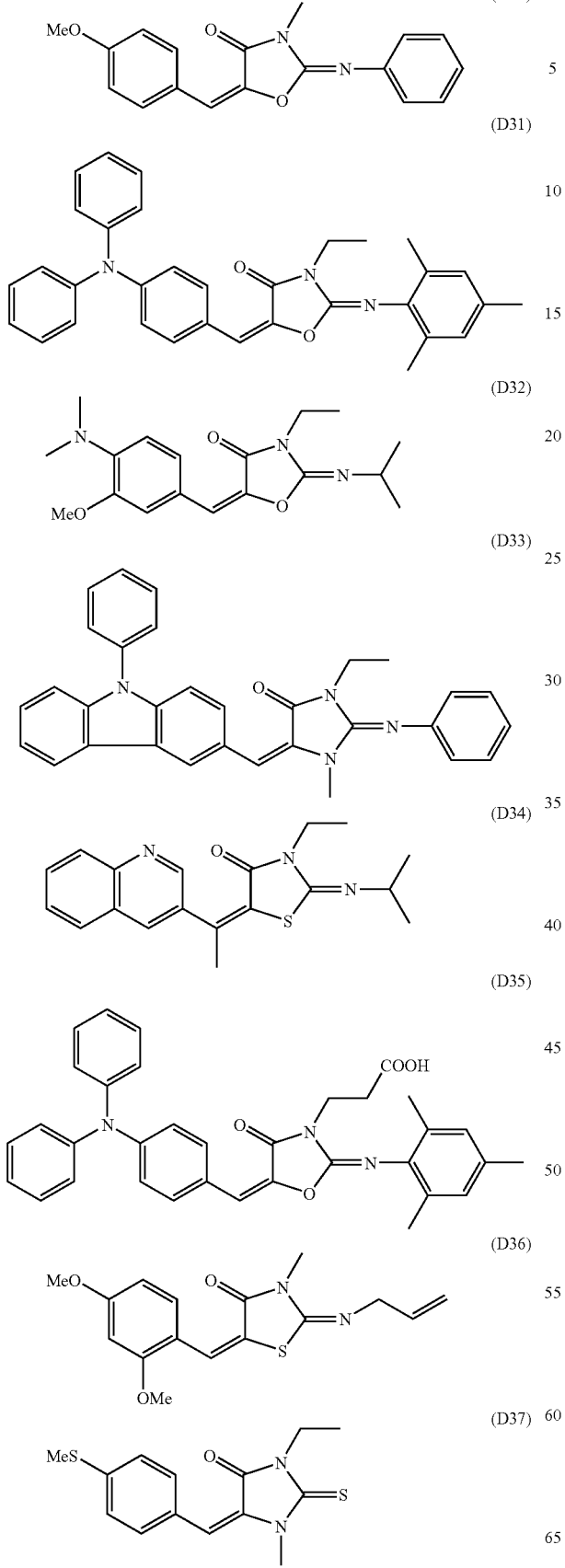
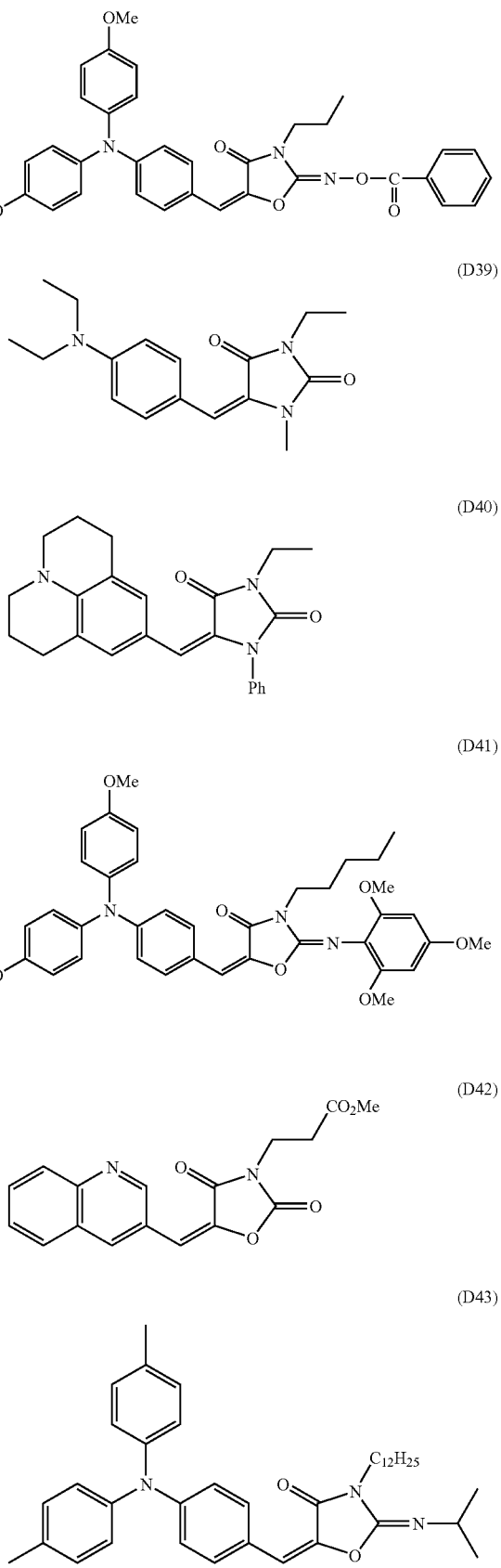

(D44)
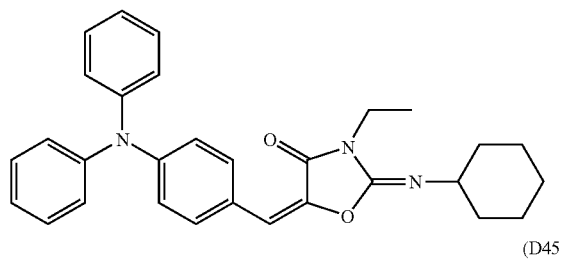
(D45)
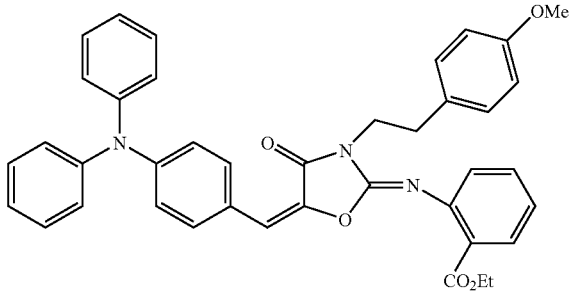
(D46)
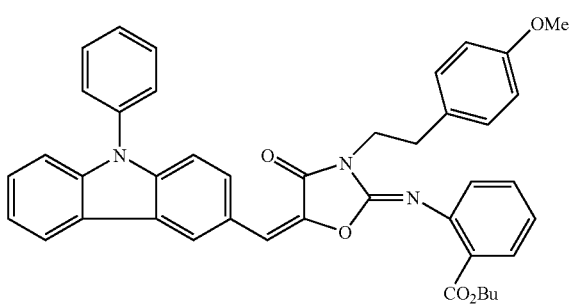
(D47)
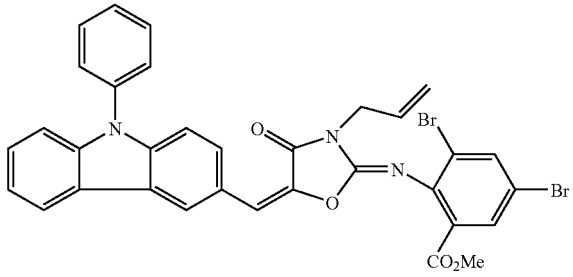
(D48)
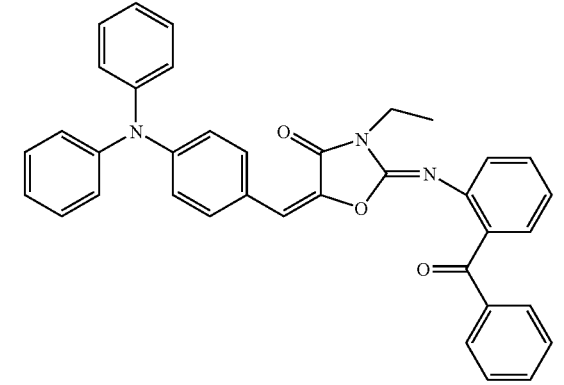
(D49)
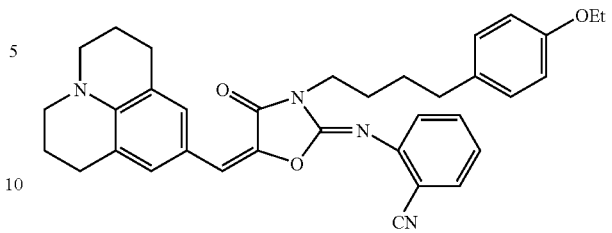
(D50)
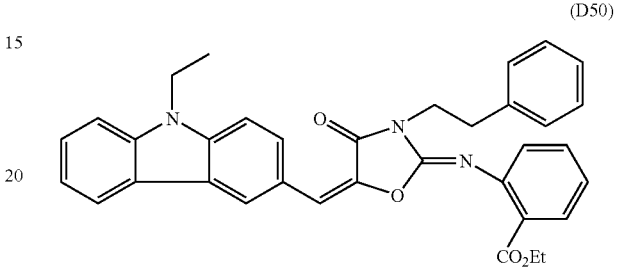
(D51)
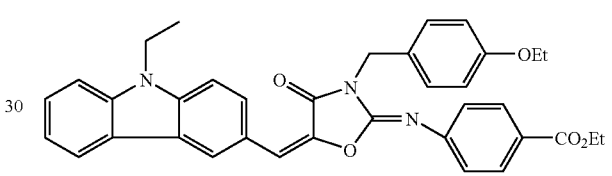
(D52)
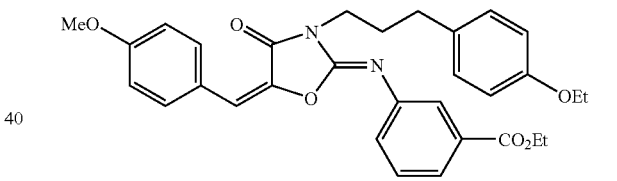
(D53)
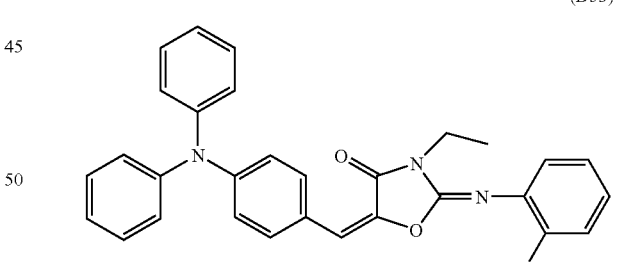
(D54)
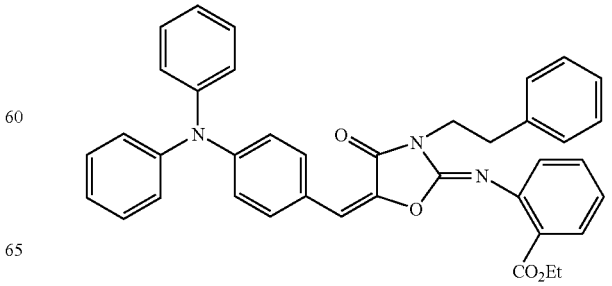

(D55)

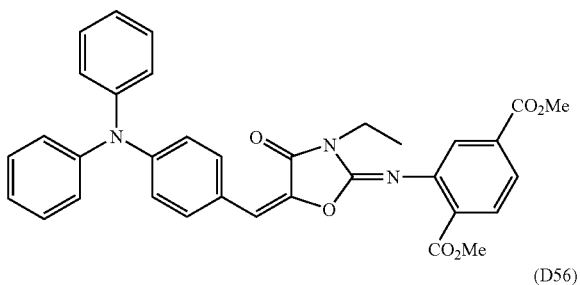

(D56)

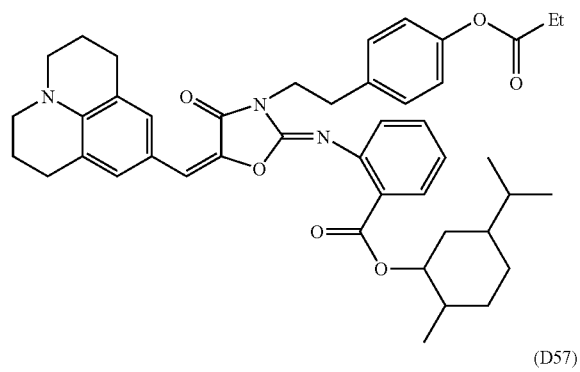

(D57)

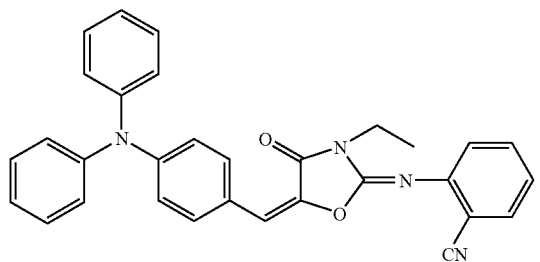

The compound represented by the formula (12) is usually prepared by condensation reaction between an acidic nucleus having an active methylene group and a substituted or non-substituted aromatic ring or heterocycle, which can be synthesized with respect to JP-B No. 59-28329. Examples of the reaction method include condensation reaction between an acidic nuclear compound and a basic nuclear material having an aldehyde group or a carbonyl group on the heterocycle, as shown in the following reaction formula (1). The condensation reaction is conducted, as necessary, in the presence of a base. The base may be freely selected from generally used bases such as amines, pyridines (e.g. trialkylamine, dimethylamino pyridine, and diazabicycloundecene DBU), metal amides (e.g. lithium diisopropylamide), metal alkoxides (e.g. sodium methoxide and potassium-t-butoxide), and metal hydrides (e.g. sodium hydride and potassium hydride).

(1)

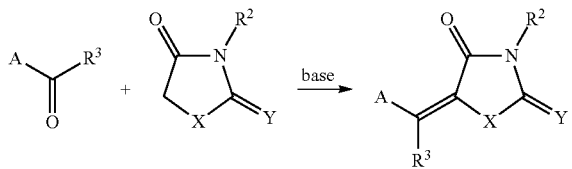

Examples of the other preferable synthesis method include a method according to the following reaction formula (2). More specifically, an acidic nuclear compound in which Y is a sulfur atom is used as the starting material in the reaction formula (1), and condensed with a basic nuclear material having an aldehyde group or a carbonyl group on the heterocycle to form a dye precursor in the same manner as the reaction formula (1), thereafter the dye precursor is further reacted with a metal salt, which chemically interacts with a sulfur atom to form a metal sulfide, and water or a primary amine compound (R—$NH_2$, wherein R represents a monovalent group of nonmetal atoms).

Among them, the reaction represented by the reaction formula (2) provides a high yield in each reaction, and particularly preferable from the viewpoint of synthesis efficiency. In particular, the reaction represented by the reaction formula (2) is useful for the synthesis of the compound represented by the formula (13).

(2)

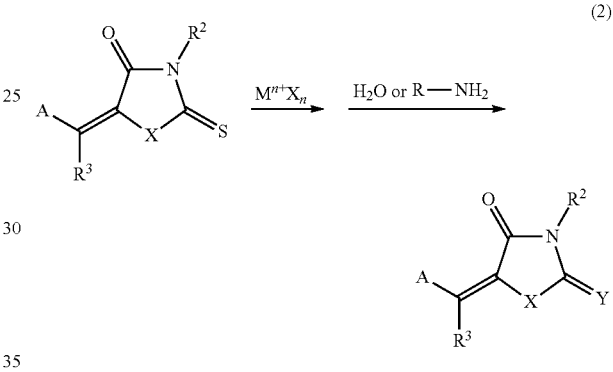

In the reaction formula (2), $M^{n+}+X^n$ represents a metal salt which chemically interacts with a sulfur atom in the thiocarbonyl group to form a metal sulfide. Specific examples of the compound include AgBr, AgI, AgF, AgO, AgCl, $Ag_2O$, $Ag(NO_3)$, $AgSO_4$, $AgNO_2$, $Ag_2CrO_4$, $Ag_3PO_4$, $Hg_2(NO_3)_2$, $HgBr_2$, $Hg_2Br_2$, HgO, $HgI_2$, $Hg(NO_2)_2$, $HgBr_2$, $HgSO4$, $Hg_2I_2$, $Hg_2SO_4$, $Hg(CH_3CO_2)_2$, AuBr, $AuBr_3$, AuI, $AuI_3$, $AuF_3$, $Au_2O_3$, AuCl, $AuCl_3$, CuCl, CuI, $CuI_2$, $CuF_2$, CuO, $CuO_2$, $Cu(NO_3)_2$, $CuSO_4$, and $Cu_3(PO_4)_2$, in which M is Al, Au, Ag, Hg, Cu, Zn, Fe, Cd, Cr, Co, Ce, Bi, Mn, Mo, Ga, Ni, Pd, Pt, Ru, Rh, Sc, Sb, Sr, Mg, Ti, or the like, and X is F, Cl, Br, I, $NO_3$, $SO_4$, $NO_2$, $PO_4$, $CH_3CO_2$, or the like. Among them, a silver salt is a most preferable metal salt because it readily interacts with a sulfur atom.

The sensitizing dye represented by the formula (12) used in the invention can be subjected to various chemical modification to improve the property of the image recording layer. For example, the sensitizing dye may be combined with an addition polymerizable compound structure (e.g. an acryloyl group or a methacryloyl group) through a covalent bond, an ionic bond, a hydrogen bond, or the like to increase the strength of the light-exposed film and suppress the unnecessary deposition of dyes from the light-exposed film.

Further, photosensitivity can be remarkably enhanced under particularly low concentration of an optical initiation system, by bonding the sensitizing dye with the above-described radical generating partial structure in the initiator compound (e.g. reduction decomposable sites such as alkyl halide, onium, peroxide, and biimidazole, and oxidation disintegrating sites such as borate, amine, trimethylsilylmethyl, carboxymethyl, carbonyl, and imine).

Further, in the case where the image recording material of the invention is used as a planographic printing plate precursor having a negative-working photosensitive layer, which is a preferable aspect of the invention, it is effective to introduce a hydrophilic site (acid groups or polar groups such as a carboxyl group and esters thereof, a sulfonic group and esters thereof, and an ethylene oxide group). Particularly, an ester type hydrophilic group exhibits excellent compatibility in the photosensitive layer due to its relatively hydrophobic structure, and generates an acid group upon hydrolysis to increase its hydrophilicity in a developer.

Additionally, for example, a substituent may be introduced as appropriate to improve compatibility in the photosensitive layer and to suppress crystal deposition. For example, in a certain kind of photosensitive system, an unsaturated bond such as an aryl group or an allyl group may be considerably effective at improving the compatibility. Besides, crystal deposition is remarkably suppressed by introducing steric hindrance between the $\pi$ planes of the dye through introduction of a branched alkyl structure or other method. Further, adhesiveness of a metal, metal oxide and the like to an inorganic substance is improved by introducing a phosphonate group, an epoxy group, a trialkoxysilyl group, or the like. Alternatively, polymerization of the sensitizing dye or other methods may be used according to the intended use.

The sensitizing dye used the invention preferably includes at least one sensitizing dye represented by the formula (12). Within the range represented by the formula (12), details of the use-what structure is used (e.g. the above-described modification), whether they are used alone or in combination of two or more of them, and the addition amount—can be determined as appropriate in accordance with the performance and design of the final photosensitive material. For example, the combination of two or more kinds of sensitizing dyes improves the compatibility with the image recording layer.

The selection of the sensitizing dye largely depends on its photosensitivity and molar extinction coefficient at the luminescence wavelength of the light source to be used. The use of a dye having a large molar extinction coefficient can relatively decrease the addition amount of the dye, which is economical and beneficial to the physical property of the image recording layer.

In the invention, other general-purpose sensitizing dyes except for the sensitizing dye represented by the formula (12) may be used within the range which does not impair the effect of the invention.

Because the photosensitivity and resolution of the photosensitive layer and the film properties of the recording layer are greatly influenced by the absorbance at the light source wavelength, the amount of a sensitizing dye is appropriately determined from the viewpoint of these factors.

For example, in a region where the absorbance is as low as 0.1 or less, the sensitivity lowers and the resolution is reduced due to the influence of halation. For example, for curing a film as thick as 5 µm or more, however, the degree of curing may be increased rather at such a low absorbance. In a region where the absorbance is as high as 3 or more, most of the light is absorbed at the surface of the photosensitive layer and, as a result, curing in the internal portion is inhibited. Therefore, when the curable composition of the invention is used as a planographic printing plate precursor, the film strength and the adhesiveness to the support may become insufficient.

For example, in use of the curable composition of the invention for a planographic printing plate precursor having a relatively thin photosensitive layer, the amount of the sensitizing dye added is preferably determined so that the absorbance of the photosensitive layer may have an absorbance within a range of from 0.1 to 1.5, more preferably within a range of from 0.25 to 1. Because the absorbance is determined depending on the amount of the sensitizing dye added and the thickness of the photosensitive layer, a predetermined absorbance is obtained by controlling both the conditions. The absorbance of the photosensitive layer can be measured by an ordinary method. Examples of measuring methods include a method including forming a photosensitive layer on a transparent or white support such that the layer may have a predetermined thickness corresponding to an adequate dry coating weight as a planographic printing plate, and measuring the absorbance with a transmission-type optical densitometer, and a method including forming a recording layer on a reflective support such as aluminum, and measuring the reflection density.

In use of the photosensitive layer in the invention as a recording layer of a planographic printing plate precursor, the amount of the sensitizing dye added is typically within a range of from 0.05 to 30 parts by mass, preferably within a range of from 0.1 to 20 parts by mass, and more preferably within a range of from 0.2 to 10 parts by mass based on 100 parts by mass of the total solid components forming the photosensitive layer.

(Infrared Ray Absorbing Agent)

In the invention, when light exposure is performed using a laser light source emitting infrared rays having wavelengths of from 760 to 1,200 nm, an infrared ray absorbing agent having the absorption maximum in the wavelength range is usually used as a sensitizing dye. The infrared ray absorbing agent is capable of absorbing infrared rays and converting them into heat. A radical generator (polymerization initiator) is heat-decomposed by the heat generated upon light exposure, and generates radicals. The infrared ray absorbing agent used in the invention is a dye or pigment having an absorption maximum at wavelengths of from 750 nm to 850 nm.

The dye may be a commercially available dye or a known dye as described in reference documents such as "Senryo Binran (Dye Handbook) (edited by The Society of Synthetic Organic Chemistry, Japan 1970). Specific examples thereof include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salt, and metal thiolate complex dyes.

Preferable examples of dyes include cyanine dyes described in JP-A No. 58-125246, JP-A No. 59-84356, JP-A No. 59-202829, and JP-A No. 60-78787, methine dyes described in JP-A No. 58-173696, JP-A No. 58-181690, and JP-A No. 58-194595, naphthoquinone dyes described in JP-A No. 58-112793, JP-A No. 58-224793, JP-A No. 59-48187, JP-A No. 59-73996, JP-A No. 60-52940, and JP-A No. 60-63744, squarylium dyes described in JP-A No. 58-112792, and cyanine dyes described in U.K. Patent No. 434,875.

Near-infrared absorbing sensitizers described in U.S. Pat. No. 5,156,938 are also preferably used. A substituted arylbenzo(thio)pyrylium salt described in U.S. Pat. No. 3,881,924, a trimethinethiapyrylium salt described in JP-A No. 57-142645 (U.S. Pat. No. 4,327,169), pyrylium type compounds described in JP-A Nos. 58-181051, 58-220143, 59-41363, 59-84248, 59-84249, 59-146063 and 59-146061, cyanine dyes described in JP-A No. 59-216146, pentamethinethiopyrylium salts and the like described in U.S. Pat. No. 4,283,475 and pyrylium compounds disclosed in JP-B Nos. 5-13514 and 5-19702 are also preferably used.

Other preferable examples of the infrared absorbing dye may include near-infrared absorbing dyes described as formulae (I) and (II) in U.S. Pat. No. 4,756,993.

Other preferable examples of the infrared radiation absorption dye in the invention include specific indolenine cyanine dyes described in Japanese Patent Application No. 2001-6326, and Japanese Patent Application No. 2001-237840, which are shown below.

groups, alkynyl groups, cyano groups, carboxy groups, nitro groups, amide groups, ester groups, alkoxy groups, amino groups and heterocyclic groups, and these substituents may themselves be substituted by such a substituent as those described above. $X^2$ represents an oxygen atom, a sulfur atom or —N($R^x$)— wherein $R^x$ represents a hydrogen atom or a $C_1$ to $C_{10}$ hydrocarbon group. $L^1$ represents a $C_1$ to $C_{12}$ hydrocarbon group, an aromatic ring having a heteroatom, or a $C_1$

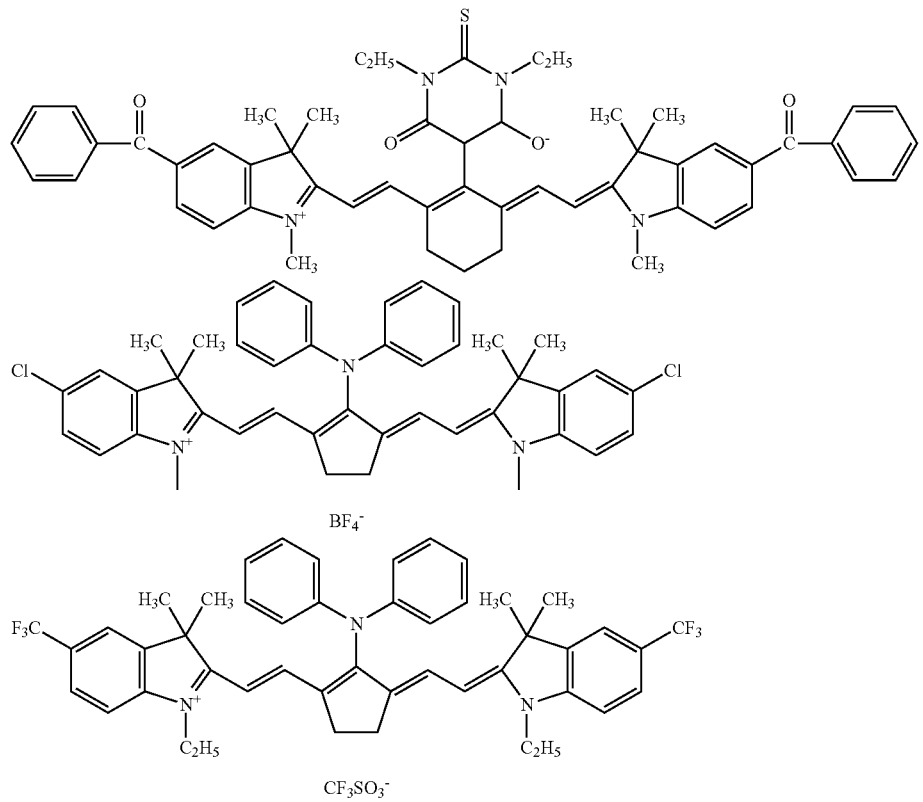

Particularly preferable among these dyes are cyanine dyes, phthalocyanine dyes, oxonol dyes, squarylium colorants, pyrylium salts, thiopyrylium dyes, and nickel thiolate complexes. From the viewpoint of sensitivity, preferable among these dyes are those represented by formulae (a) to (e) below, and cyanine dyes represented by formula (a) below are most preferable because they give high polymerization activity and are excellent in stability and economical efficiency when used in the recording layer in the invention.

to $C_{12}$ hydrocarbon group containing a heteroatom. The term "heteroatom" used herein refers to an atom selected from N, S, O, a halogen atom or Se.

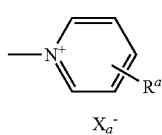

Formula (a)

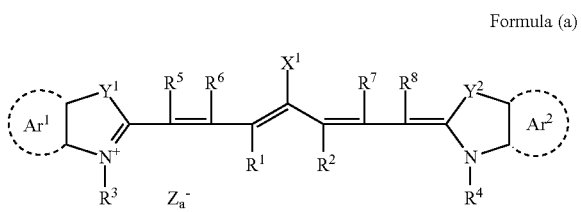

In the formula (a), $X^1$ represents a hydrogen atom, halogen atom, —N$Ar^x{}_2$, $X^2$-$L^1$ or the group shown below. $Ar^x$ represents a $C_6$ to $C_{14}$ aromatic hydrocarbon group which may have one or more substituents selected from the group consisting of halogen atoms, alkyl groups, allyl groups, alkenyl In the above formula, $X_a{}^-$ has the same definition as that of $Z_a{}^-$ defined later, and $R^a$ represents a hydrogen atom or a substituent selected from an alkyl group, an aryl group, a substituted or unsubstituted amino group, or a halogen atom.

$R^1$ and $R^2$ each independently represent a $C_{1-12}$ hydrocarbon group. For the storage stability of the recording layer coating liquid, each of $R^1$ and $R^2$ is preferably a hydrocarbon group containing two or more carbon atoms, and more preferably $R^1$ and $R^2$ are bound to each other to form a 5- or 6-membered ring.

$Ar^1$ and $Ar^2$ may be the same or different, and each independently represent an aromatic hydrocarbon group which may have a substituent. The aromatic hydrocarbon group is preferably a benzene ring or a naphthalene ring. The substituent is preferably a hydrocarbon group containing 12 or less carbon atoms, a halogen atom or an alkoxy group containing 12 or less carbon atoms. $Y^1$ and $Y^2$ may be the same or different, and each independently represent a sulfur atom or a dialkyl methylene group containing 12 or less carbon atoms. $R^3$ and $R^4$ may be the same or different, and each independently represent a hydrocarbon group containing 20 or less carbon atoms which may have a substituent. The substituent is preferably an alkoxy group containing 12 or less carbon atoms, a carboxyl group or a sulfo group. $R^5$, $R^6$, $R^7$ and $R^8$ may be the same or different, and each independently represent a hydrogen atom or a hydrocarbon group containing 12 or less carbon atoms. Each of $R^5$, $R^6$, $R^7$ and $R^8$ is preferably a hydrogen atom because the starting material is easily available. $Z_a^-$ represents a counter anion. However, when the cyanine dye represented by the formula (A) has an anionic substituent in its structure and does not necessitate neutralization of the charge, $Z_a^-$ is not necessary. Because of the storage stability of the recording layer coating liquid, $Z_a^-$ is preferably a halogen ion, a perchlorate ion, a tetrafluoroborate ion, a hexafluorophosphate ion or a sulfonate ion, particularly preferably a perchlorate ion, a hexafluorophosphate ion or an aryl sulfonate ion.

Specific examples of the cyanine dyes represented by the formula (A), which can be used preferably in the invention, include not only those illustrated below, but also those described in paragraph numbers (0017) to (0019) in JP-A No. 2001-133969, paragraph numbers (0012) to (0038) in JP-A No. 2002-40638, and paragraph numbers (0012) to (0023) in JP-A No. 2002-23360.

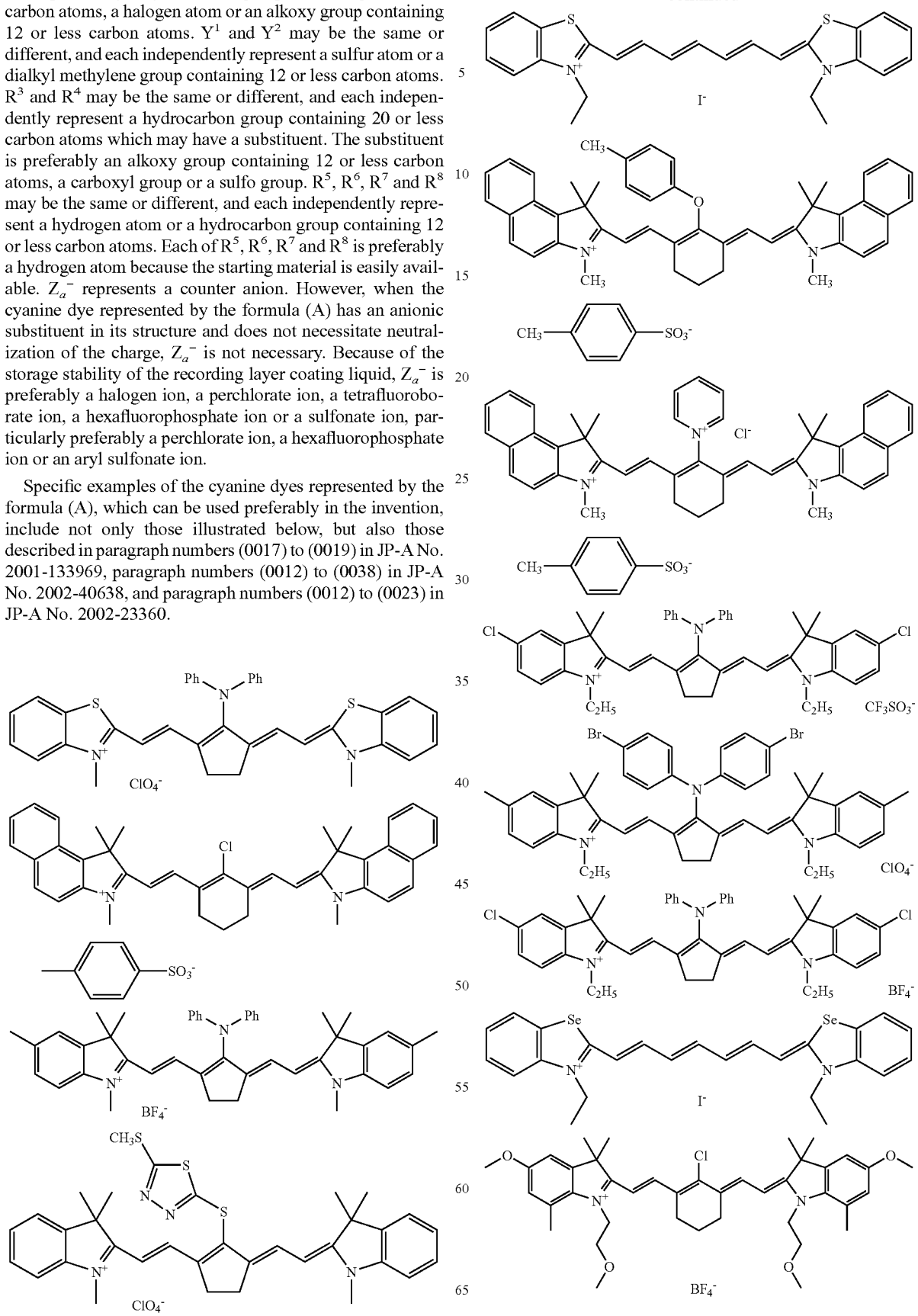

-continued

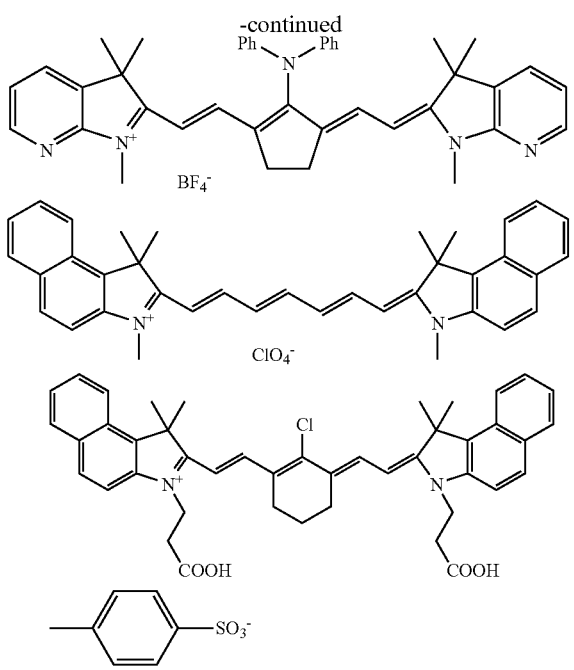

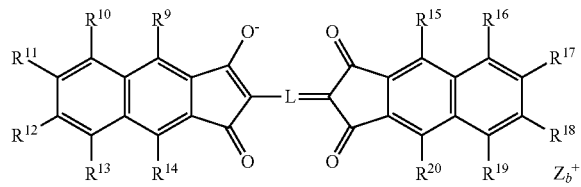

Formula (b)

In the formula (b), L represents a methine chain containing 7 or more conjugated carbon atoms, and the methine chain may have a substituent, and the substituents may be bound to each other to form a ring structure. $Z_b^+$ represents a counter cation. The counter cation is preferably ammonium, iodonium, sulfonium, phosphonium, pyridinium or an alkali metal cation ($Ni^+$, $K^+$, $Li^+$). $R^9$ to $R^{14}$ and $R^{15}$ to $R^{20}$ each independently represent a hydrogen atom or a substituent selected from a halogen atom, a cyano group, an alkyl group, an aryl group, an alkenyl group, an alkynyl group, a carbonyl group, a thio group, a sulfonyl group, a sulfinyl group, an oxy group or an amino group, or a substituent composed of a combination of two or three such substituents which may be bound to each other to form a ring structure. Among the compounds of the formula (B), those having a methine chain containing 7 conjugated carbon atoms as L, and those in which each of $R^9$ to $R^{14}$ and $R^{15}$ to $R^{20}$ represents a hydrogen atom, are preferable from the viewpoint of easy availability and effects.

Examples of the dyes represented by the formula (b), which can be used preferably in the invention, include those illustrated below:

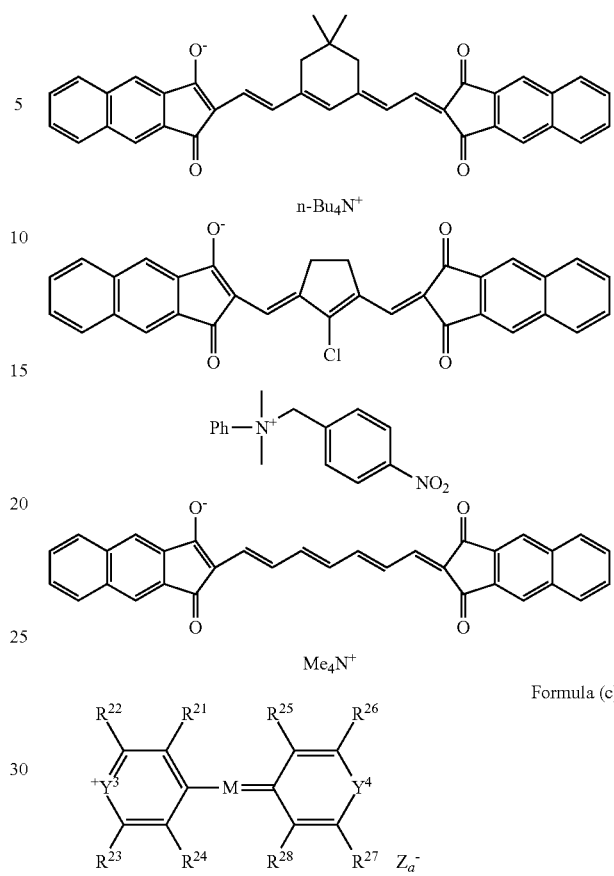

Formula (c)

In the formula (c), $Y^3$ and $Y^4$ each independently represent an oxygen atom, a sulfur atom, a selenium atom or a tellurium atom; M represents a methine chain containing 5 or more conjugated carbon atoms; $R^{21}$ to $R^{24}$ and $R^{25}$ to $R^{28}$ may be the same as or different from one another, and each independently represent a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group; and $Z_a^-$ represents a counter anion and has the same definition as that of $Z_a^-$ in the formula (A) above.

Examples of the dyes represented by the formula (c), which can be used preferably in the invention, include those illustrated below:

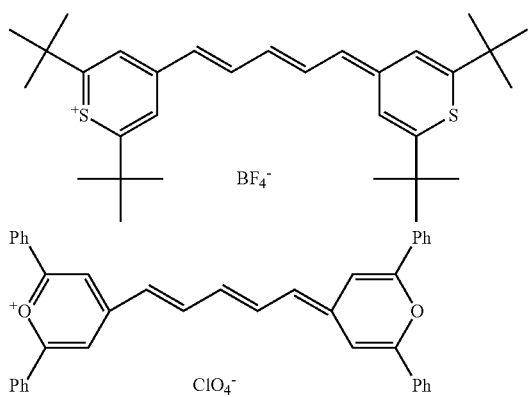

-continued

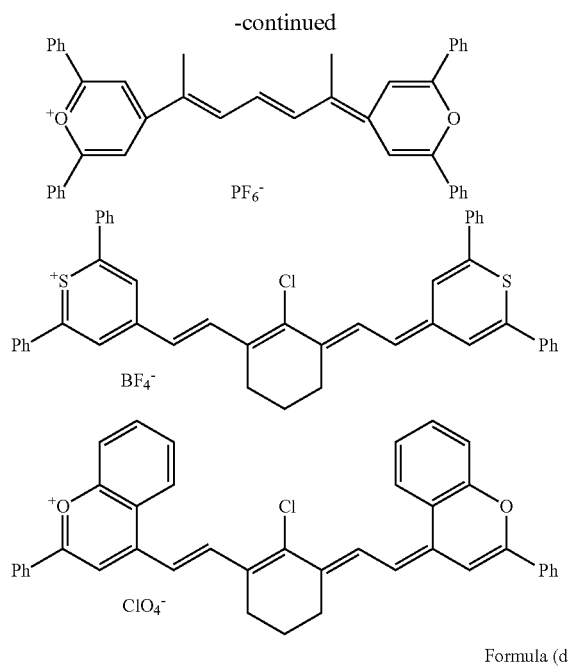

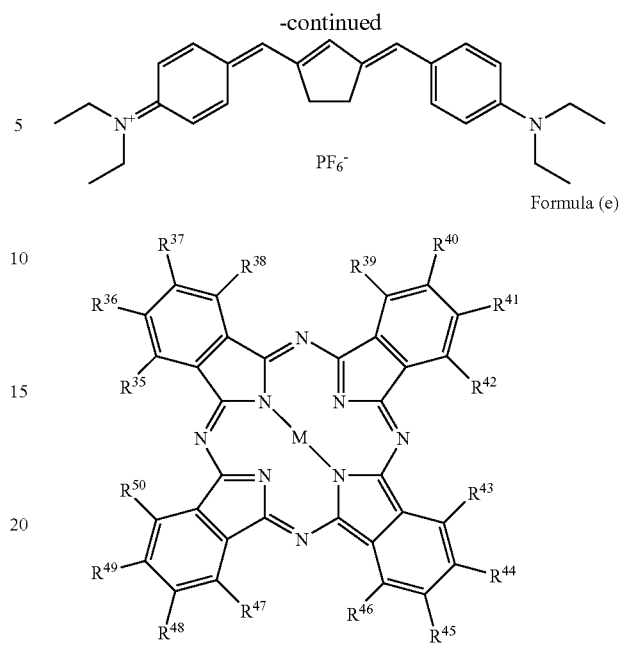

Formula (e)

In the formula (d), $R^{29}$ to $R^{31}$ each independently represent a hydrogen atom, an alkyl group or an aryl group; $R^{33}$ and $R^{34}$ each independently represent an alkyl group, a substituted oxy group or a halogen atom; n and m each independently represent an integer of 0 to 4; $R^{29}$ and $R^{30}$, or $R^{31}$ and $R^{32}$, may be bound to each other to form a ring; $R^{29}$ and/or $R^{30}$ may be bound to $R^{33}$ to form a ring; $R^{31}$ and/or $R^{32}$ may be bound to $R^{34}$ to form a ring; when plural $R^{33}$s are present, some of $R^{33}$s may be mutually bound to form a ring; when plural $R^{34}$s are present, some of $R^{34}$s may be mutually bound to form a ring; $X^2$ and $X^3$ each independently represent a hydrogen atom, an alkyl group or an aryl group, and at least one of $X^2$ and $X^3$ represents a hydrogen atom or an alkyl group; Q is an optionally substituted trimethine group or pentamethine group which may form a ring structure with a divalent organic group; and $Z_c^-$ represents a counter anion and has the same definition as that of $Z_a^-$ in the formula (a) above.

Examples of the dyes represented by the formula (d), which can be used preferably in the invention, include those illustrated below:

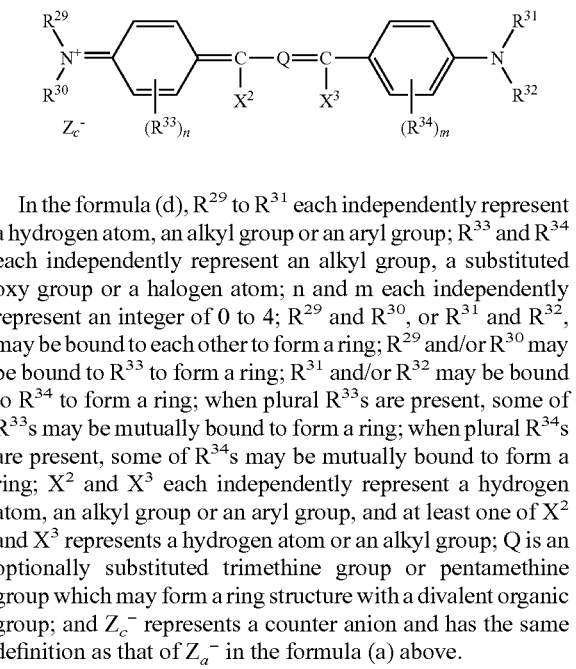

In the formula (e), $R^{35}$ to $R^{50}$ each independently represent a hydrogen atom, halogen atom, cyano group, alkyl group, aryl group, alkenyl group, alkynyl group, hydroxyl group, carbonyl group, thio group, sulfonyl group, sulfinyl group, oxy group, amino group, and onium salt structure, each of which may have a substituent; and M represents two hydrogen atoms, a metal atom, a halometal group or an oxymetal group, and examples of the metal atom contained therein include the groups IA, IIA, IIIB and IVB atoms in the periodic table, the transition metals in the first, second and third periods, and lanthanoid elements, among which copper, magnesium, iron, zinc, cobalt, aluminum, titanium and vanadium are preferable.

Examples of the dyes represented by the formula (e), which can be used preferably in the invention, include those illustrated below:

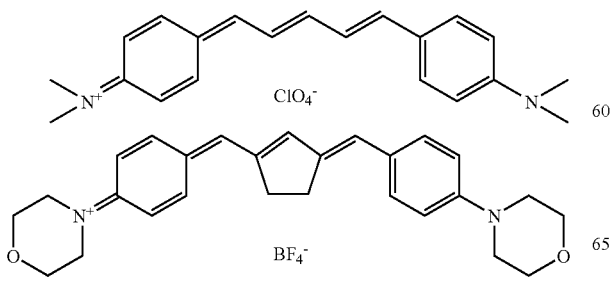

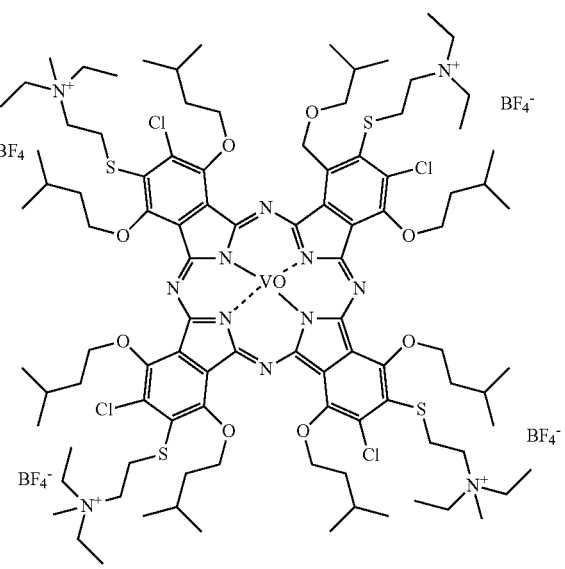

-continued

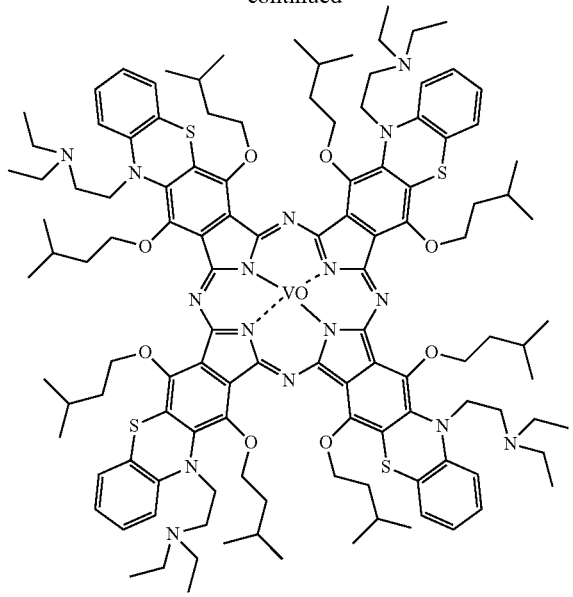

Examples of the pigment used in the invention include commercial pigments and those described in Color Index (C. I.) Handbook, "Saishin Ganryo Binran" (Newest Dye Handbook) (published in 1977 and compiled by Japanese Society of Pigment Technology), "Saishin Ganryho Oyo Gijyutsu" (Newest Pigment Applied Technology) (published in 1986 by CMC), and "Insatsu Inki Gijyutsu" (Printing Ink Technology) (published in 1984 by CMC).

As to the type of the pigment, examples of usable pigments include black pigments, yellow pigments, orange pigments, brown pigments, red pigments, violet pigments, blue pigments, green pigments, fluorescent pigments, metallic powder pigments, and other pigments such as polymer-binding colorants. Specific examples thereof include insoluble azo pigments, azo lake pigments, condensed azo pigments, chelate azo pigments, phthalocyanine pigments, anthraquinone pigments, perylene pigments, perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black. A preferable pigment among those described above is carbon black.

Such pigments may be used with or without being subjected to surface treatment. Examples of the method of surface treatment include a method of coating the surface with a resin or a wax, a method of allowing a surfactant to adhere to the surface, and a method of bonding a reactive substance (e.g., a silane coupling agent, an epoxy compound, a polyisocyanate etc.) onto the surface of the pigment. These methods of surface treatment are described in "Kinzoku Sekken No Seishitsu To Oyo" (Properties and Application of Metallic Soap) (Sachi Shobo), "Insatsu Inki Gijyutsu" (Printing Ink Technology) (published in 1984 by CMC Shuppan) and "Saishin Ganryho Oyo Gijyutsu" (Newest Pigment Applied Technology) (published in 1986 by CMC Shuppan).

The particle diameter of the pigment is preferably in a range of from 0.01 to 10 μm, more preferably from 0.05 to 1 ∞m, still more preferably fom 0.1 to 1 μm. A pigment particle diameter of less than 0.01 μm is not preferable in respect of the stability of a pigment dispersion in the image recording layer coating liquid, whereas a particle diameter of more than 10 μm is not preferable in respect of the uniformity of the image recording layer.

As the method of dispersing the pigments, any known dispersion techniques used in production of inks or toners can be used. Examples of the dispersing machine include a supersonic dispersing device, a sand mill, an attritor, a pearl mill, a super mill, a ball mill, an impeller, a disperser, a KD mill, a colloid mill, a dynatron, a triple roll mill, and a press kneader. Details thereof are described in "Saishin Ganryho Oyo Gijyutsu" (Newest Pigment Applied Technology) (published in 1986 by CMC Shuppan).

The components (C) in the invention may include only one substance or a combination of two or more substances.

The component (C) in the invention is preferably a cyanine dye.

From the viewpoint of sensitivity, the component (C) is more preferably a cyanine dye represented by the formula (a). Among dyes represented by the formula (a), cyanine dyes in which $X^1$ is a diarylamino group or $X^2$-$L^1$ is preferaeble, and those having a diaryl amino group are more preferable.

A cyanine dye having an electron-withdrawing group or a heavy atom-containing substituent at each of indolenine sites at both terminals is also preferable, and for example, the one described in Japanese Patent Application No. 2001-6323 is preferably used. A cyanine dye which has an electron-withdrawing group at each of indolenine sites at both terminals, and which has a diarylamino group as $X^1$ is most preferable.

In the case where the image recording material of the invention is used as a negative-working planographic printing plate precursor, the sensitizing dye (C) such as the above-described infrared ray absorbing agent, which is added to promote curing of the polymerizable compositions, may be added to the image recording layer, or an independently provided other layer, for example, a topcoat layer or an undercoat layer. In particular, when the image recording material of the invention is used as an image recording layer of a negative-working photosensitive planographic printing plate, the sensitizing dye (C) preferably has an optical density of from 0.1 to 3.0 in the image recording layer at the absorption maximum in a wavelength range of from 760 nm to 1200 nm from the viewpoint of sensitivity. The optical density is determined according to the addition amount of the infrared ray absorbing agent and the thickness of the image recording layer, hence the predetermined optical density is achieved by controlling these factors.

The optical density of the image recording layer can be measured by an ordinary method. Examples of the measurement method include a method of forming an image recording layer on a transparent or white support in an appropriately determined thickness such that the coating amount after drying is within the range necessary for a planographic printing plate, and measuring the absorbance with a transmission optical densitometer, and a method of forming a recording layer on a reflective support such as an aluminum support, and measuring the reflection density.

The addition amount of the sensitizing dye to the image recording layer is preferably from 0.5 to 20% by mass with respect to the total solid content in the image recording layer. Within the range, property changes are highly sensitive to light exposure, thereby high sensitivity is achieved with no deleterious influences on the uniformity and strength of the film.

[(D) Binder Polymer]

In the application of the curable composition of the invention to a photosensitive layer of a planographic printing plate precursor, which is one preferred exemplary embodiment of the composition, in order to improve the film property of a photosensitive layer to be formed, a binder polymer may further be used, if necessary. It is desirable that a linear organic polymer is used as a binder. Any known "linear organic polymer" may be used for this purpose. Preferably, in order to make water development or weak aqueous alkali development possible, linear organic polymers which are soluble or swellable in water or weak aqueous alkali are selected. Linear organic polymers are selected and used depending on the application not only as a film forming agent for forming an image recording material but also as a water, weak aqueous alkali or organic solvent developer.

Preferable examples of such a binder polymer include macromolecules selected from acrylic resins, polyvinyl acetal resins, polyurethane resins, polyamide resins, epoxy resins, methacrylic resins, styrene resins and polyester resins. In particular, acrylic resins and polyurethane resins are preferred.

To improve the strength of a film in an image region, the binder polymer may have crosslinkability.

Introduction of crosslinking functional groups such as ethylenically unsaturated bonds into a main chain or side chain of the macromolecules can cause the binder polymer to have crosslinkability. The crosslinking functional groups may be introduced by either copolymerization or macromolecular reaction.

Herein, the crosslinking group is a group which causes the macromolecular binder to crosslink in the course of the radical polymerization reaction caused in the photosensitive layer when the planographic printing plate precursor is exposed to light. Any group having such function may be used without limitation and examples of functional groups which can undergo addition polymerization reaction include an ethylenically unsaturated bond group, an amino group, and an epoxy group. The crosslinking group may be a functional group which can form radical by light irradiation and examples of such crosslinking groups include a thiol group, a halogen group, and an onium salt structure. Among them, the ethylenically unsaturated bond group is preferable and functional groups represented by the following formulas (1) to (3) are particularly preferred.

Formula (1)

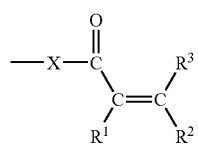

In the formula (1), $R^1$ to $R^3$ each independently represents a monovalent organic group. Preferable examples of $R^1$ include a hydrogen atom or an alkyl group having a substituent. In particular, a hydrogen atom and a methyl group are preferred because of their high radical reactivities. $R^2$ and $R^3$ each independently may be a hydrogen, a halogen atom, an amino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, an arylsulfonyl group which may have a substituent, or the like. In particular, a hydrogen atom, a carboxyl group, an alkoxycarbonyl group, an alkyl group which may have a substituent and an aryl group which may have a substituent are preferred because of their high radical reactivities.

X represents an oxygen atom, a sulfur atom, or $N(R^{12})$—, and $R^{12}$ represents a hydrogen atom or a monovalent organic group. Here, $R^{12}$ may be an alkyl group which may have a substituent and, in particular, a hydrogen atom, a methyl group, an ethyl group and an isopropyl group are preferred because of their high radical reactivities.

Here, examples of a substituent which may be introduced include an alkyl group, an alkenyl group, an alkynyl group, an aryl group, an alkoxy group, an aryloxy group, a halogen atom, an amino group, an alkylamino group, an arylamino group, a carboxyl group, an alkoxycarbonyl group, a sulfo group, a nitro group, a cyano group, an amide group, an alkylsulfonyl group and an arylsulfonyl group.

Formula (2)

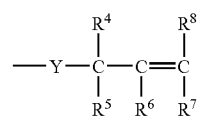

In the formula (2), $R^4$ to $R^8$ each independently may be a monovalent organic group, and preferable examples of $R^4$ to $R^8$ include a hydrogen atom, a halogen atom, an amino group, a dialkylamino grooup, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulfonyl group which may have a substituent. In particular, a hydrogen atom, a carboxyl group, an alkoxycarbonyl group, an alkyl group which may have a substituent and an aryl group which may have a substituent are preferred.

Examples of a substituent which may be introduced include those listed for the formula (1). Y represents an oxygen atom, a sulfur atom, or $N(R^{12})$—. $R^{12}$ is has the same meaning as that of $R^{12}$ of the formula (1) and its preferable examples are also the same.

Formula (3)

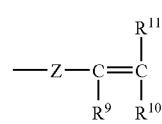

In the formula (3), preferable examples of $R^9$ include a hydrogen atom or an alkyl group which may have a substituent. In particular, a hydrogen atom and a methyl group are preferred because of their high radical reactivities. $R^{10}$ and $R^{11}$ each independently may be a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, an arylsulfonyl group which may have a substituent, or the like.

In particular, a hydrogen atom, a carboxyl group, an alkoxycarbonyl group, an alkyl group which may have a substituent and an aryl group which may have a substituent are preferred because of their high radical reactivities.

Here, examples of a substituent which may be introduced include those listed for the formula (1). Z represents an oxygen atom, a sulfur atom, —N($R^{13}$)—, or a phenylene group which may have a substituent. $R^{13}$ may be an alkyl group which may have a substituent and, in particular, a methyl group, an ethyl group and an isopropyl group are preferred because of their high radical reactivities.

Among those shown above, a (meth)acrylic acid copolymer having a crosslinking group on its side chain and polyurethane are more preferred.

The crosslinking binder polymer is cured, for example, by adding a free radical (a polymerization initiation radical or a growing radical in a process of polymerizing a polymerizable compound) to its crosslinking functional group, thereby initiating addition polymerization directly among the polymers or via polymerizing linkage of the polymerizable compound, to form crosslinkages between polymer molecules. Alternatively, an atom (for example, a hydrogen atom in a carbon atom adjacent to the functional crosslinking group) in the polymer is withdrawn by a free radical to generate polymer radicals, which are then bonded to one another to form crosslinkages among polymer molecules, whereby the binder polymer is cured.

The content of the crosslinking group in the binder polymer (content of radical-polymerizable unsaturated double bonds determined by iodine titration) is preferably 0.1 to 10.0 mmol, more preferably 1.0 to 7.0 mmol, and most preferably 2.0 to 5.5 mmol, per g of the binder polymer.

(Alkali-Soluble Binder Polymer)

In an embodiment where a developing treatment of removing an uncured region is performed using an alkali developing solution, the binder polymer must be dissolved in the alkali developing solution and therefore an organic macromolecular polymer which is soluble or swellable in an aqueous alkali solution is preferably used. Particularly, in use of an alkali developing solution whose pH is 10 or more, an alkali-soluble binder is preferably used. When performing water development, a water-soluble polymer may be used.

For example, the use of a water-soluble organic polymer allows water development. Examples of the linear organic polymer include radical polymers having in the side chain thereof a carboxylic acid group described in, for example, JP-A No. 59-44615, JP-B No. 54-34327, JP-B No. 58-12577, and JP-B No. 54-25957, JP-A No. 54-92723, JP-A No. 59-53836, and JP-A No. 59-71048, and specific examples thereof include resins prepared by homopolymerizing or copolymerizing monomers having a carboxyl group, resins prepared by hydrolyzing, half-esterifying, or half-amidating an acid anhydride unit prepared by homopolymerizing or copolymerizing monomers having an acid anhydride, and epoxy acrylates prepared by modifying an epoxy resin with an unsaturated monocarboxylic acid and an acid anhydride. Examples of the monomers having a carboxyl group include acrylic acid, methacrylic acid, itaconic acid, crotonic acid, maleic acid, fumaric acid, and 4-carboxylstyrene, and examples of the monomers having an acid anhydride include maleic anhydride.

Other examples include acidic cellulose derivatives having in the side chain thereof a carboxylic acid group. An adduct of a hydroxy group-containing polymer and a cyclic acid anhydride is also useful.

In the case where a copolymer of an alkali soluble resin is used, the compound to be copolymerized with the resin may be a monomer other than the above-described monomers. Examples of the other monomers include the following compounds listed in (1) to (13):

(1) acrylic esters and methacrylic acid esters having an aliphatic hydroxy group such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, and 4-hydroxybutyl methacrylate;

(2) alkyl acrylates such as methyl acrylate, ethyl acrylate, acrylate propyl, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, and propargyl acrylate;

(3) alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, and propargyl methacrylate;

(4) acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinylacrylamide, vinylmethacrylamide, N,N-diallylacrylamide, N,N-diallylmethacrylamide, allylacrylamide, and allylmethacrylamide;

(5) vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether;

(6) vinyl esters such as vinyl acetate, vinyl chloroacetate, vinyl butylate, and vinyl benzoate;

(7) styrenes such as styrene, α-methylstyrene, methylstyrene, chloromethylstyrene, and p-acetoxystyrene;

(8) vinyl ketones such as methyl vinyl ketone, ethyl vinyl ketone, propyl vinyl ketone, and phenyl vinyl ketone;

(9) olefins such as ethylene, propylene, isobutylene, butadiene, and isoprene;

(10) N-vinylpyrrolidone, acrylonitrile, methacrylonitrile, and the like;

(11) unsaturated imides such as maleimide, N-acryloylacrylamide, N-acetylmethacrylamide, N-propionylmethacrylamide, and N-(p-chlorobenzoyl)methacrylamide; and

(12) methacrylate monomers having a hetero atom in the α position, examples thereof include compounds described in Japanese Patent Application No. 2001-115595 and Japanese Patent Application No. 2001-115598.

Among them, preferable are (meth)acrylic resins having in the side chain thereof an allyl group or a vinyl ester group and a carboxyl group, alkali soluble resins having in the side chain thereof a double bond described in JP-A No. 2000-187322 and JP-A No. 2002-62698, and alkali soluble resins having in the side chain thereof an amide group described in JP-A No. 2001-242612, from the viewpoints of excellent balance between the film strength, sensitivity, and developability.

Urethane-containing binder polymers containing an acid group as described in JP-B No. 7-12004, JP-B No. 7-120041, JP-B No. 7-120042, JP-B No. 8-12424, JP-A No. 63-287944, JP-A No. 63-287947, JP-A No. 1-271741 and JP-A No. 10-116232 and urethane-containing binder polymers containing an acid group and a double bond as described in JP-A No. 2002-107918 are very excellent in strength and thus advantageous in respect of printing durability and low-exposure suitability.

Acetal-modified polyvinyl alcohol-containing binder polymers having an acid group as described in EP993966, EP1204000, and JP-A No. 2001-318463 are preferable because they are excellent in the balance between film strength and developability.

As other water-soluble linear organic compounds, polyvinyl pyrrolidone and polyethylene oxide are useful. To increase the strength of the cured film, alcohol-soluble nylon, polyethers of 2,2-bis-(4-hydroxyphenyl)-propane and epichlorohydrin, etc. are also useful.

The weight-average molecular weight of the polymer used in the invention is preferably fom 5000 or more, more preferably in a range of from 10,000 to 300,000, and the number-average molecular weight thereof is preferably 1,000 or more, more preferably in a range of from 2,000 to 250,000. Polydispersity (weight-average molecular weight/number-average molecular weight) is preferably 1 or more, more preferably in a range of from 1.1 to 10.

The polymer may be a random polymer, a block polymer or a graft polymer.

The polymer used in the invention can be synthesized in a method known in the art. Examples of the solvent used in synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-dimethyl acetamide, toluene, ethyl acetate, methyl lactate, ethyl lactate, dimethyl sulfoxide, and water. Only one solvent may be used, or a mixture of two or more solvents may be used.

As the radical polymerization initiator used for synthesizing the polymer used in the invention, known compounds such as an azo initiator or a peroxide initiator can be used.

Among the binders described above, binder polymers having a repeating unit represented by the following formula (I) shown in Japanese Patent Application No. 2002-287920, such as 2-methacryloyloxyethylsuccinic acid polymer and 2-methacryloyloxyethylhexahydrophthalic acid copolymer, are preferable from the viewpoint of preventing damage caused by a developer.

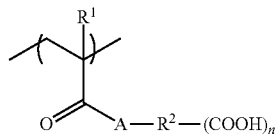

In formula (I), $R^1$ represents a hydrogen atom or a methyl group; $R^2$ is a linking group composed of two or more atoms selected from the group consisting of carbon atoms, hydrogen atoms, oxygen atoms, nitrogen atoms and sulfur atoms wherein the number of atoms in the linking group is 2 to 82; A represents an oxygen atom or —$NR^3$— wherein $R^3$ represents a hydrogen atom or a $C_{1-10}$ monovalent hydrocarbon group; and n is an integer of 1 to 5.

In the formula (I) above, the number of atoms in the main skeleton of the linking group represented by $R^2$ is preferably 1 to 30. $R^2$ preferably has an alkylene structure or a structure including alkylene structures linked via ester linkages.

Hereinafter, the repeating units represented by the formula (I) will be described in detail.

$R^1$ in the formula (I) represents a hydrogen atom or a methyl group, preferably a methyl group.

The linking group represented by $R^2$ in the formula (I) is a linking group composed of two or more atoms selected from the group consisting of carbon atoms, hydrogen atoms, oxygen atoms, nitrogen atoms and sulfur atoms wherein the number of atoms in the linking group is 2 to 82, preferably 2 to 50, more preferably 2 to 30. When the linking group has substituent(s), the number of atoms refers to the number of atoms including the atoms in the substituent(s) on the linking group.

Specifically, the number of atoms in the main skeleton of the linking group represented by $R^2$ is preferably 1 to 30, more preferably 3 to 25, still more preferably 4 to 20, most preferably 5 to 10. The "main skeleton of the linking group" in the invention refers to an atom or an atomic group serving to link A to the terminal COOH in the formula (I). When plural linking routes are present, the main skeleton refers to the atom or atomic group constituting the linking route having the smallest number of atoms. Accordingly, when the linking group has a cyclic structure, the number of atoms to be used for calculation varies depending on the linking site (for example, o-, m-, p- etc.).

The structure of the specific binder polymer according to the invention, and the number of atoms constituting the main skeleton of the linking group represented by $R^2$ in the structure and the method of calculating the number of atoms, are both shown below.

| | number of atoms composing a main skelton of a linking group |
|---|---|
| (1) 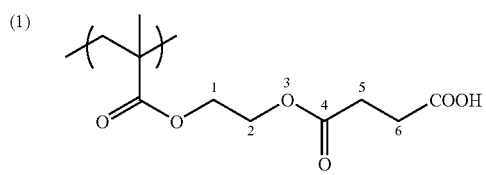 | 6 |

| | | number of atoms composing a main skelton of a linking group |
|---|---|---|
| (2) | 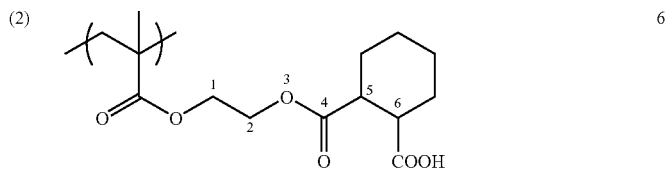 | 6 |
| (3) | 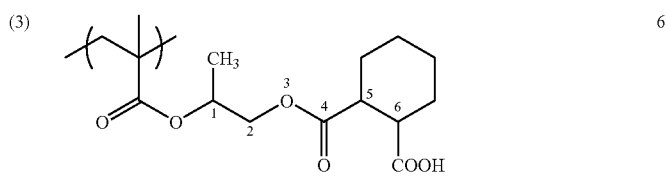 | 6 |
| (4) | 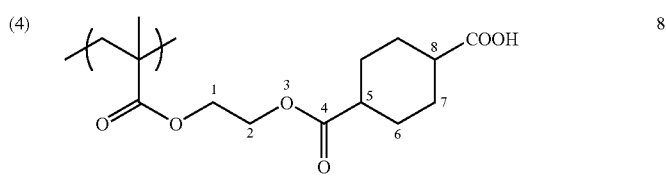 | 8 |
| (5) | 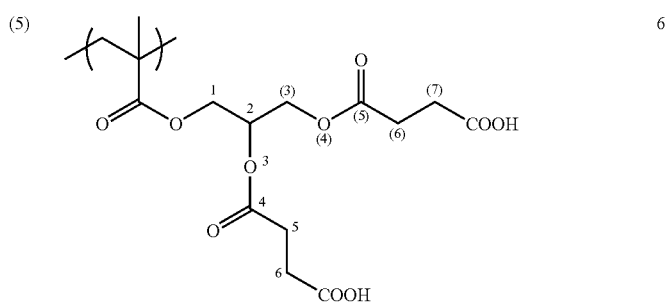 | 6 |
| (6) | 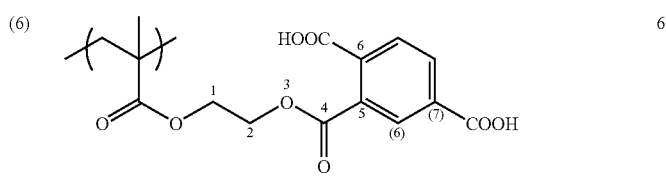 | 6 |
| (7) | 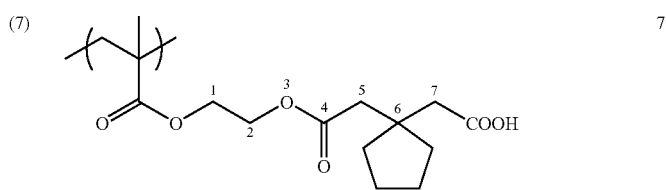 | 7 |
| (8) | 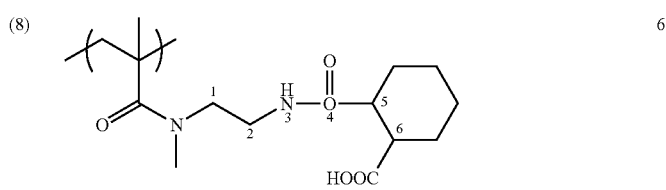 | 6 |

The linking group represented by $R^2$ in the formula (I) is more specifically an alkylene, a substituted alkylene, an arylene, a substituted arylene, or a group in which plural divalent groups, such as those described above, are linked via amide or ester linkages.

A linking group in the chain structure may be ethylene, propylene etc. A structure including such alkylene groups linked via ester linkages is also preferable.

The linking group represented by $R^2$ in the formula (I) is preferably a (n+1)-valent hydrocarbon group having a $C_{3-30}$ alicyclic structure. Examples thereof include (n+1)-valent hydrocarbon groups obtained by removing (n+1) hydrogen atoms on one or more arbitrary carbon atoms constituting a compound having an alicyclic structure such as cyclopropane, cyclopentane, cyclohexane, cycloheptane, cyclooctane, cyclodecane, dicyclohexyl, tertiary cyclohexyl or norbornane which may be substituted by one or more arbitrary substituents. $R^2$ preferably has 3 to 30 carbon atoms including the carbon atoms in the substituent(s) if any.

One or more arbitrary carbon atoms in the compound having an alicyclic structure may be substituted by one or more heteroatoms selected from the group consisting of nitrogen atoms, oxygen atoms and sulfur atoms. In respect of printing durability, $R^2$ is preferably a (n+1)-valent hydrocarbon group having an alicyclic structure which may have a substituent and which includes two or more rings and has 5 to 30 carbon atoms, such as a condensed polycyclic aliphatic hydrocarbon, a crosslinked alicyclic hydrocarbon, a spiroaliphatic hydrocarbon, and a combination of aliphatic hydrocarbon rings (a structure in which rings are combined by bonds or via linking groups). The number of carbon atoms refers to the number of carbon atoms including the carbon atoms in the substituent(s) if any.

Regarding linking groups represented by $R^2$, the number of atoms is further preferably 5 to 10. Linking groups having a chain structure in which includes a ester bond or a cyclic structure are preferable.

A substituent which can be introduced into the linking group represented by $R^2$ may be a monovalent non-metal atomic group excluding hydrogen, and examples thereof include a halogen atom (—F, —Br, —Cl, —I), a hydroxyl group, an alkoxy group, an aryloxy group, a mercapto group, an alkyl thio group, an aryl thio group, an alkyl dithio group, an aryl dithio group, an amino group, a N-alkyl amino group, a N,N-dialkyl amino group, a N-aryl amino group, a N,N-diaryl amino group, a N-alkyl-N-aryl amino group, an acyloxy group, a carbamoyloxy group, a N-alkylcarbamoyloxy group, a N-aryl carbamoyloxy group, a N,N-dialkyl carbamoyloxy group, a N,N-diaryl carbamoyloxy group, a N-alkyl-N-aryl carbamoyloxy group, an alkyl sulfoxy group, an aryl sulfoxy group, an acyl thio group, an acyl amino group, a N-alkyl acyl amino group, a N-aryl acyl amino group, a ureido group, a N'-alkyl ureido group, a N',N'-dialkyl ureido group, a N'-aryl ureido group, a N',N'-diaryl ureido group, a N'-alkyl-N'-aryl ureido group, a N-alkyl ureido group, a N-aryl ureido group, a N'-alkyl-N-alkyl ureido group, a N'-alkyl-N-aryl ureido group, a N',N'-dialkyl-N-alkyl ureido group, a N',N'-dialkyl-N-aryl ureido group, a N'-aryl-N-alkyl ureido group, a N'-aryl-N-aryl ureido group, a N',N'-diaryl-N-alkyl ureido group, a N',N'-diaryl-N-aryl ureido group, a N'-alkyl-N'-aryl-N-alkyl ureido group, a N'-alkyl-N'-aryl-N-aryl ureido group, an alkoxy carbonyl amino group, an aryloxy carbonyl amino group, a N-alkyl-N-alkoxycarbonyl amino group, a N-alkyl-N-aryloxy carbonyl amino group, a N-aryl-N-alkoxycarbonyl amino group, a N-aryl-N-aryloxy-carbonyl amino group, a formyl group, an acyl group, a carboxyl group and its conjugate base group, an alkoxy carbonyl group, an aryloxy carbonyl group, a carbamoyl group, a N-alkyl carbamoyl group, a N,N-dialkyl carbamoyl group, a N-aryl carbamoyl group, a N,N-diaryl carbamoyl group, a N-alkyl-N-aryl carbamoyl group, an alkyl sulfinyl group, an aryl sulfinyl group, an alkyl sulfonyl group, an aryl sulfonyl group, a sulfo group (—SO$_3$H) and its conjugate base group, an alkoxy sulfonyl group, an aryloxy sulfonyl group, a sulfinamoyl group, a N-alkyl sulfinamoyl group, a N,N-dialkyl sulfinamoyl group, a N-aryl sulfinamoyl group, a N,N-diaryl sulfinamoyl group, a N-alkyl-N-aryl sulfinamoyl group, a sulfamoyl group, a N-alkyl sulfamoyl group, a N,N-dialkyl sulfamoyl group, a N-aryl sulfamoyl group, a N,N-diaryl sulfamoyl group, a N-alkyl-N-aryl sulfamoyl group, a N-acyl sulfamoyl group and its conjugate base group, a N-alkyl sulfonyl sulfamoyl group (—SO$_2$NHSO$_2$ (alkyl)) and its conjugate base group, a N-aryl sulfonyl sulfamoyl group (—SO$_2$NHSO$_2$ (allyl)) and its conjugate base group, a N-alkyl sulfonyl carbamoyl group (—CONHSO$_2$ (alkyl)) and its conjugate base group, a N-aryl sulfonyl carbamoyl group (—CONHSO$_2$ (aryl)) and its conjugate base group, an alkoxy silyl group (—Si(O-alkyl)$_3$), an aryloxy silyl group (—Si(O-aryl)$_3$), a hydroxysilyl group (—Si(OH)$_3$) and its conjugate base group, a phosphono group (—PO$_3$H$_2$) and is conjugate base group, a dialkyl phosphono group (—PO$_3$ (alkyl)$_2$), a diaryl phosphono group (—PO$_3$(aryl)$_2$), an alkyl aryl phosphono group (—PO$_3$(alkyl)(aryl)), a monoalkyl phosphono group (—PO$_3$H(alkyl)) and its conjugate base group, a monoaryl phosphono group (—PO$_3$H(aryl)) and its conjugate base group, a phosphonoxy group (—OPO$_3$H$_2$) and its conjugate base group, a dialkyl phosphonoxy group (—OPO$_3$(alkyl)$_2$), a diaryl phosphonoxy group (—OPO$_3$(aryl)$_2$), an alkyl aryl phosphonoxy group (—OPO$_3$(alkyl)(aryl)), a monoalkyl phosphonoxy group (—OPO$_3$H(alkyl)) and its conjugate base group, a monoaryl phosphonoxy group (—OPO$_3$H(aryl)) and its conjugate base group, a cyano group, a nitro group, a dialkyl boryl group (—B(alkyl)$_2$), a diaryl boryl group (—B(aryl)$_2$), an alkyl aryl boryl group (—B(alkyl)(aryl)), a dihydroxy boryl group (—B(OH)$_2$) and its conjugate base group, an alkyl hydroxy boryl group (—B(alkyl)(OH)) and its conjugate base group, an aryl hydroxy boryl group (—B(aryl)(OH)) and its conjugate base group, an aryl group, an alkenyl group and an alkynyl group.

According to the design of the photosensitive layer, a substituent having a hydrogen atom capable of hydrogen bonding, particularly a substituent having acidity whose acid dissociation constant (pKa) is lower than that of carboxylic acid, may not be preferable because it tends to lower printing durability. On the other hand, a hydrophobic substituent such as a halogen atom, a hydrocarbon group (alkyl group, aryl group, alkenyl group, or alkynyl group), an alkoxy group and an aryloxy group is preferable because it tends to improve printing durability. In particular, when the cyclic structure is a six-membered or lower-membered monocyclic aliphatic hydrocarbon such as cyclopentane or cyclohexane, the hydrocarbon preferably has such hydrophobic substituents. If possible, these substituents may be bound to one another or to a substituted hydrocarbon group to form a ring. The substituents may themselves be substituted.

In the formula (I), when A is NR$_3$—, R$_3$ represents a hydrogen atom or monovalent hydrocarbon group having 1 to 10 carbon atoms. Examples of the monovalent hydrocarbon group having 1 to 10 carbon atoms represented by R$_3$ include linear, branched, or cyclic alkyl groups having 1 to 10 carbon atoms such as an alkyl group, an aryl group, an alkenyl group, and an alkynyl group. Specific examples of the alkyl group include a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamantyl group, and a 2-norbornyl group. Specific examples of the aryl group include aryl groups having 1 to 10 carbon atoms such as a phenyl group, a naphthyl group, and an indenyl group, heteroaryl groups having 1 to 10 carbon atoms and containing a heteroatom selected from the group consisting of a nitrogen atom, an oxygen atom, and a sulfur atom, for example, a furyl group, a thienyl group, a pyrrolyl group, a pyridyl group, and a quinolyl group.

Specific examples of the alkenyl group include linear, branched, or cyclic alkenyl groups having 1 to 10 carbon atoms such as a vinyl group, a 1-propenyl group, a 1-butenyl group, a 1-methyl-1-propenyl group, a 1-cyclopentenyl group, and a 1-cyclohexenyl group.

Specific examples of the alkynyl group include alkynyl groups having 1 to 10 carbon atoms such as an ethynyl group, a 1-propynyl group, a 1-butynyl group, and a 1-octynyl group. Examples of the substituent which may be introduced into $R_3$ are the same as those listed as the substituent which may be introduced into $R^2$. However, $R^3$ has 1 to 10 carbon atoms including the carbon atoms in the substituent.

In the formula (I), A is preferably an oxygen atom or —NH— from the viewpoint of easiness of synthesis.

In the formula (I), n denotes an integer of 1 to 5, and is preferably 1 from the viewpoint of printing durability.

Specific examples of the repeating unit represented by the formula (I) composing the binder polymer particularly suitable for the invention are listed below, however are not limited to them.

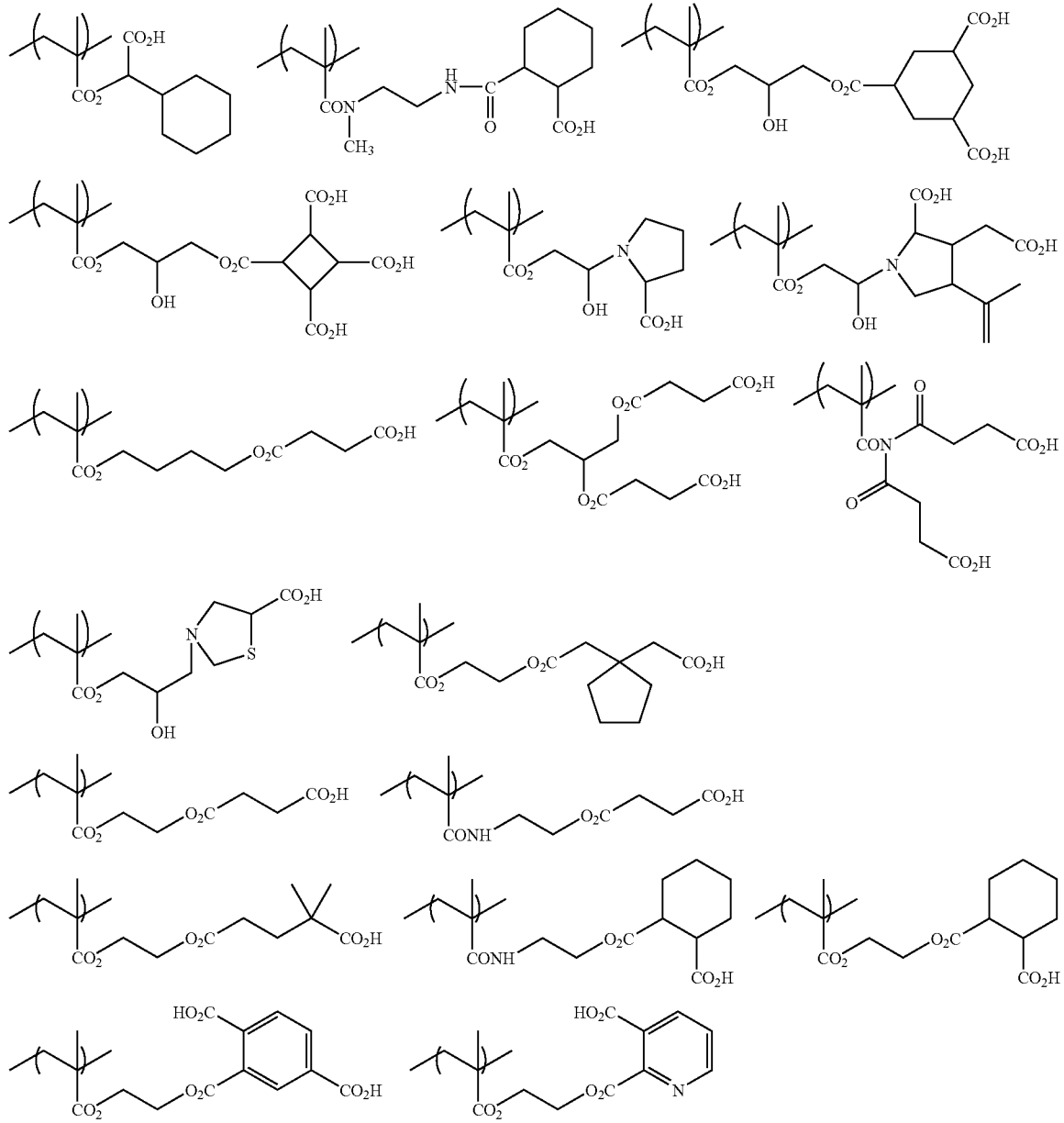

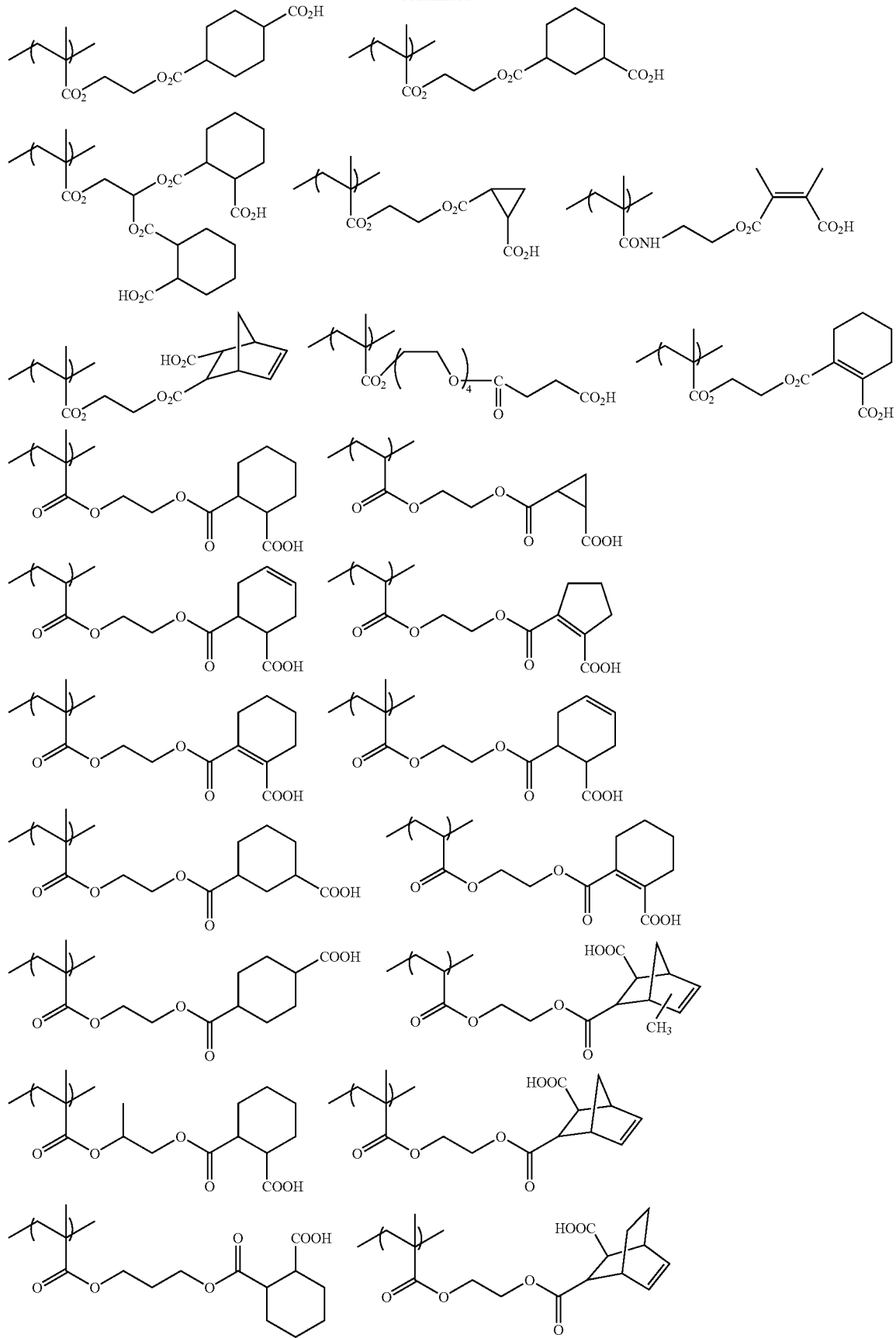

-continued
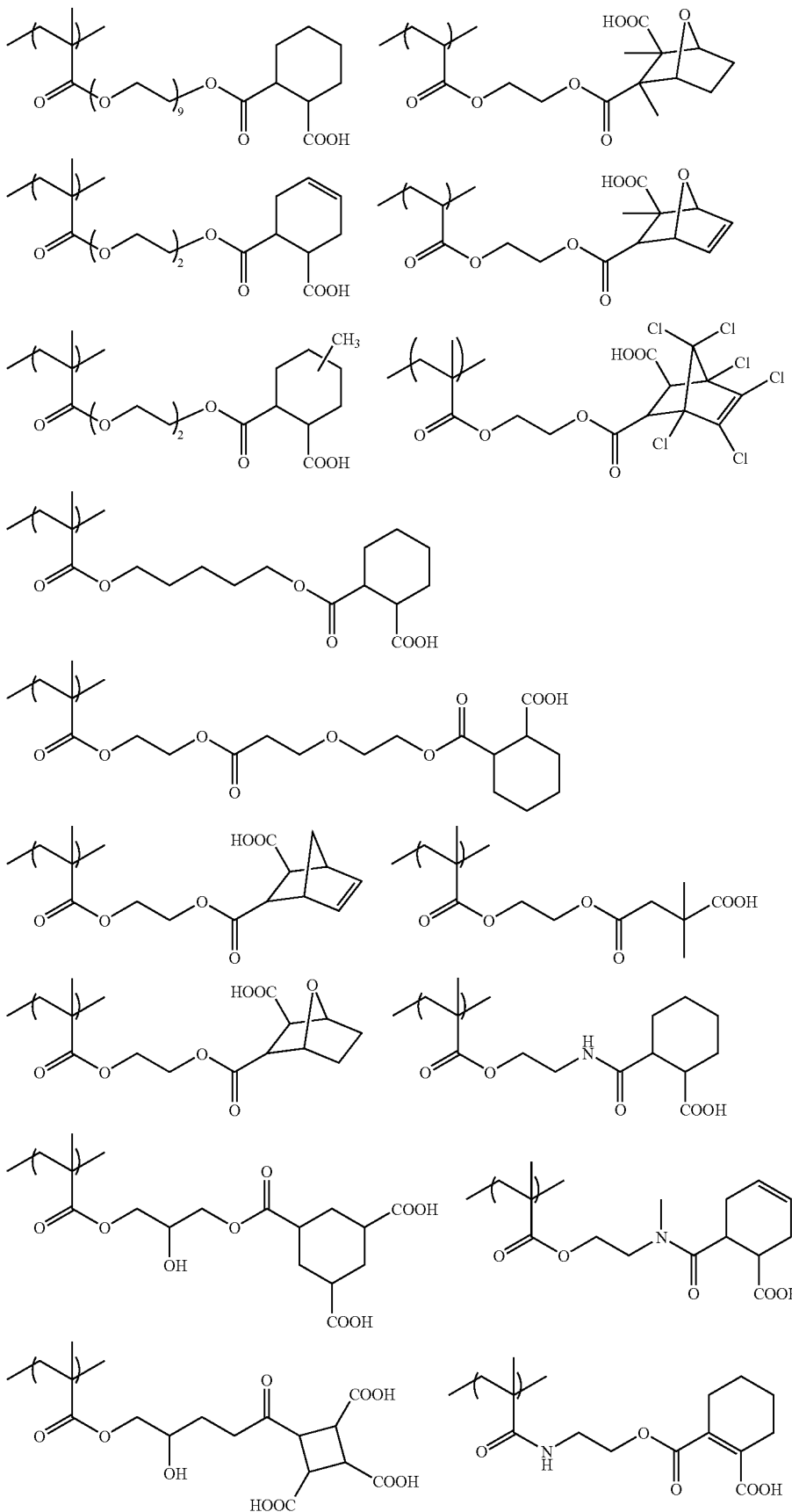

-continued
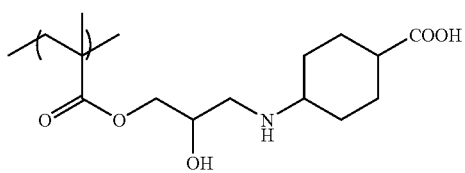
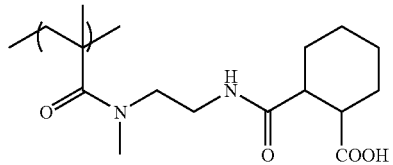
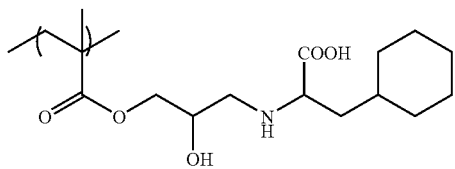
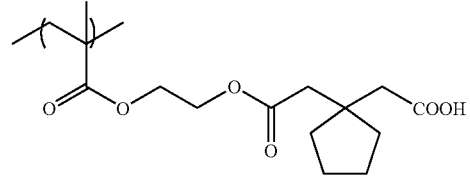
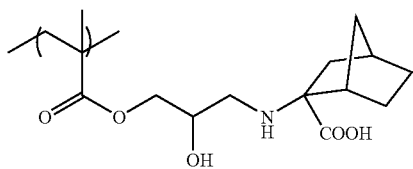
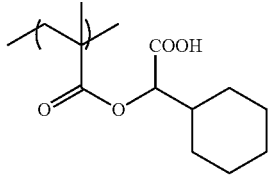
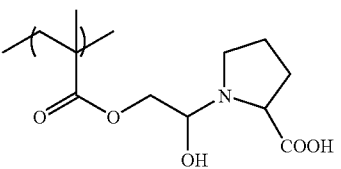
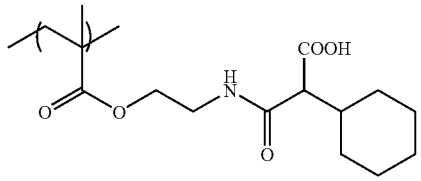
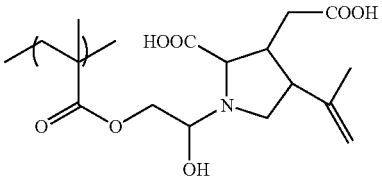
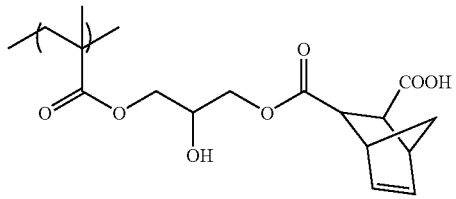
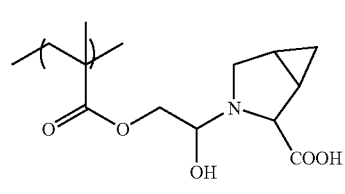
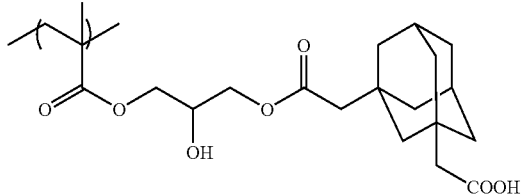
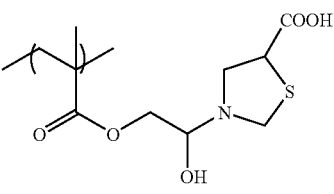
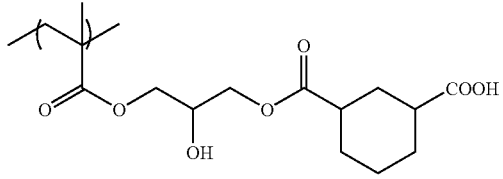
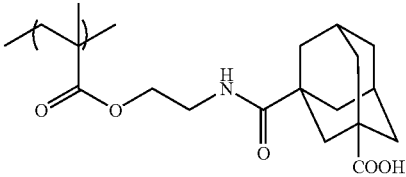
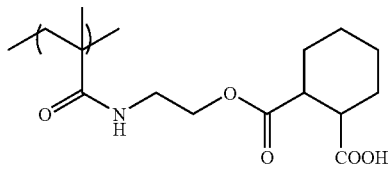
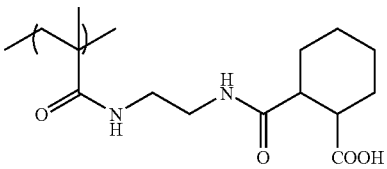
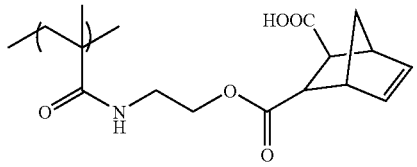
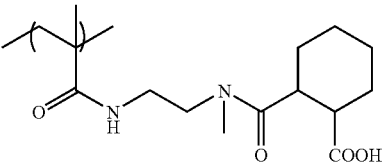

-continued
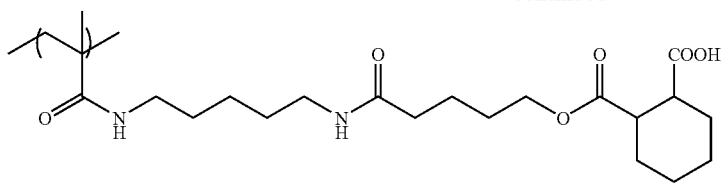
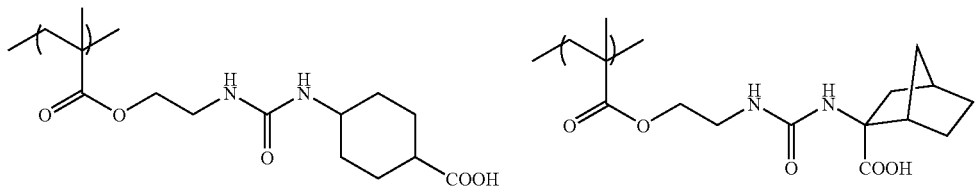
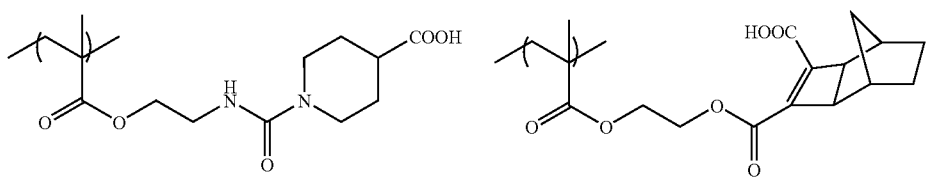
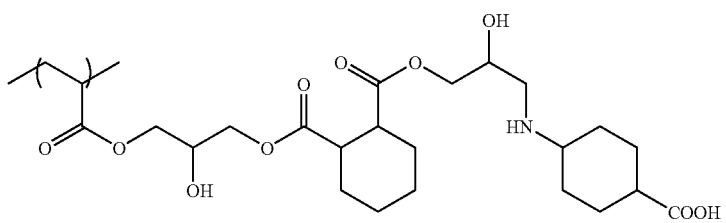
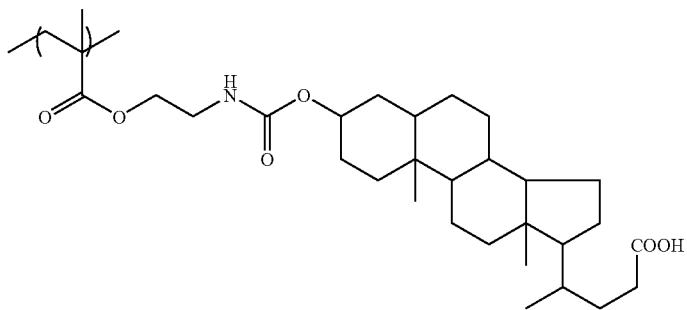
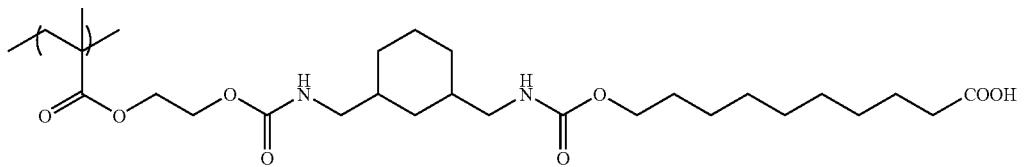
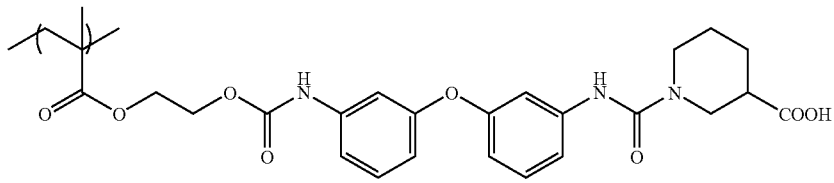
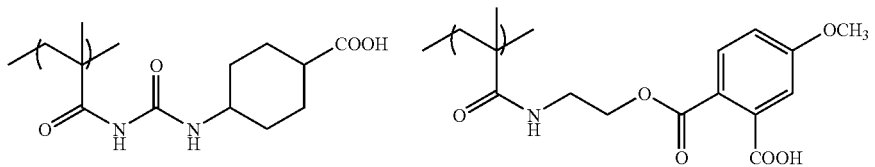

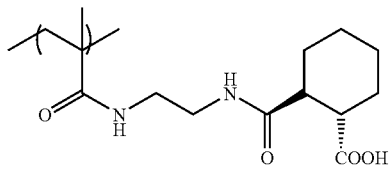
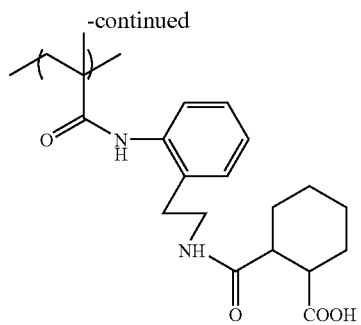
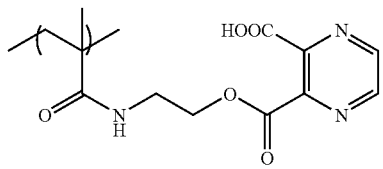

In an embodiment, one kind of repeating unit represented by formula (I) is included in the binder polymer. In another embodiment, two or more kinds of repeating unit represented by the formula (I) are contained in the binder polymer. The binder polymer preferred in the invention may be a polymer composed exclusively of the repeating unit represented by the formula (I), but is generally used as a copolymer containing one or more other copolymerizable components. The total content of the repeating unit represented by the formula (I) in the copolymer is determined suitably depending on the structure of the copolymer, the design of the polymerizable composition, etc., but is preferably from 1 to 99 mol %, more preferably from 5 to 40 mol %, still more preferably from 5 to 20 mol %, based on the total molar amount of the polymer components.

Copolymer components used as a copolymer may be selected from radical polymerizable monomers known in the art without particular limitation. Specific examples include monomers described in Polymer Data Handbook—Fundamental Version—(in Japanese) compiled by the Society of Polymer Science, Japan and published by Baifukan, 1986. Such additional copolymerizable components may include only one copolymerization component, or a combination of two or more compolymerization components.

Among the above-described binder polymers, [allyl (meth) acrylate/(meth)acrylic acid/optionally together with other addition polymerizable vinyl monomer] copolymers, and polymers containing an acryl group, a methacryl group, and an allyl group as described in JP-A No. 2000-131837, JP-A No. 2002-62648, JP-A No. 2000-187322, and Japanese Patent Application No. 2002-287920 are particularly preferable from the viewpoint of the excellent balance between the film strength, sensitivity, and developability.

In particular, polymers having a repeating unit represented by the formula (1) and a radical polymerizable group (carbon-carbon double bond) represented by any one of the formulae (II) to (IV) structure are most preferable.

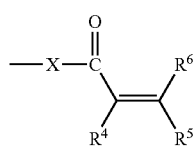

Formula (II)

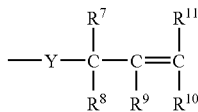

Formula (III)

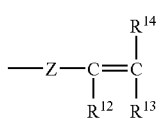

Formula (IV)

In the formulae (II) to (IV), $R^4$ to $R^{14}$ each independently represent a hydrogen atom or a monovalent substituent; X and Y each independently represent an oxygen atom, a sulfur atom or N—$R^{15}$; Z represents an oxygen atom, a sulfur atom, —N—$R^{15}$ or a phenylene group wherein $R^{15}$ represents a hydrogen atom or a monovalent organic group.

In the formula (II) above, $R^4$ to $R^6$ each independently represent a hydrogen atom or a monovalent substituent. $R^4$ may be a hydrogen atom or an optionally substituted organic group such as an alkyl group. In particular, specifically, a hydrogen atom, a methyl group, a methylalkoxy group or a methyl ester group is preferable. $R^5$ and $R^6$ each independently represent a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group and an optionally substituted arylsulfonyl group, among which a hydrogen atom, a carboxyl group, an alkoxycarbonyl group, an optionally substituted alkyl group and an optionally substituted aryl group are preferable.

Substituents which can be introduced into these groups include a methoxycarbonyl group, an ethoxycarbonyl group, an isopropioxycarbonyl group, a methyl group, an ethyl group, and a phenyl group.

X represents an oxygen atom, a sulfur atom or —N—$R^{15}$ wherein $R^{15}$ includes an optionally substituted alkyl group etc.

In the formula (III), $R^7$ to $R^{11}$ each independently represents a hydrogen atom or monovalent substituent. Specific examples of $R^7$ to $R^{11}$ include a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, and an optionally substituted arylsulfonyl group. Among them, a hydrogen atom, a carboxyl group, an alkoxycarbonyl group, an optionally substituted alkyl group, and an optionally substituted aryl group are preferable.

Examples of the substituent which may be introduced into these groups include those listed as the substituent which may be introduced into the formula (II).

Y represents an oxygen atom, a sulfur atom, or $-N-R^{15}$. Examples of $R^{15}$ include the same groups those listed for the formula (II).

In the formula (IV), $R^{12}$ to $R^{14}$ each independently represents a hydrogen atom or monovalent substituent. Specific examples thereof include a hydrogen atom, a halogen atom, an amino group, a dialkylamino group, a carboxyl group, an alkoxycarbonyl group, a sulfo group, a nitro group, a cyano group, an optionally substituted alkyl group, an optionally substituted aryl group, an optionally substituted alkoxy group, an optionally substituted aryloxy group, an optionally substituted alkylamino group, an optionally substituted arylamino group, an optionally substituted alkylsulfonyl group, and an optionally substituted arylsulfonyl group. Among them, a hydrogen atom, a carboxyl group, an alkoxycarbonyl group, an optionally substituted alkyl group, and an optionally substituted aryl group are preferable.

Examples of the substituent which may be introduced into these groups include those listed as the substituent which may be introduced into the formula (II).

Z represents an oxygen atom, a sulfur atom, $-NR^{15}$ or a phenylene group. Examples of $-NR^{15}$ include those listed for the formula (II).

Among these radical polymerizable groups, radical-polymerizable groups having a structure represented by the formula (II) or (III) are preferable.

In an embodiment, only one of such binder polymers is useed. In another embodiment, a mixture of two or more of such binder polymers is used.

The molecular weight of the binder polymer (D) in the invention can be suitably determined from the viewpoints of image-forming property and printing durability. Usually the molecular weight is preferably in a range of 2,000 to 1,000,000, more preferably 5,000 to 500,000, still more preferably 10,000 to 200,000.

As the binder polymer (D) in the invention, it is preferable to use one which is substantially insoluble in water but soluble in aqueous alkali solutions. Use of such a polymer makes it possible to eliminate use of organic solvents, which are environmentally unfavorable, as developing solutions or to limit organic solvents to be used to very small amounts.

The acid value, which is the acid content per gram of a polymer expressed in the number of chemical equivalents, and molecular weight of the binder polymer (D) may be appropriately selected from the viewpoint of image strength and developability. A preferable acid value is from 0.4 to 3.0 meq/g and a preferable molecular weight is from 2,000 to 500,000. More preferably, the acid value is from 0.6 to 2.0 meq/g and the molecular weight is from 10,000 to 300,000.

The content of the binder polymer (D) in a curable composition may be determined at will, however it is typically from 10 to 90% by mass, preferably from 20 to 80% by mass, and more preferably from 30 to 70% by mass based on the total solid content.

The curable composition of the invention can be applied to various fields, such as planographic printing plate precursors, resists and coatings, if it is used in an embodiment where images are formed by performing curing by light exposure, followed by removal of unexposed regions by alkali developing treatment.

In the following, examples of application of the curable composition to a planographic printing plate precursor, which is a preferable embodiment, are discribed. However, the application of the curable composition of the invention is not limited to it.

[Planographic Printing Plate Precursor]

(Layer Structure of Planographic Printing Plate Precursor)

A layer structure in the application of the curable composition of the invention to a photosensitive layer of a planographic printing plate precursor will be described below.

A planographic printing plate precursor is an item in which a photosensitive layer including ingredients, namely, at least the aforementioned (A) and (B) and preferably (C) as well, is disposed on a support. It may have other layers, such as an intermediate layer, an undercoat layer and a backcoat layer, if necessary.

(Photosensitive Layer)

A photosensitive layer, which has an image forming function in the planographic printing plate precursor of the invention, is described. The photosensitive layer of the planographic printing plate precursor in the present invention contains the aforementioned components (A) and (B), and from the viewpoint of sensitivity improvement, it preferably further contains the sensitizing dye (C).

The component (B) in the photosensitive layer of the planographic printing plate precursor particularly functions as a polymerization initiator which initiates and promotes the polymerization of (A) a specific polymerizable monomer and (A-2) other polymerizable compounds optionally used in combination.

As the specific polymerizable monomer (A) and other polymerizable compounds to be used for the recording layer of a planographic printing plate precursor, the compounds previously described are used. However, what type of compounds are used is determined appropriately in association with the factors previously mentioned and a support or adjacent layers, which will be described later. For example, in order to improve the adhesiveness to a support or the like, compounds having specific structures may be selected.

Besides, methods of use of a polymerizable compound may be determined in consideration of the degree of polymerization inhibition by oxygen, resolution, fogging, change in refractive index, and surface adhesiveness. An appropriate structure, an appropriate composition, and an adequate amount to be added of the polymerizable compound may be determined in consideration of the above factors. In some cases, a layer structure and a coating method such as undercoating and overcoating may be adopted.

<(E) Other Ingredients>

When the curable composition of the invention is used for a planographic printing plate precursor, other ingredients suitable for the application, manufacturing method and the like of the product may be added to the composition for constituting the photosensitive layer. Preferable additives will be described below.

By use of a planographic printing plate obtained in such a manner from the planographic printing plate precursor of the invention, multiple sheets of printed material can be produced.

(E-1) Co-Sensitizer

By use of a certain additive in the polymerizable composition, the sensitivity can be further improved. Such a compound will be referred to as a co-sensitizer hereinafter. Its working mechanism is not clear, but is considered to be based mainly on the following chemical process. That is, it is estimated that various intermediate active species (radials, cations) generated in the photo-reaction initiated by the heat-polymerization initiator and in the subsequent addition-polymerization reaction react with the co-sensitizer to form new active radicals. Such co-sensitizers can be roughly classified into (i) those capable of forming active radicals when reduced, (ii) those capable of forming active radicals when oxidized, and (iii) those converted into highly active radicals through reaction with radicals with low activity or those acting as chain transfer agents. There are many compounds whose classification is not commonly understood.

(i) Compound forming active radicals when reduced reduction

Compounds having a carbon-halogen bond: It is considered that the carbon-halogen bond is reductively cleaved to generate active radicals. Specifically, for example, trihalomethyl-s-triazines and trihalomethyl oxadiazoles can be preferably used.

Compounds having a nitrogen-nitrogen bond: It is considered that the nitrogen-nitrogen bond is reductively cleaved to form active radicals. Specifically, hexaryl biimidazoles can be preferably used.

Compounds having an oxygen-oxygen bond: It is considered that the oxygen-oxygen bond is reductively cleaved to generate active radicals. Specifically, organic peroxides can be preferably used.

Onium compounds: It is considered that a carbon-heteroatom bond or an oxygen-nitrogen bond is reductively cleaved to generate active radicals. Specifically, diaryl iodonium salts, triaryl sulfonium salts, and N-alkoxy pyridinium (azinium) salts can be preferably used.

Ferrocene, iron arene complexes: Capable of forming active radicals reductively.

(ii) Compounds forming active radicals when oxidized

Alkylate complexes: It is considered that a carbon-heteroatom bond is oxidatively cleaved to generate active radicals. Specifically, for example, triaryl alkyl borates can be preferably used.

Alkyl amine compounds: It is considered that a C—X bond on a carbon adjacent to the nitrogen is cleaved by oxidation to form active radicals. X is preferably a hydrogen atom, a carboxyl group, a trimethylsilyl group, or a benzyl group. Specifically, ethanol amines, N-phenyl glycines, N-phenyliminodiacetic acid and its derivatives, and N-trimethylsilylmethyl anilines can be mentioned.

Sulfur- or tin-containing compounds: A compound obtained by replacing the nitrogen atom in any of the above-described amines with a sulfur atom or a tin atom can form active radicals in a similar mechanism. Further, compounds having S—S bonds are known to act as sensitizers by cleavage of the S—S bonds.

α-Substituted methyl carbonyl compounds: Capable of forming active radicals through the cleavage of the carbonyl-α carbon bond upon oxidation. Further, compounds obtained by replacing the carbonyl in such a compound with an oxime ether exhibit the same action. Specifically, examples include 2-alkyl-1-[4-(alkylthio) phenyl]-2-morpholinopronone-1 and derivatives thereof, as well as oxime ethers prepared by reacting such compounds with hydroxy amines and then etherifying N—OH.

Sulfinates: Capable of forming active radicals reductively. Specifically, sodium aryl sulfinates can be mentioned.

(iii) Compounds converted into highly active radicals through reaction with radicals, or compounds acting as chain transfer agents: For example, compounds having SH, PH, SiH or GeH in the molecule are usable. These compounds can form radicals by donating hydrogen to radicals having low-activity or by undergoing oxidization and subsequent deprotonation. Specifically, for example, 2-mercaptobenzimidazoles can be mentioned.

In a preferable embodiment, a polycarboxylic acid compound containing an aromatic ring or heterocyclic aromatic ring structure to which at least two carboxyl groups are bonded directly or via a divalent linking group is contained for the purpose of improving sensitivity and/or developability. Specific examples of the polycarboxylic acid compound include (p-acetamidophenylimido) diacetic acid, 3-(bis(carboxymethyl)amino) benzoic acid, 4-(bis(carboxymethyl) amino) benzoic acid, 2-[(carboxymethyl)phenylamino]benzoic acid, 2-[(carboxymethyl)phenylamino]-5-methoxybenzoic acid, 3-[bis(carboxymethyl)amino]-2-naphthalene carboxylic acid, N-(4-aminophenyl)-N-(carboxymethyl) glycine, N,N'-1,3-phenylene-bis-glycine, N,N'-1,3-phenylenebis[N-(carboxymethyl)]glycine, N,N'-1,2-phenylenebis[N-(carboxymethyl)]glycine, N-(carboxymethyl)-N-(4-methoxyphenyl) glycine, N-(carboxymethyl)-N-(3-methoxyphenyl) glycine, N-(carboxymethyl)-N-(3-hydroxyphenyl) glycine, N-(carboxymethyl)-N-(3-chlorophenyl) glycine, N-(carboxymethyl)-N-(4-bromophenyl) glycine, N-(carboxymethyl)-N-(4-chlorophenyl) glycine, N-(carboxymethyl)-N-(2-chlorophenyl) glycine, N-(carboxymethyl)-N-(4-ethylphenyl) glycine, N-(carboxymethyl)-N-(2,3-dimethylphenyl) glycine, N-(carboxymethyl)-N-(3,4-dimethylphenyl) glycine, N-(carboxymethyl)-N-(3,5-dimethylphenyl) glycine, N-(carboxymethyl)-N-(2,4-dimethylphenyl) glycine, N-(carboxymethyl)-N-(2,6-dimethylphenyl) glycine, N-(carboxymethyl)-N-(4-formylphenyl) glycine, N-(carboxymethyl)-N-ethylanthranilic acid, N-(carboxymethyl)-N-propylanthranilic acid, 5-bromo-N-(carboxymethyl) anthranilic acid, N-(2-carboxyphenyl) glycine, o-dianisidine-N,N,N',N'-tetraacetic acid, N,N'-[1,2-ethanediylbis (oxy-2,1-phenylene)]bis[N-(carboxymethyl) glycine], 4-carboxyphenoxy acetic acid, cathecol-O,O'-diacetic acid, 4-methylcatechol-O,O'-diacetic acid, resorcinol-O,O'-diacetic acid, hydroquinone-O,O'-diacetic acid, α-carboxy-o-anisic acid, 4,4'-isopropylidene diphenoxy acetic acid, 2,2'-(dibenzofuran-2,8-diyldioxy) diacetic acid, 2-(carboxymethylthio) benzoic acid, 5-amino-2-(carboxymethylthio) benzoic acid, and 3-[(carboxymethyl)thio]-2-naphthalene carboxylic acid.

In particular, N-arylpolycarboxylic acids represented by the following formula (V) or compounds represented by the following formula (VI) are preferable.

(V)

In formula (V), Ar represents a monosubstituted, polysubstituted or unsubstituted aryl group, and m is an integer from 1 to 5.

Examples of a substituent which can be introduced into the aryl group include a $C_1$ to $C_3$ alkyl group, a $C_1$ to $C_3$ alkoxy group, a $C_1$ to $C_3$ thioalkyl group and a halogen atom. This aryl group preferably has 1 to 3 identical or different substituents. m is preferably 1, and Ar preferably represents a phenyl group.

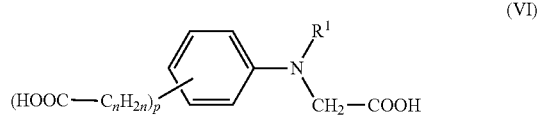

(VI)

In formula (VI), $R^1$ represents a hydrogen atom or a $C_1$ to $C_6$ alkyl group, and each of n and p is an integer from 1 to 5.

n is preferably 1, and $R^1$ is preferably a hydrogen atom. The most preferable polycarboxylic acid is anilinodiacetic acid.

Another compound preferable for improving sensitivity and/or developability is a compound having two or more groups selected from carboxylic acid groups and sulfonic acid groups, and specific examples thereof include 5-aminoisophthalic acid, 5-nitroisophthalic acid, 4-methylphthalic acid, terephthalic acid, 2-bromoterephthalic acid, 2,3-naphthalenedicarboxylic acid, diphenic acid, 1,4,5,8-naphthalenetetracarboxylic acid, N-benzyliminodiacetic acid, N-(2-carboxyphenylglycine), N-phenyliminodiacetic acid, 1,3,5-benzenetricarboxylic acid, 1,2,4,5-benzenetetracarboxylic acid, 5-sulfosalicylic acid, 2-sulfobenzoic acid, 1,5-naphthalenedisulfonic acid, and 4-sulfophthalic acid. The above compound can be further substituted by an alkyl group, an alkenyl group, an alkynyl group, a cyano group, a halogen atom, a hydroxyl group, a carboxyl group, a carbonyl group, an alkoxy group, an amino group, an amide group, a thiol group, a thioalkoxy group, or a sulfonyl group.

Among those described above, the most preferable compound is a compound represented by the formula (V) or (VI). The amount of such poly(carboxylic acid/sulfonic acid) compound to be added is preferably 0.5 to 15 mass %, more preferably 1 to 10 mass %, still more preferably 3 to 8 mass %, based on the solid content of the polymerizable composition.

A large number of more specific examples of these co-sensitizers are described, for example, in JP-A No. 9-236913 as additives for improving sensitivity, and such compounds can also be used in the invention.

Only one co-sensitizer, or a combination of two or more co-sensitizers, may be used. The amount of the co-sensitizer to be used may be in a range of 0.05 to 100 parts by mass, preferably 1 to 80 parts by mass, more preferably 3 to 50 parts by mass, relative to 100 parts by mass of the polymerizable compound (A).

(E-2) Polymerization Inhibitor

In the invention, in addition to the basic components described above, a small amount of a heat-polymerization inhibitor is preferably added so as to inhibit unnecessary heat polymerization of the polymerizable compound during production or storage of the composition used in the recording layer. Suitable examples of the heat-polymerization inhibitor include hydroquinone, p-methoxyphenol, di-t-butyl-p-cresol, pyrogallol, t-butyl catechol, benzoquinone, 4,4'-thiobis(3-methyl-6-t-butyl phenol), 2,2'-methylene bis(4-methyl-6-t-butyl phenol), and N-nitrosophenyl hydroxylamine primary cerium salts. The amount of the heat-polymerization inhibitor to be added is preferably about 0.01 mass % to about 5 mass % relative to the mass of the entire composition. To prevent the polymerization inhibition by oxygen, a higher fatty acid derivative such as behenic acid or behenic amide may be added as necessary so that the higher fatty acid derivative localizes on the surface of the recording layer in the drying process after application onto a support etc. during the production process of the planographic printing plate precursor. The amount of the higher fatty acid derivative to be added is preferably about 0.5 mass % to about 10 mass % based on the entire composition.

(E-3) Colorant etc.

A dye or pigment may be added to the planographic printing plate precursor according to the invention, for the purpose of coloring its recording layer. The plate-checking property of the printing plate, such as visibility after plate-making and compatibility with an image densitometer, can thereby be improved. The colorant is preferably a pigment since many dyes lower the sensitivity of the photopolymerizable recording layer. Examples of the colorant include pigments such as phthalocyanine pigments, azo pigments, carbon black and titanium oxide, and dyes such as Ethyl Violet, Crystal Violet, azo dyes, anthraquinone dyes and cyanine dyes. The amount of the dyes and pigments to be added is preferably about 0.5 mass % to about 5 mass % based on the entire composition.

(E-4) Other Additives

The planographic printing plate precursor of the invention may further contain other known additives such as an inorganic filler in order to improve the physical property of the cured film, a plasticizer, and an oil-sensitizing agent for improving the ink settlement on the surface of the recording layer.

Examples of the plasticizer include dioctyl phthalate, didodecyl phthalate, triethyleneglycol dicaprylate, dimethylglycol phthalate, tricresyl phosphate, dioxtyl adipate, dibutyl sebacate, and triacetylglycerol. In the case where a binder is used, the plasticizer may be added in an amount of 10% by mass or lower with respect to the total mass of a compound having an ethylenically unsaturated bond and the binder.

Further, the below-described additives such as a UV initiator and a heat crosslinking agent may be added for enhancing the effect of heating and light exposure after development to improve the film strength (printing durability).

In addition, other additives or an intermediate layer may be used to improve the adhesiveness between the recording layer and support, and enhance the development removability of the light-unexposed recording layer. For example, the adhesiveness and printing durability can be improved by adding or undercoating with a compound which relatively strongly interacts with a support, such as a compound having a diazonium structure or a phosphonate compound, and the developability in the non-image region and stain resistance can be improved by adding or undercoating with a hydrophilic polymer such as polyacrylic acid or polysulfone acid.

The planographic printing plate precursor is produced by dissolving coating solution components for forming intended layers such as a recording layer and a protective layer in appropriate solvents, and applying the coating solutions on an appropriate support.

Examples of the solvent to be used include acetone, methylethylketone, cyclohexane, ethylacetate, ethylene dichloride, tetrahydro furan, toluene, ethylene glycol monomethylether, ethylene glycol monoethylether, ethylene glycol dimethylether, propylene glycol monomethylether, propylene glycol monoethylether, acetylacetone, cyclohexanone, diacetone alcohol, ethylene glycol monomethylether acetate, ethylene glycol ethylether acetate, ethylene glycol monoisopropylether, ethylene glycol monobutylether acetate, 3-methoxypropanol, methoxymethoxyethanol, diethylene glycol monomethylether, diethylene glycol monoethylether, diethylene glycol dimethylether, diethylene glycol diethylether, propylene glycol monomethylether acetate, propylene glycol monoethylether acetate, 3-methoxypropyl acetate, N,N-dimethylformamide, dimethylsulfoxide, α-butyrolactone, methyl lactate, and ethyl lactate. These solvents may be used alone or as a mixture. The concentration of the solid content in a coating solution is preferably from 2 to 50% by mass.

It is preferable that the coating amount of the recording layer on the support be selected as appropriate according to the intended use in consideration of the sensitivity and developability of the recording layer, strength of the light-exposed film, printing durability, and other influences. If the coating amount is too small, the printing durability is insufficient, and if excessive, the sensitivity decreases, which results in prolongation of the time necessary for light exposure and developing treatment. The coating amount on the planographic printing plate precursor of the invention is preferably in a range of fom about 0.1 to about 10 g/m$^2$, and more preferably fom 0.5 to 5 g/m$^2$ at a mass after drying.

(Resin Intermediate Layer)

In the planographic printing plate precursor according to the invention, a resin intermediate layer including an alkali-soluble polymer can be arranged as necessary between the recording layer and the support.

When the recording layer that is an infrared light-sensitive layer whose solubility in an alkali developer is decreased upon exposure to light is disposed as a light exposure surface or in the vicinity thereof, the sensitivity to an infrared laser light is improved. Further, the resin intermediate layer between the support and the infrared light-sensitive recording layer acts as a heat insulating layer, thereby preventing heat generated upon exposure to infrared laser light from diffusing in the support. Therefore, the heat is used effectively, and the sensitivity can be heightened.

It is estimated that in a light-exposed portion, the photosensitive layer (recording layer) made impermeable to an alkali developer functions as a protective layer for the resin intermediate layer, thus improving development stability, forming an image excellent in discrimination and securing stability with time, while in a light-unexposed portion, an unhardened binder component is rapidly dissolved and dispersed in a developer. Since the resin intermediate layer provided adjacent to the support is made of an alkali-soluble polymer, the resin intermediate layer is excellent in solubility in a developer, and is rapidly dissolved to attain excellent developability without generating a remaining layer even if, for example, a developer having lowered activity is used.

<Support>

The support used in the invention may be paper, a polyester film or an aluminum plate, among which an aluminum plate is particularly preferable because it is excellent in dimensional stability, is relatively inexpensive, can provide a surface excellent in hydrophilicity and strength by performing surface treatment as necessary. A composite sheet having an aluminum sheet bonded to a polyethylene terephthalate film, as described in JP-B No. 48-18327, is also preferable.

The aluminum plate as used herein is a dimensionally stable metal plate including aluminum as a major component, and the scope of the aluminum plate includes not only a pure aluminum plate but also an alloy plate including aluminum as a major component and a very small amount of hetero elements, and a plastic film or paper having aluminum (alloy) laminated or vapor-deposited thereon. In the following description, supports made of aluminum or aluminum alloys are referred to collectively as aluminum supports. Examples of the hetero elements contained in the aluminum alloy include silicon, iron, manganese, copper, magnesium, chromium, zinc, bismuth, nickel, and titanium. The content of the hetero elements in the alloy is 10 mass % or less. A pure aluminum plate is particularly preferable, but because production of completely pure aluminum is difficult from the viewpoint of refining techniques, aluminum may contain a very small amount of hetero elements. The composition of the aluminum plate is not limited, and any aluminum plates made of known and conventionally used aluminum materials such as JIS A 1050, JIS A 1100, JIS A 3103 and JIS A 3005 can be used as necessary.

The thickness of the aluminum support is from about 0.1 to about 0.6 mm. This thickness can be suitably changed depending on the size of a printing machine, the size of a printing plate, and user's requests.

The aluminum support may be subjected to the following surface treatment to make it hydrophilic.

(Surface Roughening Treatment)

Examples of the surface roughening treatment include mechanical roughening, chemical etching and electrolytic grain as disclosed in JP-A No. 56-28893. Other examples include an electrochemical surface roughening method of electrochemically roughening the surface in a hydrochloric acid or nitric acid electrolytic solution, and mechanical surface roughening methods such as a wire brush grain method of scratching an aluminum surface with a metallic wire, a pole grain method of graining an aluminum surface with abrasive grains and an abrasive, or a brush grain method of roughening the surface with a nylon brush and an abrasive. Only one of these surface roughening methods may be used, or a combination of two or more of these surface roughening methods may be used. Among these methods, the electrochemical method of roughening the surface chemically in a hydrochloric acid or nitric acid electrolytic solution is particularly useful in surface roughening. The anode time electricity is preferably in a range of 50 to 400 C/dm$^2$. Specifically, it is preferable to conduct alternating current and/or direct current electrolysis at a temperature of 20 to 80° C., for 1 second to 30 minutes with a current density of 100 to 400 C/dm$^2$ in an electrolytic solution containing 0.1 to 50% hydrochloric acid or nitric acid.

The aluminum support thus surface-roughened may be etched chemically with acid or alkali. Preferable examples of the etching agent to be used include sodium hydroxide, sodium carbonate, sodium aluminate, sodium metasilicate, sodium phosphate, potassium hydroxide, lithium hydroxide etc., and the concentration and temperature are preferably in a range of from 1 to 50% and fom 20 to 100° C., respectively. After etching, washing with acid may be carried out to remove blemish (smuts) remaining on the surface. Examples of the acid to be used include nitric acid, sulfuric acid, phosphoric acid, chromic acid, fluoric acid and hydrofluoboric acid. The method of removing smuts after electrochemical surface roughening treatment is preferably a method of contacting with from 15 to 65% by mass sulfuric acid at a temperature of from 50 to 90° C. as described in JP-A No. 53-12739 or a method of alkali etching as described in JP-B No. 48-28123. The method and conditions are not particularly limited as long as the surface roughness Ra of the treated surface is about 0.2 to 0.5 μm after the treatment.

(Anodizing Treatment)

The thus treated aluminum support having an oxide layer formed thereon is then subjected to anodizing treatment.

In the anodizing treatment, an aqueous solution of sulfuric acid, phosphoric acid, oxalic acid or boric acid-sodium borate, or an aqueous solution of a combination of two or more of such substances, can be used as the major component in an electrolytic bath. In this case, the electrolytic solution may naturally contain at least components usually contained in the Al alloy plate, the electrodes, tap water and underground water. Second and third components may also be contained. The range of the second and third components include, for example, cations of metals such as Na, K, Mg, Li, Ca, Ti, Al, V, Cr, Mn, Fe, Co, Ni, Cu and Zn, ammonium ions, and anions such as nitrate ion, carbonate ion, chlorine ion, phosphate ion, fluorine ion, sulfite ion, titanate ion, silicate ion and borate ion, and the concentration thereof may be from about 0 to 10000 ppm. Although the conditions for the anodizing treatment are not particularly limited, the plate is preferably treated with 30 to 500 g/L solution at a temperature of 10 to 70° C. by direct current or alternating current electrolysis in a range of a current density of 0.1 to 40 A/m$^2$. The thickness of the anodized layer formed may be in a range of 0.5 to 1.5 μm. Preferably, the thickness is in a range of 0.5 to 1.0 μm. The treatment conditions are preferably selected such that the pore diameter of micropores present in the anodized layer formed on the support by the treatment described above is 5 to 10 nm and such that the pore density is $8 \times 10^1$ to $2 \times 10^{16}$ pores/m$^2$.

The treatment for imparting hydrophilicity to the surface of the support may be selected from various known methods. The treatment is particularly preferably hydrophilicity-imparting treatment with a silicate, polyvinylphosphonic acid, or the like. The obtained layer may have a Si or P element content of 2 to 40 mg/m$^2$, preferably 4 to 30 mg/m$^2$. The coating amount can be measured by fluorescence X ray analysis.

In the hydrophilicity-imparting treatment, the aluminum support having an anodized layer formed thereon is dipped in an aqueous solution at pH 10 to 13 (determined at 25° C.) containing an alkali metal silicate or polyvinylphosphonic acid in an amount of 1 to 30 mass %, more preferably 2 to 15 mass %, for example at 15 to 80° C. for 0.5 to 120 seconds.

As the alkali metal silicate used in the treatment for imparting hydrophilicity, sodium silicate, potassium silicate, lithium silicate, or the like is used. The hydroxide used for raising the pH value of the aqueous alkali metal silicate solution may be sodium hydroxide, potassium hydroxide, lithium hydroxide, or the like. Alkaline earth metal salts or the group IVB metal salts may be incorporated into the treating solution described above. Examples of the alkaline earth metal salts include nitrates such as calcium nitrate, strontium nitrate, magnesium nitrate and barium nitrate, and water-soluble salts such as sulfate, hydrochloride, phosphate, acetate, oxalate and borate. Examples of the group IVB metal salts include titanium tetrachloride, titanium trichloride, titanium potassium fluoride, titanium potassium oxalate, titanium sulfate, titanium tetraiodide, zirconium chloride oxide, zirconium dioxide, zirconium oxychloride, and zirconium tetrachloride.

In an embodiment, only one selected from alkaline earth metal salts and group IVB metal salts is used. In another embodiment, a combination of two or more selected from alkaline earth metal salts and group IVB metal salts is used. The amount of these metal salts is preferably in a range of from 0.01 to 10% by mass, more preferably from 0.05 to 5.0% by mass. Electrodeposition with silicate as described in U.S. Pat. No. 3,658,662 is also effective. A surface treatment which is a combination of a support which has been subjected to electrolytic graining as disclosed in JP-B No. 46-27481, JP-A No. 52-58602 and JP-A No. 52-30503, and the anodizing treatment and the hydrophilicity-imparting treatment described above, is also useful.

[Production of the Planographic Printing Plate Precursor]

The planographic printing plate precursor according to the invention may have the recording layer and the specific protective layer described above on this order on a support and may be provided if necessary with an intermediate layer (undercoat layer) etc. Such a planographic printing plate precursor can be produced by applying coating liquids containing the respective components sequentially onto a support.

When the recording layer is formed by coating, the recording layer components are dissolved in an organic solvent, which may be selected from various organic solvents, to form a recording layer coating liquid. The recording layer coating liquid is then applied onto the support or the undercoat layer.

Examples of the solvent to be used for the recording layer coating liquid include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethyl formamide, dimethyl sulfoxide, α-butyrolactone, methyl lactate and ethyl lactate. The solvent to be used may include only one of these solvents or a mixture of two or more of these solvents. A suitable solids content of the recording layer coating liquid is from 2 to 50 mass %.

The coating amount of the recording layer can mainly influence the sensitivity of the recording layer, the strength of the light-exposed layer, developability, and the printing durability of the resultant printing plate, and is desirably selected in accordance with the application. In the case of the planographic printing plate precursor for scanning exposure, the coating amount in terms of the mass of the recording layer after drying is preferably in a range of from about 0.1 g/m$^2$ to about 10 g/m$^2$, more preferably from 0.5 to 5 g/m$^2$.

[Intermediate Layer (Undercoat Layer)]

For the purpose of improving the adhesiveness between the recording layer and the support and stain resistance, the planographic printing plate precursor may have an intermediate layer (undercoat layer). Specific examples of the intermediate layer include those described in JP-B No. 50-7481, JP-A No. 54-72104, JP-A No. 59-101651, JP-A No. 60-149491, JP-A No. 60-232998, JP-A3-56177, JP-A No. 4-282637, JP-A No. 5-16558, JP-A No. 5-246171, JP-A No. 7-159983, JP-A No. 7-314937, JP-A No. 8-202025, JP-A No. 8-320551, JP-A No. 9-34104, JP-A No. 9-236911, JP-A No. 9-269593, JP-A No. 10-69092, JP-A No. 10-115931, JP-A No. 10-161317, JP-A No. 10-260536, JP-A No. 10-282682, JP-A No. 11-84674, JP-A No. 10-69092, JP-A No. 10-115931, JP-A No. 11-38635, JP-A No. 11-38629, JP-A No. 10-282645, JP-A No. 10-301262, JP-A No. 11-24277, JP-A No. 11-109641, JP-A No. 10-319600, JP-A No. 11-84674, JP-A No. 11-327152, JP-A No. 2000-10292, JP-A No. 2000-235254, JP-A No. 2000-352854, JP-A No. 2001-209170, JP-A No. 2001-175001 etc.

[Support]

As the support used in the invention, a hydrophilized support is used as described hereinafter. The support is preferably paper, a polyester film, or an aluminum plate, and more preferably an aluminum plate, which is superior in dimensional stability and relatively cheap, and whose surface can be provided with superior hydrophilicity and strength by surface treatment as needed. In addition, the support is also preferably a composite sheet in which an aluminum sheet is laminated on a polyethylene terephthalate film, such as those disclosed in JP-B No. 48-18327.

The aluminum plate as particularly preferable support in the invention is a metal plate containing aluminum, which has dimensional stability, as the primary component thereof, and examples thereof include a pure aluminum plate, an alloy plate containing aluminum as the primary component and a trace amount of element(s) other than aluminum, and plastic films and paper on which aluminum or an aluminum alloy is laminated or vapor-deposited. A support made of aluminum or an aluminum alloy described above is called as an aluminum support hereinafter. Examples of elements other than aluminum that may be contained in the aluminum alloy include silicon, iron, manganese, copper, magnesium, chromium, zinc, bismuth, nickel, and titanium. The content of such an element or elements in the alloy is 10% by mass or less. The support in the invention is most preferably a pure aluminum support. However, it is difficult to prepare completely pure aluminum because of problems regarding a purifying process. Therefore, the aluminum plate may contain a trace amount of elements other than aluminum. As described above, the composition of the aluminum plate to be used in the invention is not particularly limited, and any of aluminum plates which are known and used in the art, for example, those satisfying requirements stipulated in JIS A1050, A1100, A3103, or A3005, may be appropriately used.

The thickness of the aluminum support for use in the invention is about 0.1 mm to about 0.6 mm. The thickness may be suitably changed according to the size of printing machine, the dimension of printing plate, and needs by users.

The surface of the aluminum support used in the invention may be subjected to treatment described hereinafter and be hydrophilized, if necessary.

(Surface Roughening Treatment)

The surface of the aluminum support may be roughened. Examples of a method for roughening a surface include mechanical surface roughening, chemical etching, and electrolytic graining disclosed in JP-A No. 56-28893; an electrochemical surface roughening method of electrochemically roughening a surface in a hydrochloric acid or nitric acid electrolyte; and a mechanical surface roughening method such as a wire brush graining method of scratching an aluminum surface with a metal wire, a ball graining method of roughening an aluminum surface with a polishing ball and an abrasive, and a brush graining method of roughening a surface with a nylon brush and an abrasive. One of these roughening methods or a combination of two or more of them can be conducted. The surface roughening method is preferably an electrochemical method of chemically roughening a surface in a hydrochloric or nitric acid electrolyte. The suitable amount of electric current is in the range of 50 to 400 C/dm$^2$, when the support serves as an anode. More specifically, alternate and/or direct current electrolysis is preferably carried out in an electrolyte having a hydrochloric or nitric acid content of 0.1 to 50% at a temperature in a range of 20 to 80° C. at an electric current density of 100 to 400 C/dm$^2$ for one second to 30 minutes.

The aluminum support whose surface has been roughened may be chemically etched in an acid or alkaline solution. Typical examples of an etching agent include sodium hydroxide, sodium carbonate, sodium aluminate, sodium metasilicate, sodium phosphate, potassium hydroxide, and lithium hydroxide. The concentration and the temperature of the etching agent are preferably 1 to 50%, and 20 to 100° C., respectively. In order to remove stains which remains on the etched surface (smuts), the support is washed with acid. Typical examples of the acid used include nitric acid, sulfuric acid, phosphoric acid, chromic acid, hydrofluoric acid, and borofluoric acid. A method for removing smuts on a surface electrochemically roughened is preferably a method described in JP-A No. 53-12739 in which a surface is brought into contact with 15 to 65% by mass of sulfuric acid at a temperature in a range of 50 to 90° C., and a method described in JP-B 48-28123 in which a surface is etched with alkali. The method and conditions are not particularly limited, as long as the surface roughness of the roughened surface Ra is about 0.2 to 0.5 μm.

(Anodizing Treatment)

The aluminum support which has been treated above and has an oxide layer thereon is then anodized.

In the anodizing treatment, one or more aqueous solutions of sulfuric acid, phosphoric acid, oxalic acid, and boric acid/sodium borate are used as the main component of an electrolytic solution. The electrolyte solution may contain other components commonly found in aluminum alloy plates, electrodes, tap water, and underground water. The electrolyte solution may also contain a second component and may further contain a third component. Examples of the second and third components include cations including ions of metals such as Na, K, Mg, Li, Ca, Ti, Al, V, Cr, Mn, Fe, Co, Ni, Cu, and Zn, and an ammonium ion; and anions such as nitrate, carbonate, chloride, phosphate, fluoride, sulfite, titanate, silicate, and borate ions. The concentration of the second and third components is preferably about 0 to 10,000 ppm. Although the conditions for the anodizing treatment are not particularly limited, the treatment is preferably performed by direct or alternating current electrolysis at a content of an acid commonly used as the main component of the electrolyte solution of 30 to 500 g/liter, at an electrolyte solution temperature of 10 to 70° C. and at an electric current density in the range of 0.1 to 40 A/m$^2$. The thickness of the resultant anodic oxidation film is in a range of 0.5 to 1.5 μm, and preferably in a range of 0.5 to 1.0 μm. The conditions for the treatment are preferably selected such that the anodic oxidation film formed on the treated support has micropores having a size of 5 to 10 nm and a pore density of $8 \times 10^{15}$ to $2 \times 10^{16}$ pores/m$^2$.

A treatment for imparting hydrophilicity to the surface of the support can be any of known methods. A treatment for imparting hydrophilicity with silicate or polyvinylphosphonic acid is particularly preferably conducted. The film is formed such that the amount of a silicon or phosphorus element is 2 to 40 mg/m$^2$, preferably 4 to 30 mg/m$^2$. The coated amount may be measured by a fluorescent X-ray analysis method.

The treatment for imparting hydrophilicity is performed, for example, by immersing the aluminum support having thereon an anodic oxidation film in an aqueous solution containing 1 to 30% by mass, preferably 2 to 15% by mass, of alkali metal silicate or polyvinylphosphonic acid, having, at 25° C., a pH of 10 to 13 and kept at a temperature in the range of 15 to 80° C. for 0.5 to 120 seconds.

The alkali metal silicate salt used in the hydrophilizing treatment can be sodium silicate, potassium silicate, and/or lithium silicate. Hydroxides are used to raise the pH of the solution of the alkali metal silicate salt, and examples thereof include sodium hydroxide, potassium hydroxide, and lithium hydroxide. An alkaline earth metal salt or a salt including a metal of Group IVB may be added to the treatment solution. Examples of the alkaline earth metal salt include water-soluble salts including nitrates such as calcium nitrate, strontium nitrate, magnesium nitrate, and barium nitrate, sulfates, hydrochlorides, phosphates, acetates, oxalates, and borates. Examples of the salt including a metal of Group IVB include titanium tetrachloride, titanium trichloride, titanium potassium fluoride, titanium potassium oxalate, titanium sulfate, titanium tetraidodide, zirconium oxychloride, zirconium dioxide, and zirconium tetrachloride.

One of the alkaline earth metal salts and the salts each including a metal of Group IVB may be used or two or more of them can be used together. The content of the metal salt is preferably 0.01 to 10% by mass, and more preferably 0.05 to 5.0% by mass. Moreover, silicate electrodeposition as described in U.S. Pat. No. 3,658,662 is also effective. Surface treatment in which a support electrolytically grained as disclosed in JP-B No. 46-27481, JP-A Nos. 52-58602 or 52-30503, and the anodizing treatment and the treatment for imparting hydrophilicity described above are combined with each other is also useful.

(Rear Surface Treatment of Support)

The planographic printing plate precursor of the invention is preferably subjected to the modification of the rear surface of the support for further improving the scratch resistance. When an aluminum support is used, examples of the method for modifying the rear surface of the support include a method of forming a uniformly anodized film on the rear surface of an aluminum support in the same manner as the recording layer side, and a method of forming a back coat layer. In the case where an anodized film is formed, the amount of the film is preferably 0.6 g/m$^2$ or more, and more preferably 0.7 to 6 g/m$^2$. Among them, a method of providing a back coat layer is more effective and preferable. These rear surface treatment methods are described below.

(1. Formation of Rear Surface Anodized Film)

First, a method of forming a uniformly anodized film on the rear surface of an aluminum support in the same manner as the recording layer side is described. The anodized film is formed by the same means as that used for the surface treatment of the support. The thickness of the anodized film provided on the rear surface of the support is preferably 0.6 g/m$^2$ or more, and is not particularly limited as to the upper limit from the viewpoint of performance. However, in consideration of energy such as electric power and time required for forming the film, the upper limit is about 6 g/m$^2$. The coating amount is preferably 0.7 g to 6 g/m$^2$, and more preferably 1.0 g to 3 g/m$^2$ from the practical viewpoint.

The amount of the anodized film may be determined by measuring the peak of $Al_2O_3$ using fluorescent X-ray, and converting the peak height into the coating amount on the basis of the calibration curve.

In the invention, whether an anodized film is provided on the entire surface of the aluminum support side in an amount of 0.6 g/m$^2$ or more is confirmed by the fact that the coating amount of the anodized film on the surface of the aluminum support of the planographic printing plate precursor which surface is opposite to the recording layer side is 0.6 g/m$^2$ or more at the center of the film and at portions that is 5 cm off from both ends on the plane which passes through the center and is orthogonal to the machine direction of the planographic printing plate precursor.

(2. Formation of Back Coat Layer)

Next, a method for providing a back coat layer on the rear surface of the aluminum support is described. The back coat layer in the invention may have any composition. Preferable examples of the back coat layer include a back coat layer containing a metal oxide prepared through hydrolysis and polycondensation of the below-described organic metal compound or inorganic metal compound, and colloidal silica sol, and a back coat layer composed of an organic resin film.

(2-1. Back Coat Layer Containing Metal Oxide and Colloidal Silica Sol)

A preferable first aspect of the back coat layer in the invention is a back coat layer containing a metal oxide and colloidal silica sol.

More specifically, the back coat layer is more preferably formed from a so-called sol-gel reaction liquid, in which an organic or inorganic metal compound is hydrolyzed or polycondensed in water and an organic solvent in the presence of a catalyst such as an acid or alkali.

Examples of the organic or inorganic metal compound used to form the back coat layer include metal alkoxides, metal acetylacetonates, metal acetates, metal oxalates, metal nitrates, metal sulfates, metal carbonates, metal oxychlorides, metal chlorides, and condensates thereof prepared through partial hydrolysis and oligomerization.

A metal alkoxide is represented by formula M(OR)N (wherein M represents a metal element, R represents an alkyl group, and n represents the oxidation number of the metal element). Specific examples thereof include $Si(OCH_3)_4$, $Si(OC_2H_5)_4$, $Si(OC_3H_7)$, $Si(OC_4H_9)_4$, $Al(OCH_3)_3$, $Al(OC_2H_5)_3$, $Al(OC_3H_7)_3$, $Al(OC_4H_9)_3$, $B(OCH_3)_3$, $B(OC_2H_5)_3$, $B(OC_3H_7)_3$, $B(OC_4H_9)_3$, $Ti(OCH_3)_4$, $Ti(OC_2H_5)_4$, $Ti(OC_3H_7)_4$, $Ti(OC_4H_9)_4$, $Zr(OCH_3)_4$, $Zr(OC_2H_5)_4$, $Zr(OC_3H_7)_4$, and $Zr(OC_4H_9)_4$, and other examples include alkoxides of Ge, Li, Na, Fe, Ga, Mg, P, Sb, Sn, Ta, and V, and monosubstituted silicon alkoxides of $CH_3Si(OCH_3)_3$, $C_2H_5Si(OCH_3)_3$, $CH_3Si(OC_2H_5)_3$, and $C_2H_5Si(OC_2H_5)_3$.

One of these organic or inorganic metal compounds may be used alone, or two or more of them can be used together. Among these organic or inorganic metal compounds, metal alkoxides are preferable because they are highly reactive and readily form polymers having metal-oxygen bonds. Among them, alkoxide compounds of silicon such as $Si(OCH_3)_4$, $Si(OC_2H_5)_4$, $Si(OC_3H_7)$, and $Si(OC_4H_9)_4$ are particularly preferable because they are inexpensive and readily available, and forms a exellent coating layer of a metal oxide. Also preferable are oligomers prepared through partially hydrolyzing and condensing these silicon alkoxide compounds. Examples thereof include ethyl silicate oligomers (average pentamer) containing about 40% by mass of $SiO_2$.

Other preferable examples include a combination of a metal alkoxide and a so-called silane coupling agent in which one or two alkoxy groups of the above-described silicon tetraalkoxy compound has been substituted with an alkyl group or a group having reactivity. Examples of the silane coupling agent added to the back coat layer in the invention include silane coupling agents in which one or two alkoxy groups of the above-described silicon tetraalkoxy compound has been substituted with a hydrophobic substituent such as a long-chain alkyl group having 4 to 20 carbon atoms or fluorine-substituted alkyl group. Among them, silane coupling agents having a fluorine-substituted alkyl group is particularly preferable. Specific examples of the silane coupling agent include $CF_3CH_2CH_2Si(OCH_3)_3$, $CF_3CF_2CH_2CH_2Si(OCH_3)_3$, and $CF_3CH_2CH_2Si(OC_2H_5)_3$, and commercical products such as LS-1090 (manufactured by Shin-Etsu Chemical Co., Ltd.). The above-described silane coupling agents substituted with a fluorine-substituted alkyl group are included in the scope of the organic fluorine compounds in the invention. The content of the silane coupling agent(s) is preferably 5 to 90% by mass, and more preferably 10 to 80% by mass with respect to the total solid content of the back coat layer.

The catalyst useful for forming the sol-gel coating liquid for the back coat layer is an organic or inorganic acid or alkali. Specific examples thereof include inorganic acids such as hydrochloric acid, sulfuric acid, sulfurous acid, nitric acid, nitrous acid, hydrogen fluoride, phosphoric acid, and phosphorous acid, organic acids such as formic acid, acetic acid, propionic acid, butyric acid, glycollic acid, chloroacetic acid, dichloroacetic acid, trichloroacetic acid, fluoroacetic acid, bromoacetic acid, methoxyacetic acid, oxaloacetic acid, citric acid, oxalic acid, succinic acid, malic acid, tartaric acid, fumaric acid, maleic acid, malonic acid, ascorbic acid, benzoic acid, substituted benzoic acid such as 3,4-dimethoxybenzoic acid, phenoxyacetic acid, phthalic acid, picric acid, nicotinic acid, picolinic acid, pyrazine, pyrazole, dipicolinic acid, adipic acid, p-toluic acid, terephthalic acid, 1,4-cyclohexene-2,2-dicarboxylic acid, erucic acid, lauric acid, and n-undecanoic acid, and alkalis such as hydroxides of alkali metals and alkaline earth metals, ammonia, ethanolamine, diethanolamine, and triethanolamine.

Other preferable examples of the catalyst include organic acids such as sulfonic acids, sulfinic acids, alkyl sulfuric acids, phosphonic acids, and phosphates, and specific examples thereof include p-toluenesulfonic acid, dodecylbenzenesulfonic acid, p-toluenesulfinic acid, ethyl acid, phenylphosphonic acid, phenylphosphine acid, phenyl phosphate, and diphenyl phosphate.

One of these catalysts may be used alone or two or more of them may be used together. The amount of the catalyst(s) is preferably 0.001 to 10% by mass, and more preferably 0.05 to 5% by mass with respect to the metal compound serving as a raw material. If the amount of the catalyst is below the range, the initiation of the sol-gel reaction is retarded. If the amount exceeds the range, the reaction rapidly proceeds to form nonuniform sol-gel particles, which results in a readily peelable coating layer.

The initiation of the sol-gel reaction requires an adequate amount of water. The addition amount of water is preferably 0.05- to 50-fold mol, and more preferably 0.5- to 30-fold mol with respect to the amount of water necessary for complete hydrolysis of the metal compound. If the amount of water is below the range, hydrolysis proceeds sluggishly. If the amount exceeds the range, the reaction proceeds sluggishly too, probably due to the ingredients being excessively diluted.

A solvent is further contained in the sol-gel reaction liquid. The solvent dissolves the metal compound serving as a raw material, and dissolves or disperses the sol-gel particles formed by the reaction. Examples of the solvent include lower alcohols such as methanol, ethanol, propanol, and butanol, and ketones such as acetone, methyl ethyl ketone, and diethyl ketone. In addition, in order to improve the properties of the coated surface of the back coat layer, mono or dialkyl ethers and acetates of glycols such as ethylene glycol, diethylene glycol, triethylene glycol, propylene glycol and dipropylene glycol may be added to the system. Among these solvents, water-miscible lower alcohols are preferable. The sol-gel reaction liquid is prepared using a solvent to have a concentration suitable to application. However, if the whole amount of the solvent is added to the reaction liquid at the outset, the hydrolysis reaction proceeds sluggishly probably due to excessive dilution of the ingredients. It is thus preferable that a portion of the solvent be added to the sol-gel reaction liquid, and the remainder of the solvent be added after the progress of the reaction.

The coating amount of the thus formed back coat layer containing a metal oxide and colloidal silica sol is preferably 0.01 to 3.0 $g/m^2$, and more preferably 0.03 to 1.0 $g/m^2$.

(2-2. Back Coat Layer Composed of Organic Resin Film)

Other preferable example of the back coat layer in the invention include a back coat layer composed of an organic resin film formed on the rear surface of the support.

In the present aspect, preferable examples of the resin capable of forming the back coat layer include thermosetting resins such as urea resins, epoxy resins, phenolic resins, melamine resins, and diallyl phthalate resins. Among them, from the viewpoint of forming a layer having a high physical strength, phenolic resins are preferable. Specific examples thereof include novolac resins and pyrogallol acetone resins such as a phenol formaldehyde resin, a m-cresol formaldehyde resin, a p-cresol formaldehyde resin, a m-/p-mixed cresol formaldehyde resin, a mixed phenol/cresol (m-, p-, or m-/p-mixed) formaldehyde resin.

Examples of the phenolic resin include condensation polymers of phenol having at least one alkyl group having 3 to 8 carbon atoms as the substituent and formaldehyde such as a t-butylphenol formaldehyde resin and an octylphenol formaldehyde resin as described in U.S. Pat. No. 4,123,279.

The weight-average molecular weight of the phenolic resin is preferably 500 or more, and more preferably 1,000 to 700,000 from the viewpoint of image forming ability. The number-average molecular weight of the resin is preferably 500 or more, and more preferably 750 to 650,000. The degree of dispersion (weight-average molecular weight/number-average molecular weight) of the resin is preferably 1.1 to 10.

One of these phenolic resins may be used alone or two or more of them can be used together. They may be combined with a condensation polymer of phenol having at least one alkyl group having 3 to 8 carbon atoms as the substituent and formaldehyde as described in U.S. Pat. No. 4,123,279, such as a condensation polymer of t-butylphenol and formaldehyde, or a condensation polymer of octylphenol and formaldehyde, or an organic resin having a phenol structure containing at least one electron-withdrawing group on an aromatic ring as described in JP-A No. 2000-241972, which was filed by the inventors.

The back coat layer in the invention may contain a surfactant for the purpose of improving the properties of the coated surface and controlling the physical properties of the surface. Examples of the surfactant include anionic surfactants having any one of carboxylate, sulfonate, sulfate, and phosphate; cationic surfactants such as aliphatic amines, quaternary ammonium salts; betaine-type amphoteric surfactants; nonionic surfactants such as fatty acid esters of polyoxy compounds, polyalkylene oxide condensates, and polyethylene imine condensates; and fluorinated surfactants. Among them, fluorinated surfactants are particularly preferable.

The addition amount of the surfactant(s) is appropriately selected according to the desired use, and usually in a range of 0.1 to 10.0% by mass of the back coat layer.

The fluorinated surfactant particularly preferably has, within the molecule thereof, a perfluoroalkyl group. Such a fluorinated surfactant is further described in detail below.

Examples of the fluorinated surfactant particularly preferably used in the back coat layer include anionic surfactants such as perfluoroalkyl carboxylates, perfluoroalkyl sulfonates, perfluoroalkyl phosphates, amphoteric surfactants such as perfluoroalkyl betaine, cationic surfactants such as perfluoroalkyl trimethyl ammonium salts, and nonionic surfactants such as perfluoroalkylamine oxide, perfluoroalkyl ethylene oxide adducts, oligomers containing a perfluoroalkyl group and a hydrophilic group, oligomers containing a perfluoroalkyl group and a lipophilic group, oligomers containing a perfluoroalkyl group, a hydrophilic group, and a lipophilic group, and urethanes containing a perfluoroalkyl group and a lipophilic group. In these surfactants, the fluoroaliphatic group is preferably a group represented by formula (1).

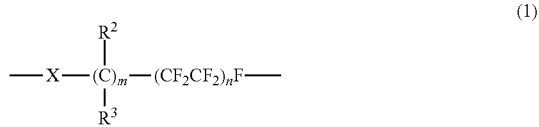

In formula (1), $R^2$ and $R^3$ each independently represent a hydrogen atom or an alkyl group having 1 to 4 carbon atoms, X represents a single bond or a divalent linking group selected from an alkylene group or an arylene group, m represents an integer of 0 or more, and n represents an integer of 1 or more.

In the case where X represents a divalent linking group, the linking group such as an alkylene group or an arylene group may be substituted, or contain in the structure thereof a linking group such as an ether group, an ester group, or an amide group. Examples of the substituent which may be introduced into the alkylene group or arylene group include a halogen atom, a hydroxy group, a mercapto group, a carboxyl group, an epoxy group, an alkyl group, and an aryl group, which may be further substituted. Among them, X is preferably an alkylene group, an arylene group, or an alkylene group having a linking group such as an ether group, an ester group, or an amide group, more preferably an unsubstituted alkylene group, an unsubstituted arylene group, or an alkylene group having therein an ether group or an ester group, and most preferably an unsubstituted alkylene group or an alkylene group having therein an ether group or an ester group.

It is preferable that such a fluorinated surfactant be contained in the back coat layer in a content of about 0.5 to 10% by mass.

Various methods are applicable to the application of the back coat layer composed of an organic resin film to the rear surface of an aluminum support. For example, a coating liquid is prepared by dissolving or emulsion-dispersing the back coat layer components, specifically ingredients composed mainly of an organic resin which optionally contain a silica gel or other fine particles, in an appropriate solvent, and the coating liquid is applied to the rear surface of the support, and dried. Alternatively, an organic resin film, which has been made into a film, is bonded to an aluminum support via an adhesive or by heating, or a molten film is formed with a melt extruder, and bonded to a support. Among them, the method of applying and drying a coating liquid is most preferable from the viewpoint of easy control of the coating amount. Examples of the solvent include organic solvents as described in JP-A No. 62-251739, which are used alone or as a mixture.

Examples of a device for applying a back coat layer coating liquid to a support surface include a bar coater, a roll coater, a gravure coater, and known metering and coating devices such as a curtain coater, an extruder, and a slide hopper. Among them, non-contact metering coaters such as a curtain coater, an extruder, and a slide hopper are particularly preferable because they will not give scratches on the rear surface of the aluminum support.

The thickness of the back coat layer in the invention which is a back coat layer containing a metal oxide and colloidal silica sol or a back coat layer composed of an organic resin is preferably in a range of 0.1 to 8 μm. When the thickness is within the range, the rear surface of the aluminum support has an improved surface lubricity, and a variation in the thickness of the back coat layer due to dissolution or swelling of the layer by chemicals during or in printing is suppressed, which also suppresses deterioration in printing property due to a variation in printing pressure.

Among the above-described back coat layers, the back coat layer composed of an organic resin is most preferable.

<Plate-Making Method>

Hereinafter, the method of making a plate from the planographic printing plate precursor according to the invention will be described.

In an embodiment of the method of making a plate from the planographic printing plate precursor, a plurality of the planographic printing plate precursors described above are stacked such that the protective layer directly contacts with the back surface of the support; the stack of the planographic printing plate precursors is then set in a plate setter and the planographic printing plate precursors are automatically conveyed one by one; each precursor is imagewise exposed to light having a wavelengths of 750 to 1400 nm; and then the precursor is developed to remove the non-image portion so that the plate-making process is completed. Even when the planographic printing plate precursors according to the invention are stacked without inserting interleaf paper between the precursors, the adhesion between the planographic printing plate precursors and flaws on the protective layer can be suppressed, and therefore, the planographic printing plate precursor can be applied to the plate-making method described above. According to this plate-making method, since the stack of the planographic printing plate precursors in which the precursors are stacked without using interleaf paper between the precursors is used, the process of removing interleaf paper is unnecessary, and thus the productivity in the plate-making process is improved.

As a matter of course, plate-making can be conducted using a stack in which the planographic printing plate precursors according to the invention and sheets of interleaf paper are stacked alternately.

[Light Exposure]

The method for light-exposing the planographic printing plate precursor composed of the image recording material of the invention may be freely selected from known methods.

The light source for light-exposing the image recording layer of the image recording material of the invention may be freely selected from known ones. Light sources having a wavelength of from 300 nm to 1200 nm may be used. Specifically various lasers may be used as the light source, and in particular a semiconductor laser emitting infrared rays having a wavelength of from 760 nm to 1200 nm is useful.

The light source is preferably a laser, and examples available laser beam sources having a wavelength of from 350 nm to 450 nm include the followings: gas lasers such as an Ar ion laser (364 nm, 351 nm, 10 mW to 1 W), a Kr ion laser (356 nm, 351 nm, 10 mW to 1 W), a He—Cd laser (441 nm, 325 nm, 1 mW to 100 mW); solid lasers such as a combination of Nd:YAG (YVO4) and SHG crystal×2 (355 nm, 5 mW to 1 W), and a combination of Cr:LiSAF and SHG crystal (430 nm, 10 mW); semiconductor lasers such as a KnbO$_3$ ring resonator (430 nm, 30 mW), a combination of a waveguide type wavelength converting element and AlGaAs and InGaAs semiconductos (380 nm to 450 nm, 5 mW to 100 mW), a combination of a waveguide type wavelength converting element and AlGaInP and AlGaAs semiconductos (300 nm to 350 nm, 5 mW to 100 mW) and AlGaInN (350 nm to 450 nm, 5 mW to 30 mW); and pulse lasers such as a N$_2$ laser (337 nm, pulse 0.1 to 10 mJ), and a XeF laser (351 nm, pulse 10 to 250 mJ).

Among them, particularly an AlGaInN semiconductor laser (commercially available InGaN semiconductor laser from 400 to 410 nm, 5 to 30 mW) is preferable from the viewpoints of wavelength property and cost.

Other examples of available light sources having a wavelength of 450 nm to 700 nm include an Ar$^+$ laser (488 nm), YAG-SHG laser (532 nm), a He—Ne laser (633 nm), a He—Cd laser, a red semiconductor laser (650 to 690 nm), and preferable examples of available light sources having a wavelength of 700 nm to 1200 nm include a semiconductor laser (800 to 850 nm), and a Nd-YAG laser (1064 nm).

Other examples of useful light sources include mercury lamps of ultrahigh pressure, high pressure, middle pressure, or low pressure, chemical lamps, carbon arc lamp, xenon lamps, metal halide lamps, ultraviolet laser lamps (e.g. an ArF excimer laser, a KrF excimer laser), various visible laser lamps, fluorescent lamps, tungsten lamps, solar light, and radiations such as electron beams, X rays, ion beams, and far infrared rays.

Among them, the light source of the rays used for the imagewise exposure of the image recording material according to the invention is preferably a light source having a luminescence wavelength in the near-infrared region to infrared region, and is particularly preferably a solid laser or a semiconductor laser.

The light exposure device may be any of internal drum system, external drum system, and flatbed system.

In particular, in the case where a light source having a wavelength of from 750 nm to 1400 nm is used for light exposure, the light source may be freely selected from those emitting rays having the wavelength. However, the imagewise exposure is preferably conducted by a solid laser or a semiconductor laser emitting infrared rays having a wavelength of from 750 nm to 1400 nm.

The laser preferably has an output of 100 mW or more, and preferably includes a multi-beam laser device for reducing the light exposure time. The light exposure time for one pixel is preferably 20µ seconds or shorter. The amount of radiation energy radiated per unit area of the planographic printing plate precursor is preferably from 10 to 300 mJ/cm$^2$.

The light exposure can be carried out by overlapping beams from a light source. The term "overlapping" means that exposure is conducted under such a condition that the sub-scanning pitch is smaller than the beam diameter. For example, when the beam diameter is expressed in terms of full-width at half-maximum (FWHM) of the beam intensity, overlapping can be quantitatively expressed in FWHM/sub-scanning pitch (overlapping coefficient). In the invention, the overlapping coefficient is preferably 0.1 or more.

The scanning system for a light source in the light exposure device is not particularly limited, and a drum outer surface scanning method, a drum inner surface scanning method, a flatbed scanning method, or the like can be used. The channel of the light source may be a single channel or a multi-channel, but in the case of the drum outer surface scanning method, a multi-channel is preferably used.

In plate-making, the planographic printing plate precursor according to the invention can be subjected to development treatment without carrying out special thermal treatment and/or water washing treatment usually conducted after exposure treatment. Because the thermal treatment is not carried out, image unevenness attributable to the thermal treatment can be prevented. Because the thermal treatment and/or water washing treatment is not carried out, stable high-speed treatment is possible in development treatment.

[Development]

The developer used for the developing treatment conducted after the light exposure treatment is further described below.

<Developer>

The developer used in the invention is not particularly limited, and is usually an aqueous alkali solution containing an alkaline chemical and having a pH of 14 or lower, preferably a pH from 9.0 to 13.0.

(Alkali Agent)

Examples of the alkali agent used in the developer include inorganic alkali agents such as tertiary sodium phosphate, tertiary potassium phosphate, tertiary ammonium phosphate, sodium borate, potassium borate, ammonium borate, sodium hydroxide, potassium hydroxide, ammonium hydroxide and lithium hydroxide, and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene imine, ethylene diamine, pyridine and tetramethyl ammonium hydroxide. Only one alkali agent may be used, or a combination of two or more alkali agents may be used.

Alkali agents other than those described above include alkali silicates. Alkali silicates may used in combination with a base. The alkali silicates to be used may be those showing alkalinity when dissolved in water, and examples thereof include sodium silicate, potassium silicate, lithium silicate and ammonium silicate. In an embodiment, only one alkali silicate is used. In another embodiment, a mixture of two or more alkali silicates is used.

When a silicate is used, the characteristics of the developer can be adjusted easily to the optimum range by controlling the mixing ratio and concentration of silicon oxide $SiO_2$ as silicate component and alkali oxide $M_2O$ (M is an alkali metal or an ammonium group) as alkali component. From the viewpoint of suppressing blemish attributable to excess dissolution (etching) of the anodized film on a support and inhibiting generation of insoluble gas attributable to formation of a complex of dissolved aluminum and a silicate, the mixing ratio of silicon oxide $SiO_2$ to alkali metal oxide $M_2O$ ($SiO_2/M_2O$ molar ratio) is preferably in a range of from 0.75 to 4.0, more preferably in a range of from 0.75 to 3.5.

Regarding the concentration of the alkali silicate salt in the developer, the amount of $SiO_2$ relative to the mass of the developer is preferably in a range of from 0.01 to 1 mol/L, more preferably from 0.05 to 0.8 mol/L from the viewpoint of inhibitory effects on dissolution (etching) of the anodized film on a support, developability, inhibitory effects on precipitation and crystallization, and inhibitory effects on gelling upon neutralization at the time of waste liquid treatment.

(Aromatic Anionic Surfactant)

The developer preferably contains an aromatic anionic surfactant from the viewpoint of the development accelerating effect, stabilization of a dispersion of the negative-working polymerizable recording layer components and protective layer components in the developer, and stabilization of development treatment.

The aromatic anionic surfactant is not particularly limited, but is preferably a compound represented by the following formula (A) or (B):

Formula (A)

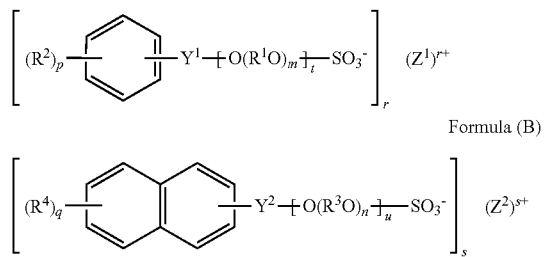

Formula (B)

In the formula (A) or (B) above, $R^1$ and $R^3$ each independently represent a linear or branched $C_1$ to $C_5$ alkylene group, and specific examples include an ethylene group, a propylene group, a butylene group and a pentylene group, among which an ethylene group and a propylene group are particularly preferable.

m and d each independently represent an integer from 1 to 100, and is preferably from 1 to 30, more preferably from 2 to 20. When m is 2 or greater, there are plural $R^1$s which may be the same as or different from each other. When n is 2 or greater, there are plural $R^3$s which may be the same as or different from each other.

t and u each independently represent 0 or 1.

$R^2$ and $R^4$ each independently represent a linear or branched $C_1$ to $C_{20}$ alkyl group, and specific examples include a methyl group, an ethyl group, a propyl group, a butyl group, a hexyl group and a dodecyl group, among which a methyl group, an ethyl group, an iso-propyl group, an n-propyl group, an n-butyl group, an iso-butyl group and a tert-butyl group are particularly preferable.

Each of p and q represents an integer from 0 to 2. Each of $Y^1$ and $Y^2$ represents a single bond or a $C_1$ to $C_{10}$ alkylene group and is preferably a single bond, a methylene group or an ethylene group, particularly preferably a single bond.

$(Z^1)^{r+}$ and $(Z^2)^{s+}$ each independently represent an alkali metal ion, an alkaline earth metal ion, unsubstituted ammonium ion or an ammonium ion substituted by an alkyl group. Specific examples include a lithium ion, a sodium ion, a potassium ion, a magnesium ion, a calcium ion, an ammonium ion, a secondary to quaternary ammonium ion substituted by an alkyl, aryl or aralkyl group having 20 or less carbon atoms. $(Z^1)^{r+}$ and $(Z^2)^{s+}$ each is particularly preferably a sodium ion. r and s each independently represent 1 or 2.

Specific examples of the aromatic anionic surfactant are shown below. However, the examples should not be construed as limiting the invention.

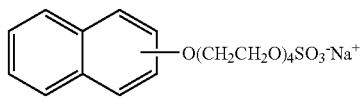

K-1

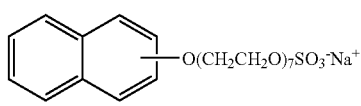

K-2

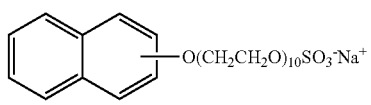

K-3

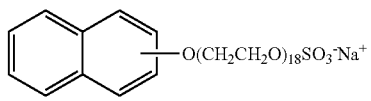

K-4

K-5
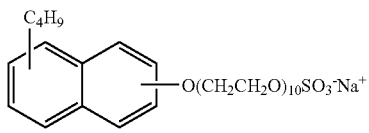

K-6
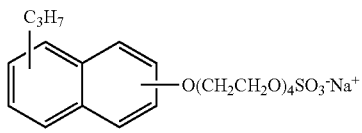

K-7
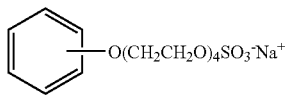

K-8
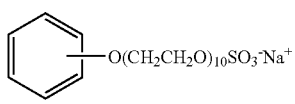

K-9
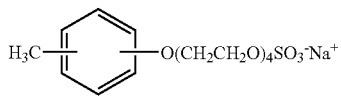

K-10
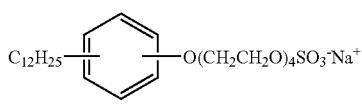

K-11
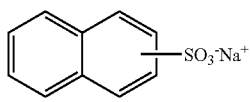

K-12
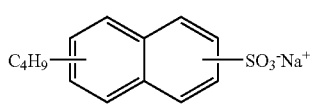

In an embodiment, only one aromatic anionic surfactant is used. In another embodiment, an arbitrary combination of two or more aromatic anionic surfactants is used. The amount of aromatic anionic surfactant to be added is not particularly limited. From the viewpoint of developability, the solubility of the recording layer components and the protective layer components, and the printing durability of the resultant printing plate, the concentration of the aromatic anionic surfactant in the developer is preferably in a range of from 1.0 to 10 mass %, more preferably in a range of from 2 to 10 mass %.

In the developer, the aromatic anionic surfactant may be used in combination with one or more other surfactants. Such other surfactants may be nonionic surfactants, and examples thereof include polyoxyethylene alkyl ethers such as polyoxyethylene naphthyl ether, polyoxyethylene alkyl phenyl ether, polyoxyethylene lauryl ether, polyoxyethylene cetyl ether, and polyoxyethylene stearyl ether, polyoxyethylene alkyl esters such as polyoxyethylene stearate, sorbitan alkyl esters such as sorbitan monolaurate, sorbitan monostearate, sorbitan distearate, sorbitan monooleate, sorbitan sesquioleate and sorbitan trioleate, and monoglyceride alkyl esters such as glycerol monostearate and glycerol monooleate.

The content of such additional surfactant in the developer is preferably from 0.1 to 10 mass %.

(Chelate Agent)

For the purpose of preventing the influence from calcium ions etc. contained in hard water, for example, a chelate agent for divalent metals is preferably contained in the developer. Examples of the chelate agent for divalent metals include polyphosphates such as $Na_2P_2O_7$, $Na_5P_3O_3$, $Na_3P_3O_9$, $Na_2O_4P(NaO_3P)PO_3Na_2$, and Calgon (sodium polymetaphosphate), aminopolycarboxylic acids (for example, ethylenediaminetetraacetic acid, potassium salts thereof, and sodium salts thereof, amine salt thereof; diethylenetriaminepentaacetic acid, potassium salt thereof, sodium salt thereof triethylenetetraminehexaacetic acid, potassium salt thereof, sodium salt thereof; hydroxyethylenediaminetriacetic acid, potassium salt thereof, sodium salt thereof; nitrilotriacetic acid, potassium salt thereof, sodium salt thereof; 1,2-diaminocyclohexanetetraacetic acid, potassium salt thereof, sodium salt thereof; 1,3-diamino-2-propanol tetraacetic acid, potassium salt thereof, sodium salt thereof); other polycarboxylic acids (for example, 2-phosphonobutanetricarboxylic acid-1,2,4, potassium salt thereof, sodium salt thereof; 2-phosphonobutanonetricarboxylic acid-2,3,4, potassium salt thereof, sodium salt thereof), organic phosphonic acids (for example, 1-phosphonoethanetricarboxylic acid-1,2,2, potassium salt thereof, sodium salt thereof; 1-hydroxyethane-1,1-diphosphonic acid, potassium salt thereof, sodium salt thereof; and aminotri(methylene phosphonic acid), potassium salt thereof, and sodium salt thereof, among which ethylenediaminetetraacetic acid, potassium salt thereof, sodium salt thereof, amine salt thereof; ethylenediaminetetra(methylenephosphonic acid), ammonium salt thereof, potassium salt thereof; hexamethylenediaminetetra(methylenephosponic acid), ammonium salt thereof, and potassium salt thereof are particularly preferable.

The optimum amount of the chelate agent varies depending on the hardness and amount of hard water used. In general, the chelate agent is contained in a range of 0.01 to 5 mass %, more preferably from 0.01 to 0.5 mass %, in the developer at use.

In addition, an alkali metal salt of an organic acid and/or an alkali metal salt of an inorganic acid may be added as the development regulating agent to the developer. For example, sodium carbonate, potassium carbonate, ammonium carbonate, sodium citrate, potassium citrate or ammonium citrate, or a combination of two or more of such salts may be used.

In addition to the components described above, components such as the following can be simultaneously used if necessary in the developer: organic carboxylic acids such as benzoic acid, phthalic acid, p-ethylbenzoic acid, p-n-propylbenzoic acid, p-isopropylbenzoic acid, p-n-butylbenzoic acid, p-t-butylbenzoic acid, p-t-butylbenzoic acid, p-2-hydroxyethylbenzoic acid, decanoic acid, salicylic acid and 3-hydroxy-2-naphthoic acid, organic solvents such as propylene glycol, and other components such as a reducing agent, a dye, a pigment and a preservative.

From the viewpoint of developability of the non-image portion during development, reduction of damage to the image portion, and handling property of the developer, the pH of the developer at 25° C. is preferably in a range of pH 10 to 12.5, more preferably in a range of pH 11 to 12.5.

The electric conductivity x of the developer is preferably within the range: 2<x<30 mS/cm, and is more preferably from 5 to 25 mS/cm. For regulating the electric conductivity, an alkali metal salt of an organic acid and/or an alkali metal salt of an inorganic acid are added preferably as the electric conductivity regulating agent.

The developer can be used as a developer and a replenisher for the light-exposed planographic printing plate precursor, and is preferably applied to an automatic developing machine. When the planographic printing plate precursor is developed with an automatic developing machine, the developer is exhausted depending on throughput. Therefore, processing power may be recovered by using a replenisher or a fresh developer. This replenishing system can be preferably used also in the plate-making method in the invention.

To restore the processing power of the developer in an automatic developing machine, replenishing can be conducted by a method described in U.S. Pat. No. 4,882,246. Developers described in JP-A No. 50-26601, JP-A No. 58-54341, JP-B No. 56-39464, JP-B No. 56-42860 and JP-B No. 57-7427 are also preferable.

The planographic printing plate precursor which was subjected to development treatment in this manner is post-treated with washing water, a surfactant-containing rinse, or a desensitizing gum solution containing gum arabic or a starch derivative, as described in JP-A No. 54-8002, JP-A No. 55-115045 and JP-A No. 59-58431. Various combinations of these treatments can be used.

For the purpose of improving strength of image portion and printing durability, the whole surface of the image after development can be heated or exposed to light. Very severe conditions can be utilized for the heating after development, and the heating temperature is usually in a range of 200 to 500° C.

The planographic printing plate obtained by these treatments is loaded onto an offset printing machine, and used for printing on a large number of sheets.

At the time of printing, a plate cleaner used for removing dirt from the plate may be a PS plate cleaner conventionally known in the art, such as Multi-cleaners CL-1, CL-2, CP, CN-4, CN, CG-1, PC-1, SR or IC (Fuji Film Corporation).

Producing many sheets of printed products by the planographic printing plate of the planogaraphic printing plate precursor of the present invention is possible as described above.

EXAMPLES

The invention is to be described specifically with reference to examples but the invention is not limited to them Synthesis Example 1

Synthesis of Specific Polymerizable Monomer (a-1)

After addition of 25 g of 1,2-bis(2-aminoethoxy)ethane to 500 ml of dehydrated acetonitrile, 47.6 g of karenz AOI (manufactured by Showa Denko K.K.) was added slowly under cooling at −5° C., followed by stirring for 3 hours. The reaction product precipitated gradually and then it was separated by suction filtration. The precipitate collected was washed with cold acetonitrile and dried in the air to yield a specific polymerizable monomer (a-1) having the structure shown below at a yield of 68%.

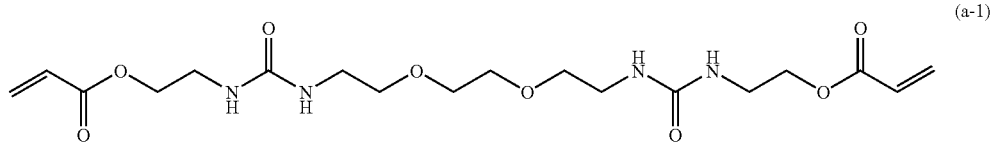

(a-1)

Synthesis Example 2

Synthesis of Specific Polymerizable Monomer (a-2)

After addition of 25 g of ethylenediamine to 1000 ml of dehydrated acetonitrile, 117.4 g of karenz AOI (manufactured by Showa Denko K.K.) was added slowly under cooling at −5° C., followed by stirring for 3 hours. The reaction product precipitated gradually and then it was separated by suction filtration. The precipitate collected was washed with cold acetonitrile and dried in the air to yield a specific polymerizable monomer (a-2) having the structure shown below at a yield of 86%.

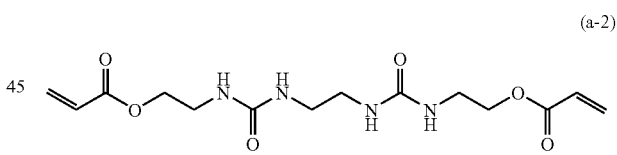

(a-2)

Synthesis Example 3

Synthesis of Specific Polymerizable Monomer (a-3)

After addition of 25 g of diethylene glycol bis(3-aminopropyl) ether to 500 ml of dehydrated acetonitrile, 32.0 g of karenz AOI (manufactured by Showa Denko K.K.) was added slowly under cooling at −5° C., followed by stirring for 3 hours. The reaction product precipitated gradually and then it was separated by suction filtration. The precipitate collected was washed with cold acetonitrile and dried in the air to yield a specific polymerizable monomer (a-3) having the structure shown below at a yield of 45%.

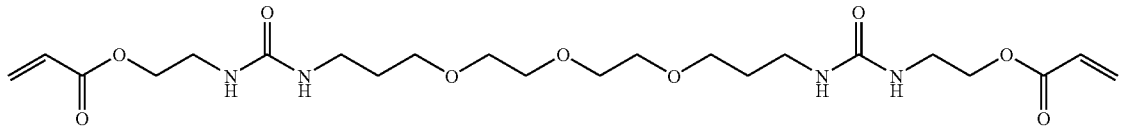
(a-3)

Synthesis Example 4

Synthesis of Specific Polymerizable Monomer (a-4)

After addition of 25 g of bis(3-aminopropyl) ether to 500 ml of dehydrated acetonitrile, 47.3 g of karenz AOI (manufactured by Showa Denko K.K.) was added slowly under cooling at −5° C., followed by stirring for 3 hours. The reaction product precipitated gradually and then it was separated by suction filtration. The precipitate collected was washed with cold acetonitrile and dried in the air to yield a specific polymerizable monomer (a-4) having the structure shown below at a yield of 44%.

Synthesis Example 6

Synthesis of Specific Polymerizable Monomer (a-6)

After addition of 25 g of N,N'-dimethylethylenediamine to 500 ml of acetonitrile, 80.0 g of karenz AOI (manufactured by Showa Denko K.K.) was added slowly under cooling at −5° C., followed by stirring for 3 hours. After extraction with AcOEt and H₂O followed by drying over MgSO₄, the reaction product was separated and purified by column chromatography (AcOEt/MeOH) to yield a specific polymerizable monomer (a-6) having the structure shown below at a yield of 15%.

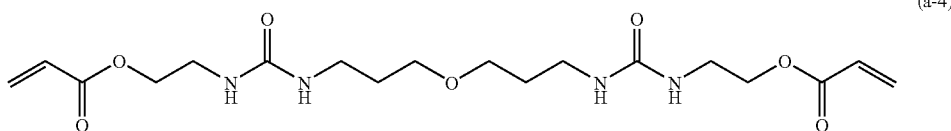
(a-4)

Synthesis Example 5

Synthesis of Specific Polymerizable Monomer (a-5)

After addition of 25 g of ammonia water (30%) to 500 ml of acetonitrile, 60.1 g of karenz AOI (manufactured by Showa Denko K.K.) was added slowly under cooling at −5° C., followed by stirring for 3 hours. After extraction with AcOEt and H₂O followed by drying over MgSO₄, the reaction product was separated and purified by column chromatography (AcOEt/MeOH) to yield a specific polymerizable monomer (a-5) having the structure shown below at a yield of 20%.

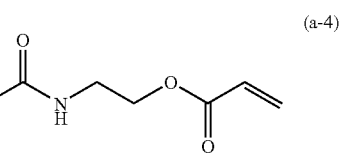
(a-6)

Synthesis Example 7

Synthesis of Comparative Compound (c-1)

After addition of 25 g of triethylene glycol to 500 ml of dehydrated acetonitrile, 47.0 g of karenz AOI (manufactured by Showa Denko K.K.) was added slowly under cooling at −5° C., followed by stirring for 3 hours. After extraction with AcOEt and H₂O followed by drying over MgSO₄, the reaction product was separated and purified by column chromatography (AcOEt/MeOH) to yield a comparative polymerizable monomer (c-1) having the structure shown below at a yield of 65%.

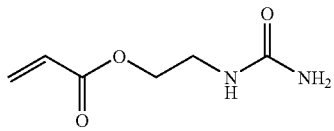
(a-5)

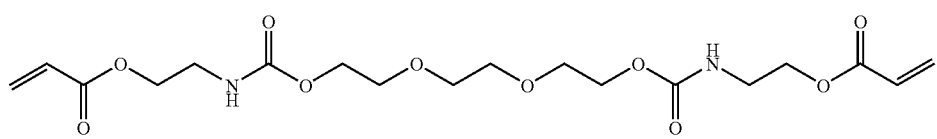
(c-1)

Synthesis Example 8

Synthesis of Comparative Compound (c-2)

After addition of 25 g of 1,6-diaminohexane to 500 ml of dehydrated acetonitrile, 48.0 g of karenz AOI (manufactured by Showa Denko K.K.) was added slowly under cooling at −5° C., followed by stirring for 3 hours. The reaction product precipitated gradually and then it was separated by suction filtration. The precipitate collected was washed with acetonitrile and dried in the air to yield a comparative polymerizable monomer (c-2) having the structure shown below at a yield of 81%.

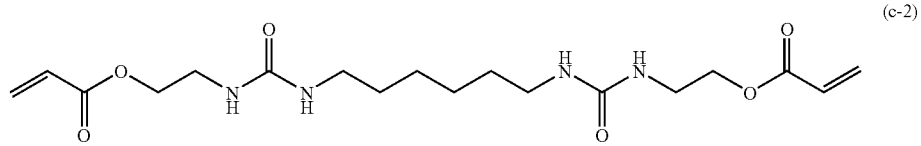

(c-2)

Synthesis Example 9

Synthesis of Comparative Compound (c-3)

After addition of 25 g of hexaethylene glycol to 500 ml of dehydrated acetonitrile and subsequent addition of 22.4 g of triethylamine, 20 g of acryloyl chloride was added slowly under cooling at −5° C., followed by stirring for 6 hours. After extraction with AcOEt and $H_2O$ followed by drying over $MgSO_4$, the reaction product was separated and purified by column chromatography (Hex/AcOEt) to yield a comparative polymerizable monomer (c-3) having the structure shown below at a yield of 59%.

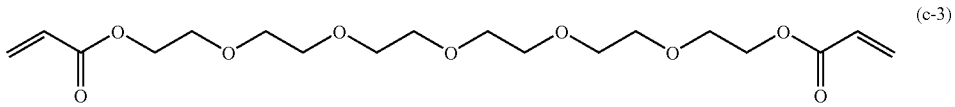

(c-3)

Examples 1 to 6, Comparative Examples 1 to 3

A curable composition coating solution of a recipe shown below was prepared and applied to an aluminum plate with a wire bar. The resultant was dried in a hot air dryer at 115° C. for 34 seconds.

<Curable Composition Coating Solution>

| | |
|---|---|
| Infrared absorbing agent (IR-1; the structure is below) | 0.074 g |
| Polymerization initiator (P-1; the structure is below) | 0.300 g |
| Additive (AM-1; the structure is below) | 0.161 g |
| Specific polymerizable monomer or comparative polymerizable monomer (compound given in Table 1) | 1.00 g |
| Binder polymer (BT-1; the structure is below) (weight average molecular weight: 100,000) | 1.00 g |
| Colorant (CL-1; the structure is below) | 0.04 g |
| Fluoro-surfactant (trade name: MEGAFACE F-780-F, manufactured by Dainippon Ink and Chemicals, Incorporated; methyl isobutyl ketone (MIBK) 30% by mass solution) | 0.016 g |
| Methyl ethyl ketone | 10.4 g |
| Methanol | 5.16 g |
| 1-Methoxy-2-propanol | 10.4 g |

The structures of the polymerization initiator (P-1), the infrared absorbing agent (IR-1), the additive (M-2), the binder polymer (BT-1) and the colorant (CL-1) are shown below.

(P-1) 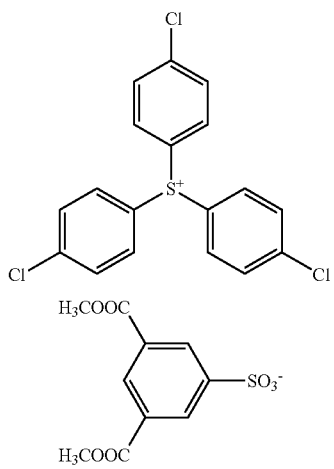

(CL-1) 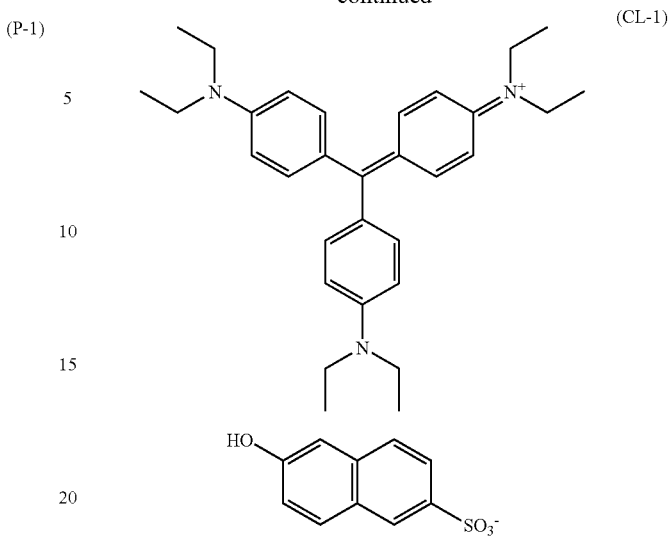

(IR-1)

(AM-1) 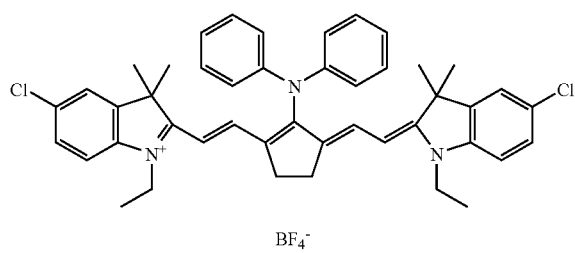

(BT-1) 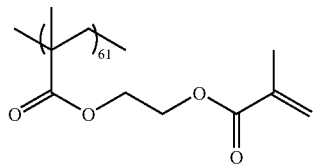

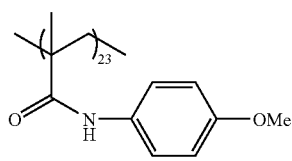

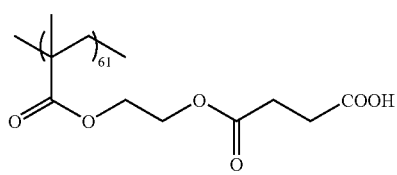

<Curability Evaluation of Curable Composition>

Each of the cured films prepared from the curable composition coating solutions of Examples 1 to 5 and Comparative Examples 1 to 3 was evaluated for $O_2$ inhibition resistance.

That is, light exposure was performed at energies of 121 mJ/cm$^2$ and 72 mJ/cm$^2$ in the air without blocking oxygen by using an FT-IR (trade name: NICOLET 6700, manufactured by Thermo Fisher Scientific K.K.) with a UV light (trade name: EXECURE 3000, manufactured by HOYA CANDEO OPTRONICS CORPORATION) as a light source. During this operation, the double bond disappearance rate (800 to 820 cm$^{-1}$) was measured.

Here, a high double bond disappearance rate shows the fact that double bonds in the polymerizable compound have disappeared due to consumption of the double bonds for polymerization curing. It is evaluated as being resistant to poymerization inhibition by oxygen and having been cured efficiently at high sensitivity. The results are shown in Table 1.

TABLE 1

| | Specific polymerizable monomer or comparative polymerizable monomer | C = C disappearance rate (Air) 121 mJ/cm$^2$ | C = C disappearance rate (Air) 72 mJ/cm$^2$ |
|---|---|---|---|
| Example 1 | a-1 | 0.33 | 0.2 |
| Example 2 | a-2 | 0.3 | 0.23 |
| Example 3 | a-3 | 0.31 | 0.17 |
| Example 4 | a-4 | 0.35 | 0.21 |
| Example 5 | a-5 | 0.35 | 0.19 |
| Example 6 | a-6 | 0.3 | 0.21 |
| Comparative Example 1 | c-1 | 0.24 | 0.09 |
| Comparative Example 2 | c-2 | — | — |
| Comparative Example 3 | c-3 | 0.03 | 0.01 |

The results shown in Table 1 clearly show that the curable compositions of the invention form coating films without oxygen impermeable layer and when the compositions are cured, polymerization proceeds efficiently and a higher oxygen inhibition resistance is shown in comparison to Comparative Examples. In particular, it has been confirmed that even in the case of low-energy light exposure, the curable compositions of the invention show high curabilities and cure at high sensitivities.

With respect to the comparative polymerizable monomer (c-2) having a C6 divalent hydrocarbon group as a linking group between urea linkages, a curable composition coating solution can not be prepared due to poor solubility in a solvent. Evaluation was also impossible.

Examples 7 to 12, Comparative Examples 3 to 6

Planographic Printing Plate Precursor

<Preparation of Support>

A melt of a JIS A1050 aluminum alloy containing 99.5% by mass or more aluminum, 0.30% by mass Fe, 0.10% by mass Si, 0.02% by mass Ti, and 0.013% by mass Cu was subjected to cleaning treatment and then cast. In this cleaning treatment, the melt was degassed to remove unnecessary gas such as hydrogen, and filtered through a ceramic tube filter. Casting was conducted using a DC casting method. After 10-mm surface layer was removed from the coagulated ingot plate of 500 mm in thickness, the plate was subjected to homogenization treatment at 550° C. for 10 hours so that intermetallic compounds were not agglomerated.

Then, the plate was hot-rolled at 400° C., then annealed at 500° C. for 60 seconds in a continuous annealing furnace and cold-rolled to form an aluminum rolled plate of 0.30 mm in thickness. By regulating the roughness of pressure rollers, the central line average surface roughness Ra after cold rolling was regulated to be 0.2 μm. Thereafter, the plate was placed in a tension leveler to improve flatness.

As surface treatment for finishing the plate as a support of planographic printing plate, the following treatments (a) to (f) were performed continuously. After each treatment and washing, a nip roller was used to drain off.

(a) The aluminum plate was subjected to etching treatment performed in the following condition: concentration of caustic soda: 26% by mass, concentration of ammonium ions: 6.5% by mass and temperature: 70° C., to dissolve 5 g/m² of the aluminum plate, followed by washing with water.

(b) The aluminum plate was subjected to desmutting treatment performed using an aqueous 1 mass % concentration of nitric acid solution (including 0.5% by mass of aluminum ions) kept at 30° C. by spraying, followed by washing with water.

(c) The aluminum plate was subjected to electrochemical surface roughing treatment performed continuously by using 60 Hz a.c. voltage. The electrolytic solution used at this time was an aqueous 1 mass % nitric acid solution (including 0.5% by mass of aluminum ions and 0.07% by mass of ammonium ions) kept at 30° C. Electrochemical surface roughening treatment was performed by using an a.c. power source with a trapezoidal rectangular wave a.c. current having the following characteristics: the time TP required for the current to reach a peak from zero: 2 msec and the duty ratio: 1:1 and also using a carbon electrode as the counter electrode. Ferrite was used as the auxiliary anode. The current density was 25 A/dm² when the current reached a peak and the quantity of electricity was 250 C/cm² as the sum of the quantity of electricity when the aluminum plate served as the anode. To the auxiliary anode was distributed 5% of the current flowing from the power source, followed by washing with water.

(d) The aluminum plate was subjected to etching treatment performed by spraying in the following condition: concentration of caustic soda: 26% by mass, concentration of ammonium ions: 6.5% by mass and temperature: 35° C., to dissolve 0.2 g/m² of the aluminum plate, to thereby remove the smut component which was produced when the electrochemical surface roughening treatment using a.c. current in the previous stage and primarily contained aluminum hydroxide and to dissolve the edge part of the generated pit, thereby smoothing the edge part. Then, the aluminum plate was washed with water.

(e) The aluminum plate was subjected to desmutting treatment performed using an aqueous 25 mass % sulfuric acid solution (including 0.5% by mass of aluminum ions) kept at 60° C. by spraying, followed by washing with water.

(f) The aluminum plate was subjected to anodic oxidation treatment in the following condition: concentration of sulfuric acid: 170 g/l (containing 0.5% by mass of aluminum ions), temperature: 33° C. and current density: 5 (A/dm²), for 50 seconds, followed by washing with water. The weight of the anodic oxide film at this time was 2.7 g/m².

The surface roughness Ra of the aluminum support obtained in this manner was 0.27 (measuring device: SURF-COM, manufactured by TOKYO SEIMITSU Co., Ltd., diameter of the tracer head: 2 μm).

<Undercoat Layer>

Next, the following undercoat layer coating solution was applied to this aluminum support by using a wire bar and dried at 90° C. for 30 minutes. The amount applied was 10 mg/m².

(Undercoat Layer Coating Solution)

| | |
|---|---|
| High-molecular compound A having the following structure (weight average molecular weight: 30,000) | 0.05 g |
| Methnol | 27 g |
| Ion exchange water | 3 g |

Polymer compound A

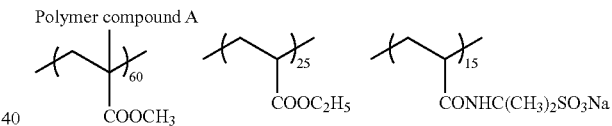

(Formation of Recording Layer)

The following recording layer coating solutions were each prepared and applied to the aforementioned aluminum support by using a wire bar. A drying operation was performed at 115° C. for 34 seconds in a hot air drier to obtain a planographic printing plate precursor. The coating amount after the film was dried was 1.4 to 2.0 g/m².

<Recording Layer Coating Solution>

| | |
|---|---|
| Infrared absorbing agent (IR-1) | 0.074 g |
| Polymerization initiator (P-1) | 0.300 g |
| Additive (AM-1) | 0.161 g |
| Specific polymerizable monomer of comparative polymerizable monomer (compound given in Table 2) | 1.00 g |
| Binder polymer (BT-1) (weight average molecular weight: 100,000) | 1.00 g |
| Ethyl Violet (CL-1) | 0.04 g |
| Fluoro-surfactant (trade name: MEGAFACE F-780-F, manufactured by Dainippon Ink and Chemicals, Incorporated; methyl isobutyl ketone (MIBK) 30% by mass solution) | 0.016 g |
| Methyl ethyl ketone | 10.4 g |
| Methanol | 5.16 g |
| 1-Methoxy-2-propanol | 10.4 g |

[Evaluation of Planographic Printing Plate Precursor]
(1) Evaluation of Sensitivity The planographic printing plate precursor obtained was exposed to light under the conditions of a resolution of 2,400 dpi, a peripheral drum rotational frequency of 200 rpm, and an increasing output in the range of 0 to 8 W at an interval of 0.15 as log E, by using Trendsetter 800 II Quantum manufactured by Creo. The exposure was performed under the conditions of 25° C. and 50% RH.

After exposure, the planographic printing plate precursor was developed without heating and washing treatments in an automatic developing machine LP-131 OHII manufactured by FUJIFILM Corporation, at a conveyance speed (line speed) of 2 m/min and a developing temperature of 30° C. The developing solution was a 1:4 water-diluted solution of DH—N, the replenisher solution was a 1:1.4 water diluted solution of FCT-421, and the finisher was a 1:1 water-diluted solution of GN-2K manufactured by FUJIFILM Corporation.

The density of the image portion developed on the planographic printing plate was determined by using a Macbeth reflection densitometer RD-918, and the cyan density by using the red filter, an accessory of the densitometer. A reciprocal number of the exposure intensity needed for giving a measured density of 0.6 was determined as an indicator of the sensitivity. Evaluation results of the planographic printing plates are relative values, compared to 100 of the sensitivity of the planographic printing plate obtained in Example 7. A larger value indicates a higher sensitivity.

TABLE 2

| | Specific polymerizable monomer or comparative polymerizable monomer | Sensitivity |
|---|---|---|
| Example 7 | a-1 | 100 |
| Example 8 | a-2 | 102 |
| Example 9 | a-3 | 98 |
| Example 10 | a-4 | 100 |
| Example 11 | a-5 | 98 |
| Example 12 | a-6 | 97 |
| Comparative Example 3 | c-1 | 42 |
| Comparative Example 4 | c-2 | — |
| Comparative Example 5 | c-3 | 20 |

Table 2 clearly shows that the planographic printing plate precursor of the invention form coating films without cutting off oxygen and when the compositions are cured, polymerization proceeds efficiently and a higher oxygen inhibition resistance is shown in comparison to Comparative Examples.

In Comparative Example 2 using the comparative polymerizable monomer (c-2) having a C6 divalent hydrocarbon group as a linking group between urea linkages, a curable composition coating solution can not be prepared due to poor solubility in a solvent. Evaluation was also impossible.

According to the invention, a curable composition can be provided which is capable of being cured at high sensitivity by energy application such as laser exposure and controls the inhibition of polymerization due to oxygen and also which has excellent solubility in a developing solutions or solvents.

In addition, according to the invention, a planographic printing plate precursor can be provided, on which an image can be formed with high sensitivity and which is inhibited from variation in sensitivity and has excellent removability of uncured portions during development.

The invention includes the following embodiments.

<1> A curable composition comprising at least one species selected from polymerizable monomers represented by the following formula (I), formula (II) or formula (III) and a polymerization initiator:

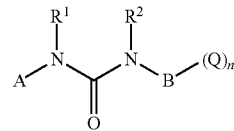

(I)

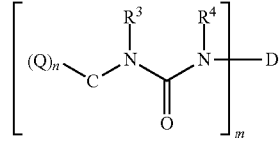

(II)

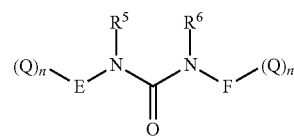

(III)

wherein in the formula (I) to formula (III), Q represents in each occurrence a substituent containing an ethylenically unsaturated group; $R^1$, $R^2$, $R^3$, $R^4$, $R^5$ and $R^6$ each independently represent a hydrogen atom or a monovalent hydrocarbon group; A represents a hydrogen atom or a monovalent hydrocarbon group, B, C, E and F each independently represent an (n+1)-valent linking group having at least one ether linkage or an (n+1)-valent linking group having 2 to 5 carbon atoms; D represents an (m+1)-valent linking group having at least one ether linkage or an m-valent linking group having 2 to 5 carbon atoms; n represents an integer of 1 to 3; and m represents an integer of 2 to 6.

<2> The curable composition of item <1>, wherein at least one of A or B in the formula (I), at least one of C or D in the formula (II), and at least one of E or F in the formula (III) comprise a repeating unit represented by —(CH$_2$—CHR—O)—, wherein R represents a hydrogen atom or a monovalent substituent.

<3> A curable composition comprising at least one species selected from polymerizable monomers represented by the following formula (I), formula (II) or formula (III), a polymerization initiator and a sensitizing dye:

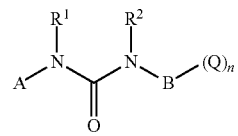

(I)

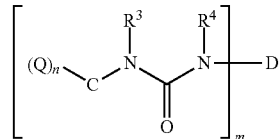

(II)

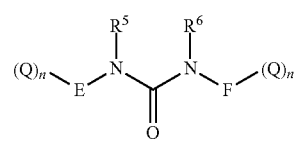

(III)

wherein in the formula (I) to formula (III), Q represents in each occurrence a substituent containing an ethylenically unsaturated group; $R^1$, $R^2$, $R^3$, $R^4$, $R^5$ and $R^6$ each independently represent a hydrogen atom or a monovalent hydrocarbon group; A represents a hydrogen atom or a monovalent hydrocarbon group; B, C, E or F each independently represent an (n+1)-valent linking group having at least one ether linkage or an (n+1)-valent linking group having 2 to 5 carbon atoms; D represents an (m+1)-valent linking group having at least one ether linkage or an m-valent linking group having 2 to 5 carbon atoms; n represents an integer of 1 to 3; and m represents an integer of 2 to 6.

<4> The curable composition of item <3>, wherein at least one of A or B in the formula (I), at least one of C or D in the formula (II), and at least one of E or F in the formula (III) comprise a repeating unit represented by —(CH$_2$—CHR—O)—; wherein R represents a hydrogen atom or a monovalent substituent.

<5> The curable composition of item <3> or <4>, wherein the sensitizing dye has a structure represented by the following formula (12):

Formula (12)

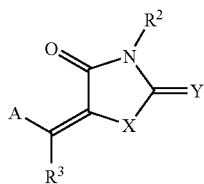

wherein in the formula (12), A represents an optionally substituted aromatic ring or heterocycle; X represents an oxygen atom, a sulfur atom, or —N(R$^1$)—; Y represents an oxygen atom or —N(R$^1$)—; R$^1$, R$^2$ and R$^3$ each independently represent a hydrogen atom or a monovalent group of nonmetal atoms; and A may be combined independently with R$^1$, R$^2$ and R$^3$ to form an aliphatic or aromatic ring.

<6> The curable composition of item <3> or item <4>, wherein the sensitizing dye is an infrared absorbing dye.

<7> The curable composition of item <3> or item <4>, wherein the sensitizing dye is an infrared absorbing dye represented by formula (a):

Formula (a)

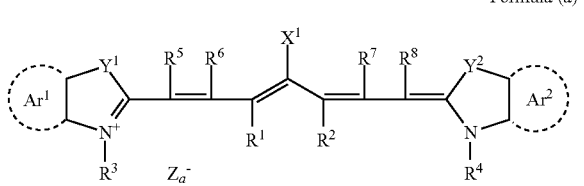

wherein in the formula (a), X$^1$ represents a hydrogen atom, halogen atom, —NAr$^x_2$, X$^2$-L$^1$ or the group shown below; Ar$^x$ represents a C$_6$ to C$_{14}$ aromatic hydrocarbon group which may have one or more substituents selected from the group consisting of halogen atoms, alkyl groups, allyl groups, alkenyl groups, alkynyl groups, cyano groups, carboxy groups, nitro groups, amide groups, ester groups, alkoxy groups, amino groups and heterocyclic groups, and these substituents may themselves be substituted by such a substituent as those described above. X$^2$ represents an oxygen atom, a sulfur atom or —N(R$^x$)— wherein R$^x$ represents a hydrogen atom or a C$_1$ to C$_{10}$ hydrocarbon group; L$^1$ represents a C$_1$ to C$_{12}$ hydrocarbon group, an aromatic ring having a heteroatom, or a C$_1$ to C$_{12}$ hydrocarbon group containing a heteroatom selected from N, S, O, a halogen atom or Se;

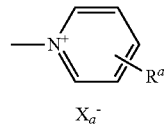

wherein in the above formula, X$_a^-$ has the same definition as that of Z$_a^-$ defined later, and R$^a$ represents a hydrogen atom or a substituent selected from an alkyl group, an aryl group, a substituted or unsubstituted amino group, or a halogen atom; R$^1$ and R$^2$ each independently represent a C$_{1-12}$ hydrocarbon group.

<8> A planographic printing plate precursor having a photosensitive layer comprising the curable composition of any one of items <1> to <7> on a support.

All publications, patent applications, and technical standards mentioned in this specification are herein incorporated by reference to the same extent as if such individual publication, patent application, or technical standard was specifically and individually indicated to be incorporated by reference.

It will be obvious to those having skill in the art that many changes may be made in the above-described details of the preferred embodiments of the present invention. The scope of the invention, therefore, should be determined by the following claims.

What is claimed is:

1. A curable composition comprising at least one species selected from polymerizable monomers represented by the following formula (I), formula (II) or formula (III), a polymerization initiator and a sensitizing dye:

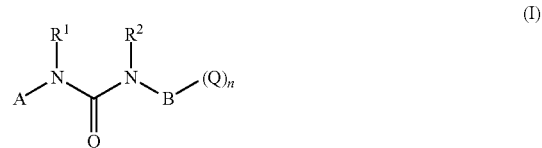

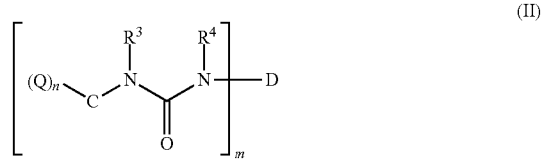

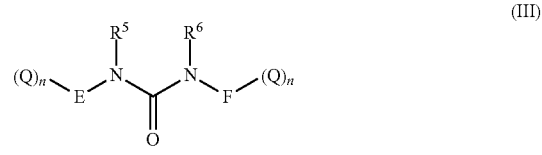

wherein in the formula (I) to formula (III), Q represents in each occurrence a substituent containing an ethylenically unsaturated group; R$^1$, R$^2$, R$^3$, R$^4$, R$^5$ and R$^6$ each independently represent a hydrogen atom or a monovalent hydrocarbon group; A represents a hydrogen atom or a monovalent hydrocarbon group; B, C, E and F each independently represent an (n+1)-valent linking group having at least one ether linkage or an (n+1)-valent linking group having 2 to 5 carbon atoms; D represents an m-valent linking group having at least one ether linkage or an co-valent linking group having 2 to 5 carbon atoms; n represents an integer of 1 to 3; and m represents an integer of 2 to 6; and wherein the sensitizing dye is an infrared absorbing dye having an absorption maximum in the wavelength range from 760 to 1,200 nm.

2. The curable composition of claim 1, wherein at least one of A or B in the formula (I), at least one of C or D in the formula (II), and at least one of E or F in the formula (III) comprise a repeating unit represented by —(CH$_2$—CHR—O)—; wherein R represents a hydrogen atom or a monovalent substituent.

3. A planographic printing plate precursor having a photosensitive layer comprising the curable composition of claim 1 on a support.

4. A curable composition comprising at least one species selected from polymerizable monomers represented by the following formula (I), formula (II) or formula (III), a polymerization initiator and a sensitizing dye:

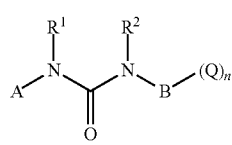
(I)

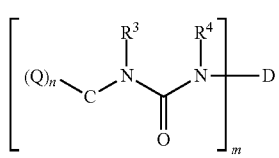
(II)

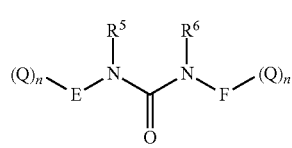
(III)

wherein in the formula (I) to formula (III), Q represents in each occurrence a substituent containing an ethylenically unsaturated group; $R^1$, $R^2$, $R^3$, $R^4$, $R^5$ and $R^6$ each independently represent a hydrogen atom or a monovalent hydrocarbon group; A represents a hydrogen atom or a monovalent hydrocarbon group; B, C, E and F each independently represent an (n+1)-valent linking group having at least one ether linkage or an (n+1)-valent linking group having 2 to 5 carbon atoms; D represents an m-valent linking group having at least one ether linkage or an co-valent linking group having 2 to 5 carbon atoms; n represents an integer of 1 to 3; and m represents an integer of 2 to 6; and wherein the sensitizing dye is an infrared absorbing dye, wherein the sensitizing dye is an infrared absorbing dye represented by formula (a):

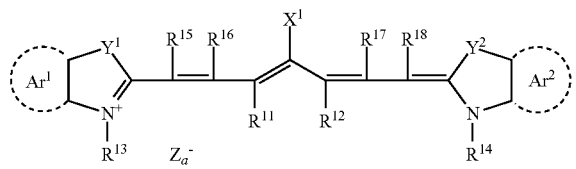
Formula (a)

wherein in the formula (a), $Ar^1$ and $Ar^2$ may be the same or different, and each independently represent an aromatic hydrocarbon group which may have a substituent; $R^{11}$ and $R^{12}$ each independently represent a $C_{1-12}$ hydrocarbon group; $R^{13}$ and $R^{14}$ may be the same or different, and each independently represent a hydrocarbon group containing 20 or less carbon atoms which may have a substituent; $R^{15}$, $R^{16}$, $R^{17}$ and $R^{18}$ may be the same or different, and each independently represent a hydrogen atom or a hydrocarbon group containing 12 or less carbon atoms; $Y^1$ and $Y^2$ may be the same or different, and each independently represent a sulfur atom or a dialkyl methylene group containing 12 or less carbon atoms; $Z_a^-$ represents a counter anion, but $Z_a^-$ is not present when the infrared absorbing dye represented by formula (a) has an anionic substituent in its structure and does not necessitate neutralization of the charge; $X^1$ represents a hydrogen atom, halogen atom, —$NAr^x_2$, $X^2$-$L^1$ or the group shown below; $Ar^x$ represents a $C_6$ to $C_{14}$ aromatic hydrocarbon group which may have one or more substituents selected from the group consisting of halogen atoms, alkyl groups, allyl groups, alkenyl groups, alkynyl groups, cyano groups, carboxy groups, nitro groups, amide groups, ester groups, alkoxy groups, amino groups and heterocyclic groups, and these substituents may themselves be substituted by such a substituent as those described above; $X^2$ represents an oxygen atom, a sulfur atom or —N($R^x$)— wherein $R^x$ represents a hydrogen atom or a $C_1$ to $C_{10}$ hydrocarbon group; $L^1$ represents a $C_1$ to $C_{12}$ hydrocarbon group, an aromatic ring having a heteroatom, or a $C_1$ to $C_{12}$ hydrocarbon group containing a heteroatom selected from N, S, O, a halogen atom or Se;

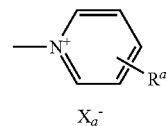

wherein in the above formula, $X_a^-$ has the same definition as that of $Z_a^-$ defined above, and $R^a$ represents a hydrogen atom or a substituent selected from an alkyl group, an aryl group, a substituted or unsubstituted amino group, or a halogen atom.

5. A planographic printing plate precursor having a photosensitive layer comprising the curable composition on a support, said curable composition comprising at least one species selected from polymerizable monomers represented by the following formula (I), formula (II) or formula (III), a polymerization initiator and a sensitizing dye:

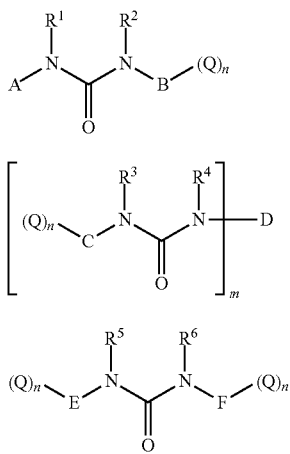

(I)
(II)
(III)

wherein in the formula (I) to formula (III), Q represents in each occurrence a substituent containing an ethylenically unsaturated group; $R^1$, $R^2$, $R^3$, $R^4$, $R^5$ and $R^6$ each independently represent a hydrogen atom or a monovalent hydrocarbon group; A represents a hydrogen atom or a monovalent hydrocarbon group; B, C, E and F each independently represent an (n+1)-valent linking group having at least one ether linkage or an (n+1)-valent linking group having 2 to 5 carbon atoms; D represents an m-valent linking group having at least one ether linkage or an co-valent linking group having 2 to 5 carbon atoms; n represents an integer of 1 to 3; and m represents an integer of 2 to 6; and wherein at least one of A or B in the formula (I), at least one of C or D in the formula (II), and at least one of E or F in the formula (III) comprise a repeating unit represented by —($CH_2$—CHR—O)—; wherein R represents a hydrogen atom or a monovalent substituent.

\* \* \* \* \*